(12) United States Patent
Kim

(10) Patent No.: US 11,637,120 B2
(45) Date of Patent: Apr. 25, 2023

(54) VERTICAL SEMICONDUCTOR DEVICES

(71) Applicant: Samsung Electronics Co., Ltd., Suwon-si (KR)

(72) Inventor: Manjoong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/708,316

(22) Filed: Mar. 30, 2022

(65) Prior Publication Data

US 2022/0223615 A1 Jul. 14, 2022

Related U.S. Application Data

(63) Continuation of application No. 16/892,563, filed on Jun. 4, 2020, now Pat. No. 11,296,105.

(30) Foreign Application Priority Data

Sep. 26, 2019 (KR) .......................... 10-2019-0118949

(51) Int. Cl.
*H01L 27/11575* (2017.01)
*H01L 23/522* (2006.01)
(Continued)

(52) U.S. Cl.
CPC .... *H01L 27/11575* (2013.01); *H01L 23/5226* (2013.01); *H01L 27/115* (2013.01);
(Continued)

(58) Field of Classification Search
CPC ........... H01L 23/5226; H01L 27/11575; H01L 27/11524; H01L 27/11529; H01L 27/1157; H01L 27/1158
See application file for complete search history.

(56) References Cited

U.S. PATENT DOCUMENTS 8,461,053 B2 6/2013 Chen et al.
8,971,118 B2 3/2015 Jin et al.
(Continued)

FOREIGN PATENT DOCUMENTS

KR 10-2013-0005432 A 1/2013

OTHER PUBLICATIONS

Office Action dated Mar. 28, 2022 from the German Patent Office for corresponding German Patent Application No. 10 2020 115 241.8.

*Primary Examiner* — Joseph C. Nicely
(74) *Attorney, Agent, or Firm* — Muir Patent Law, PLLC

(57) ABSTRACT

A vertical semiconductor device includes a substrate, a cell array region and a pad region formed on the substrate, and gate patterns and respective insulation layers. The gate patterns may be stacked in a vertical direction perpendicular to an upper surface of the substrate. Each of the gate patterns may extend in a first direction parallel to the upper surface of the substrate on the cell array region and the pad region of the substrate. The gate patterns may include pads, respectively, at edge portions thereof in the first direction. The respective insulation layers may be between adjacent gate patterns in the vertical direction. The gate patterns and the insulation layer on the pad region may serve as a pad structure, and the pad structure may include a first staircase structure having a stepped shape, a second staircase structure having a stepped shape and disposed below the first staircase structure, a flat surface portion between the first and second staircase structures, and a dummy staircase structure formed on the flat surface portion. The dummy staircase structure may be spaced apart from each of the first and second staircase structures.

20 Claims, 52 Drawing Sheets

(51) Int. Cl.
  *H01L 27/115*    (2017.01)
  *H01L 27/11529*  (2017.01)
  *H01L 27/11524*  (2017.01)
  *H01L 27/1157*   (2017.01)
  *H01L 27/11582*  (2017.01)

(52) U.S. Cl.
  CPC .... *H01L 27/1157* (2013.01); *H01L 27/11524* (2013.01); *H01L 27/11529* (2013.01); *H01L 27/11582* (2013.01)

(56) References Cited

U.S. PATENT DOCUMENTS

| | | |
|---|---|---|
| 8,994,099 B2 | 3/2015 | Lee et al. |
| 9,373,633 B2 | 6/2016 | Jin et al. |
| 9,972,640 B1 | 5/2018 | Kai et al. |
| 9,985,046 B2 | 5/2018 | Lu et al. |
| 10,224,341 B2 | 3/2019 | Kim et al. |
| 11,296,105 B2 * | 4/2022 | Kim ................... H01L 27/1157 |
| 2012/0119284 A1 | 5/2012 | Anderson et al. |
| 2012/0119287 A1 | 5/2012 | Park et al. |
| 2015/0214242 A1 | 7/2015 | Lee |
| 2016/0163686 A1 | 6/2016 | Lee et al. |
| 2017/0287833 A1 | 10/2017 | Thimmegowda |
| 2019/0237475 A1 | 8/2019 | Jung et al. |
| 2020/0203495 A1 | 6/2020 | Shin et al. |
| 2020/0251490 A1 * | 8/2020 | Matsumoto ......... H01L 27/1157 |

* cited by examiner

FIG. 1
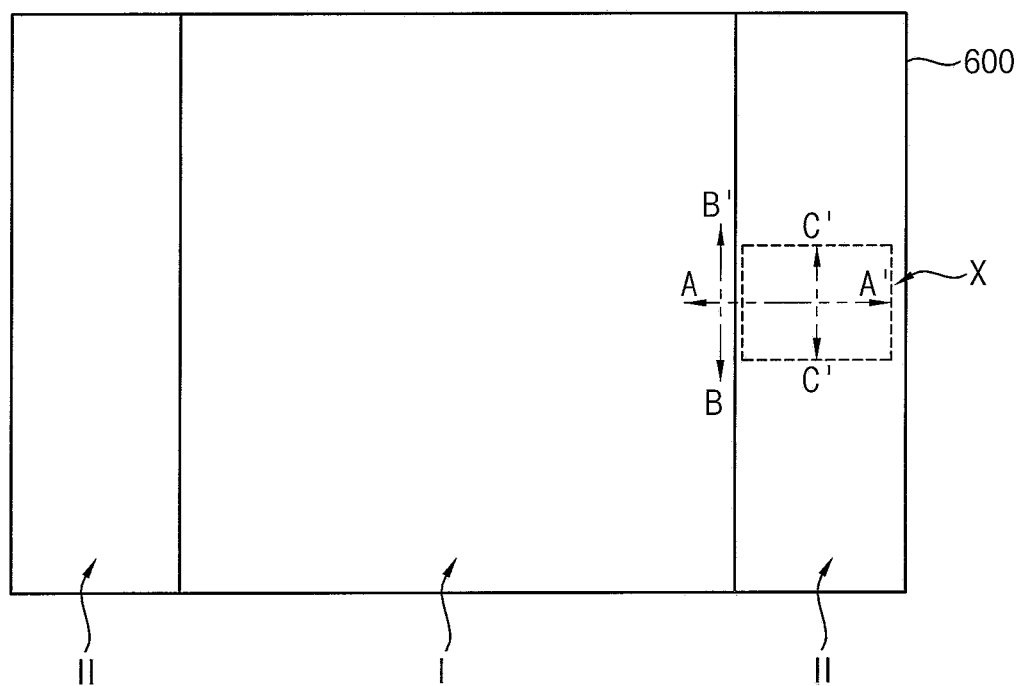
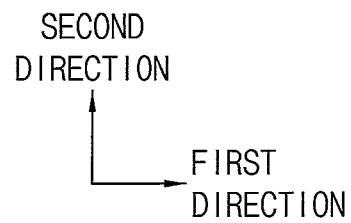

FIRST DIRECTION   SECOND DIRECTION

FIRST DIRECTION   SECOND DIRECTION

FIRST DIRECTION   SECOND DIRECTION

FIRST DIRECTION  SECOND DIRECTION

FIRST DIRECTION  SECOND DIRECTION

FIRST DIRECTION  SECOND DIRECTION

FIRST　　　SECOND
DIRECTION　DIRECTION

FIRST DIRECTION  SECOND DIRECTION

FIRST DIRECTION  SECOND DIRECTION

VERTICAL SEMICONDUCTOR DEVICES

CROSS-REFERENCE TO RELATED APPLICATION

This application is a continuation application of U.S. patent application Ser. No. 16/892,563, filed on Jun. 4, 2020, which claims priority under 35 USC § 119 to Korean Patent Application No. 10-2019-0118949, filed on Sep. 26, 2019, in the Korean Intellectual Property Office (KIPO), the contents of each of which are incorporated by reference herein in their entirety.

BACKGROUND

1. Field

Example embodiments relate to vertical semiconductor devices. More particularly, example embodiments relate to vertical NAND flash memory devices.

2. Description of the Related Art

In the VNAND flash memory device, a gate pattern of each memory cell extends in a horizontal direction, and an edge portion of the gate pattern may serve as a pad structure having a stepped shape. For forming the pad structure, first, a mold structure may be formed on a substrate. The mold structure may include staircase structures and a flat surface portion. The flat surface portion may have a relatively wide flat surface, and the staircase structures may be formed above and under the flat surface portion, respectively. After forming the mold structure, widths of patterns included in the mold structure may be measured. However, it is not easy to obtain an accurate measurement of the widths of the patterns included in the mold structure.

SUMMARY

Example embodiments provide a vertical semiconductor device.

According to example embodiments, a vertical semiconductor device, includes a substrate, a cell array region including memory cells, formed on the substrate, and a pad region formed on the substrate, and in which contact plugs electrically connected the memory cells are formed. The vertical semiconductor device further includes gate patterns stacked in a vertical direction perpendicular to an upper surface of the substrate, each of the gate patterns extending on the cell array region and the pad region in a first direction parallel to the upper surface of the substrate, and the gate patterns including pads, respectively, disposed in the pad region and at edge portions of the respective gate patterns in the first direction; respective insulation layers between adjacent gate patterns in the vertical direction; and a channel structure in the cell array region and passing through the gate patterns, the channel structure extending in the vertical direction. The gate patterns and the insulation layers on the pad region serve as a pad structure, and the pad structure includes a first staircase structure having a stepped shape, a second staircase structure spaced apart from the first staircase structure in the first direction and having a stepped shape and disposed below the first staircase structure, a flat surface portion between the first and second staircase structures, and a dummy staircase structure formed on the flat surface portion.

According to example embodiments, a vertical semiconductor device includes a substrate; a cell array region and a pad region formed on the substrate; gate patterns stacked in a vertical direction perpendicular to an upper surface of the substrate, each of the gate patterns extending on the cell array region and the pad region of the substrate in a first direction parallel to the upper surface of the substrate, and the gate patterns including pads, respectively, at edge portions thereof in the first direction; respective insulation layers between adjacent gate patterns in the vertical direction; a channel structure on the cell array region and passing through the gate patterns, the channel structure extending in the vertical direction; and contact plugs extending in the vertical direction, and contacting upper surfaces of the pads, respectively. The gate patterns and the insulation layer on the pad region serve as a pad structure, and the pad structure includes a first staircase structure having a stepped shape and including the pads, a second staircase structure disposed below the first staircase structure, the second staircase structure having a stepped shape and including the pads, a flat surface portion between the first and second staircase structures, and a dummy staircase structure formed on the flat surface portion; and the dummy staircase structure extends to opposite outermost ends of the pad structure in a second direction perpendicular to the first direction.

According to example embodiments, a vertical semiconductor device includes a substrate, a cell array region and a pad region formed on the substrate, and gate patterns and respective insulation layers. The gate patterns may be stacked in a vertical direction perpendicular to an upper surface of the substrate. Each of the gate patterns may extend in a first direction parallel to the upper surface of the substrate on the cell array region and the pad region of the substrate. The gate patterns may include pads, respectively, at edge portions thereof in the first direction. The respective insulation layers may be between adjacent gate patterns in the vertical direction. The gate patterns and the insulation layer on the pad region may serve as a pad structure, and the pad structure may include a first staircase structure having a stepped shape, a second staircase structure having a stepped shape and disposed below the first staircase structure, a flat surface portion between the first and second staircase structures, and a dummy staircase structure formed on the flat surface portion. The dummy staircase structure may be spaced apart from each of the first and second staircase structures.

BRIEF DESCRIPTION OF THE DRAWINGS

Example embodiments will be more clearly understood from the following detailed description taken in conjunction with the accompanying drawings. FIGS. 1 to 52 represent non-limiting, example embodiments as described herein.

FIGS. 1 to 29 are plan views, cross-sectional views, and perspective views illustrating a method of manufacturing a vertical memory device in accordance with example embodiments;

FIGS. 47 to 52 are a plan views and perspective views illustrating a method of manufacturing a vertical memory device in accordance with example embodiments.

DESCRIPTION OF EMBODIMENTS

Hereinafter, a direction substantially perpendicular to the upper surface of the substrate is described as a vertical direction. Two directions substantially parallel to the upper surface of the substrate and crossing to each other are described as first and second directions, respectively, and may be described as horizontal directions. In example embodiments, the first and second directions may be substantially perpendicular to each other. Note, however, that although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other FIGS. 1 to 29 are plan views, cross-sectional views, and perspective views illustrating a method of manufacturing a vertical memory device in accordance with example embodiments. Particularly, FIGS. 1, 6, 7 and 17 are the plan views, FIGS. 2, 3, 16, 18-23 and 26-28 are the cross-sectional views, and FIGS. 4, 5, 8-16, 24, 25 and 29 are the perspective views.

Figure 5:
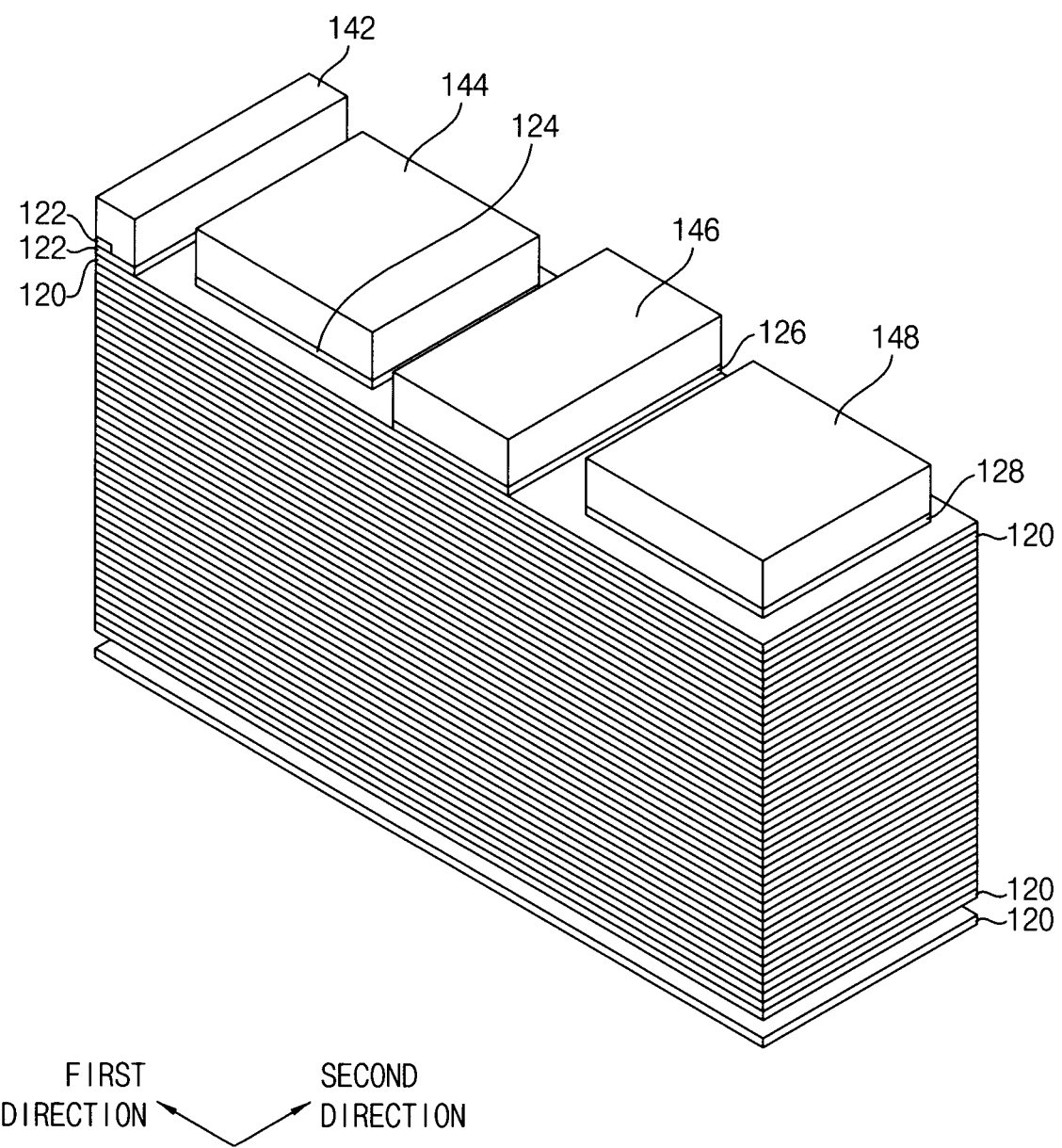
Figure 6:
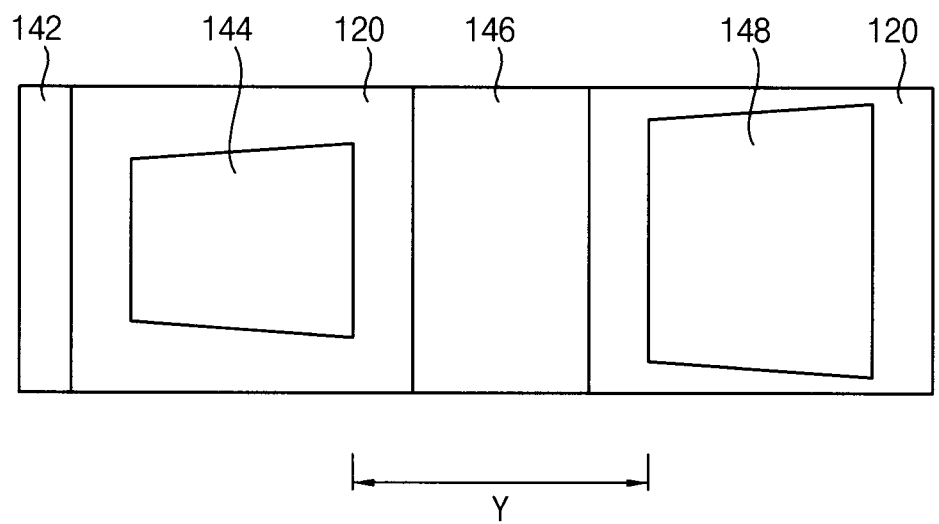
Figure 7:
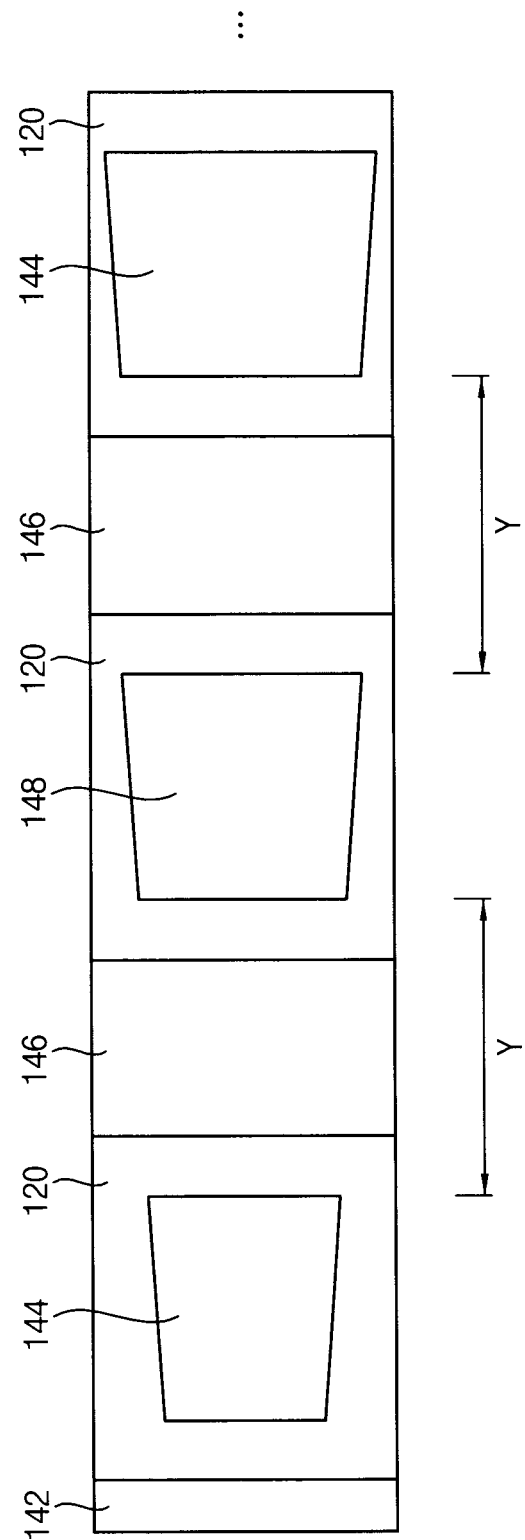
Figure 16:
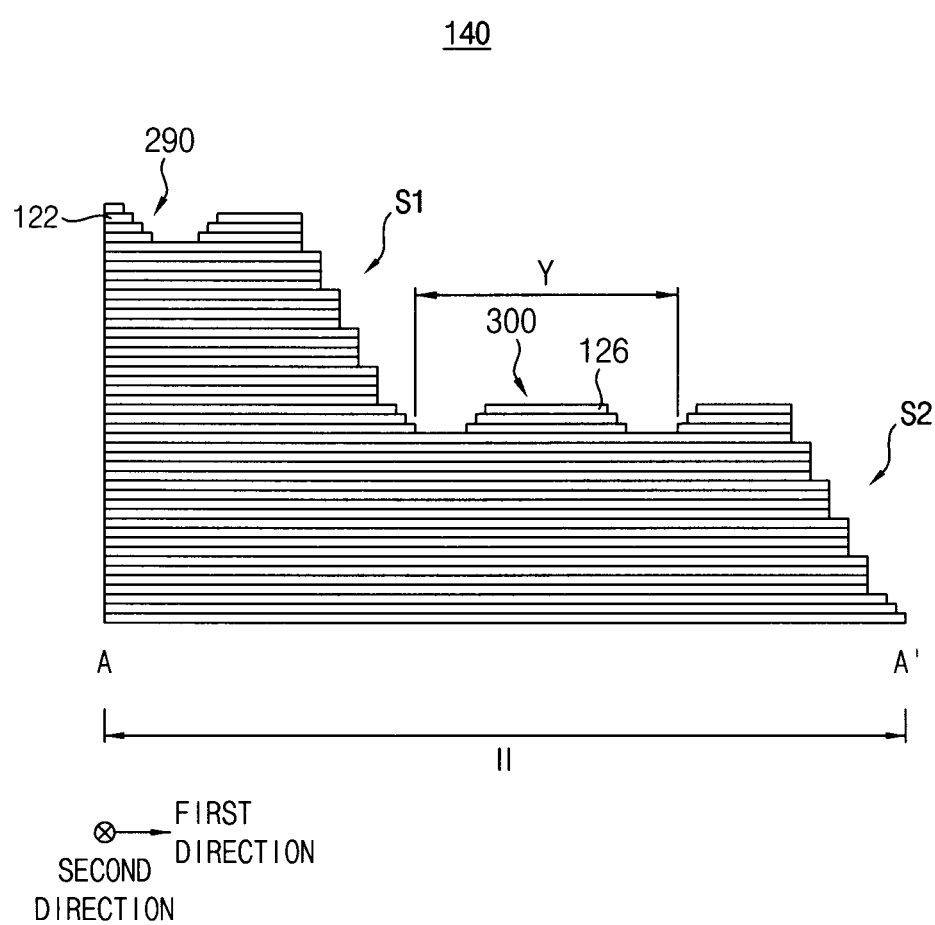
Figure 17:
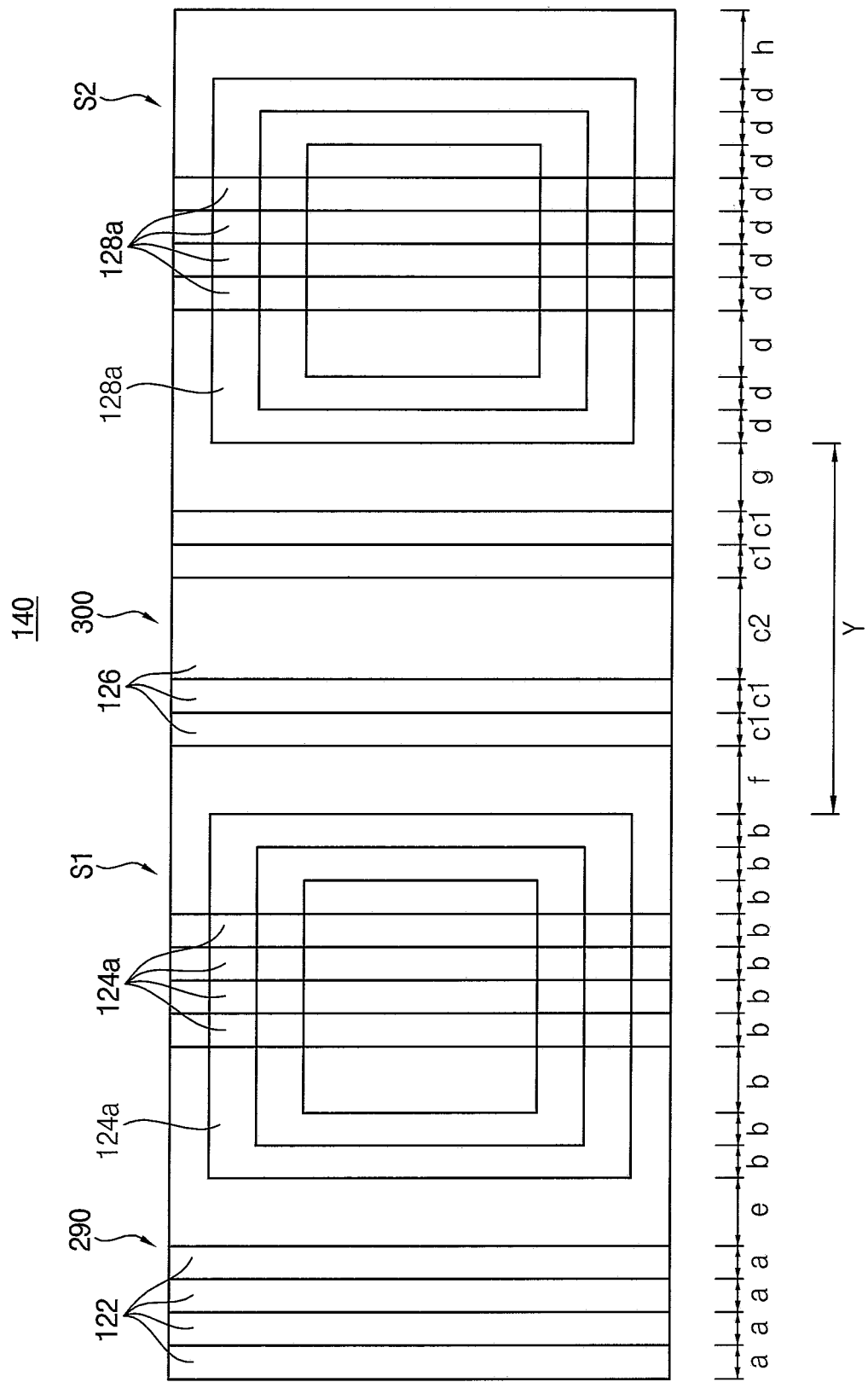
Figure 23:
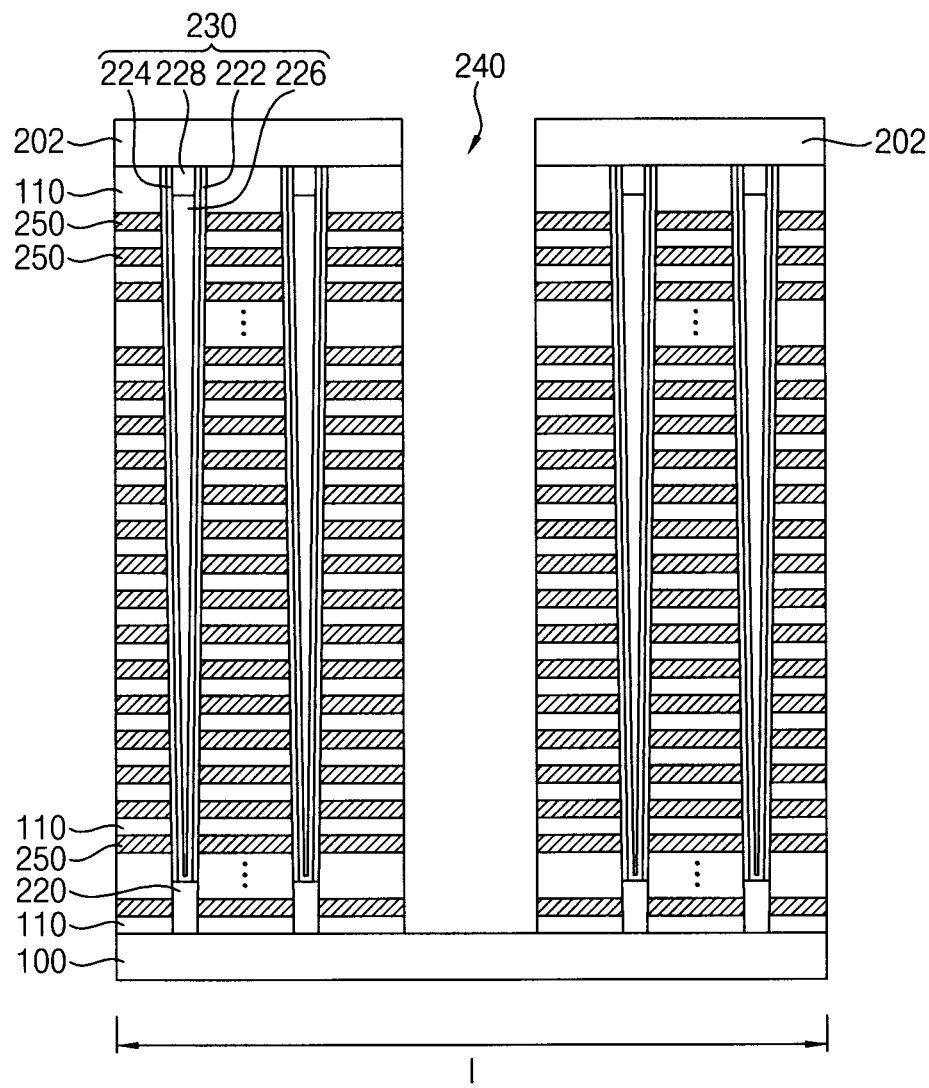

FIGS. 6, 7 and 17 are plan views of a region X of FIG. 1, and FIGS. 4, 5, 8-16, 24, 25 and 29 are perspective views of the region X of FIG. 1. FIGS. 3, 18-20, 22 and 26 and 28 are cross-sectional views taken along a line A-A' of FIG. 1. FIGS. 21 and 23 are cross-sectional views taken along a line B-B' of FIG. 1, and FIG. 27 is a cross-sectional view taken along a line C-C' of FIG. 1. FIG. 16 is a cross-sectional view taken along a line extending in the first region in the region X of FIG. 1.

Referring to FIG. 1, the substrate 600 may include a first region I and a second region II. The second region II may be adjacent to opposite sides in the first direction of the first region I.

The substrate 600 may include or be formed of a semiconductor material such as silicon, germanium, or silicon-germanium, or a group III-V compound such as GaP, GaAs, GaSb, or the like. In some example embodiments, the substrate 600 may be a silicon-on-insulator (SOI) substrate or a germanium-on-insulator (GOI) substrate.

In example embodiments, the first region I of the substrate 600 is a cell array region in which memory cells are formed, and the second region II of the substrate 600 is a pad region in which contact plugs electrically connected the memory cells are formed. The second region II may be extended form the first region I in the first direction, so that the second region II may be referred to as an extension region or a word line extension region.

In example embodiments, the vertical memory device may have a cell over peri (COP) structure. For example, peripheral circuits for driving the memory cells may be formed under the memory cells. Thus, a circuit pattern region for forming the peripheral circuits. and the cell array region and the pad region, may be vertically stacked on the substrate 600, and the peripheral circuits may be referred to as circuit patterns or lower circuit patterns.

However, the inventive concepts are not limited thereto, and the vertical memory device may have no COP structure, the substrate 600 may further include a peripheral circuit region at least partially surrounding the second region II. The circuit patterns may be formed on the peripheral circuit region.

The region X shown in FIG. 1 is a portion of the second region II of the substrate 600. In example embodiments, a plurality of X regions may be disposed in the second direction.

Figure 2:
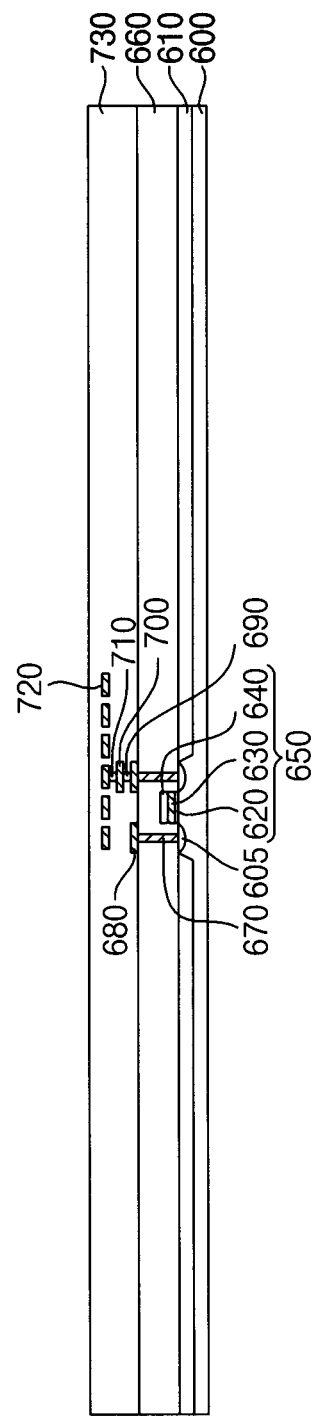

Referring to FIG. 2, the circuit patterns may be formed on the substrate 600, and first and second lower insulating interlayers 660 and 730 may be sequentially formed on the substrate 600 to cover the circuit patterns.

First, a device isolation process may be performed on the substrate 600 to form a field region on which the isolation pattern 610 is formed and an active region on which no isolation pattern is formed. The isolation pattern 610 may include an oxide.

The circuit patterns may include transistors, lower contact plugs, lower wirings, lower vias, or the like. For example, the transistor may include a lower gate structure 650 on the substrate 600 and a first impurity region 605 adjacent to the lower gate structure 650 at an upper portion of the active region of the substrate 600. The lower gate structure 650 may include a lower gate insulation pattern 620, a lower gate pattern 630 and a lower gate mask 640 sequentially stacked.

The first lower insulating interlayer 660 may be formed on the substrate 600 to cover the transistor. A lower contact plug 670 may pass through the first lower insulating interlayer 660, and the lower contact plug 670 may contact the first impurity region 605 or the lower gate pattern 630. A first lower wiring 680 may be formed on the first lower insulating interlayer 660 to contact an upper surface of the lower contact plug 670. A first lower via 690, a second lower wiring 700, a second lower via 710 and a third lower wiring 720 may be sequentially stacked on the first lower wiring 680.

Hereinafter, the circuit patterns on the substrate 600 will not be shown in the figures in order to avoid the complexity of drawings.

Figure 3:
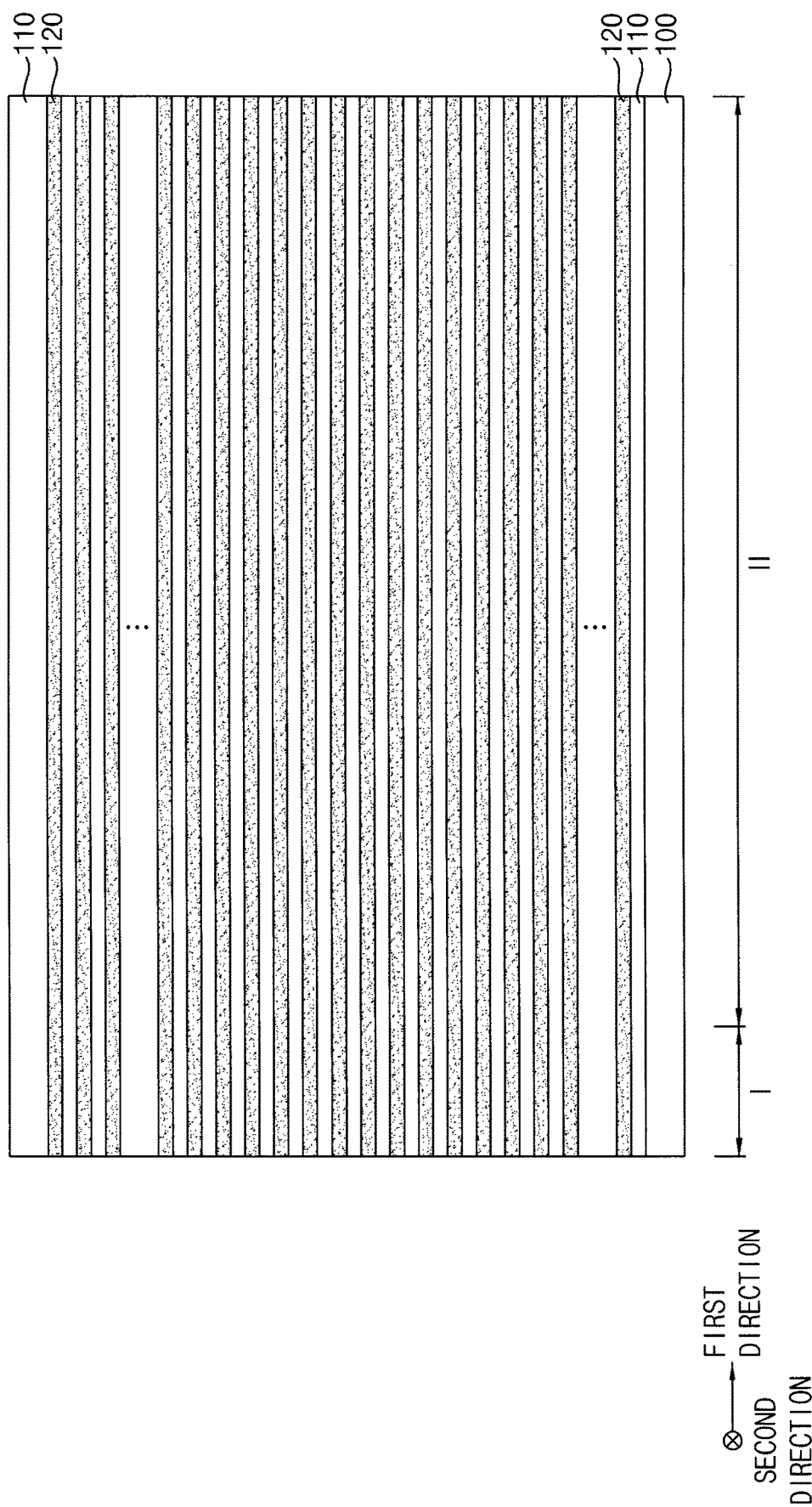

Referring to FIG. 3, a base pattern 100 may be formed on the second lower insulating interlayer 730, and an insulation pattern (not shown) may be formed between portions of the base pattern 100. The insulation layer 110 and the sacrificial layer 120 may be alternately and repeatedly stacked on the base pattern 100 and the insulation pattern. In this case, the insulation layer 110 may be formed on the uppermost portion of the stack.

The base pattern 100 may include or be formed of, e.g., a semiconductor material such as silicon. The insulation layer 110 may include or be formed of, e.g., an oxide such as silicon oxide. The sacrificial layer 120 may include a material having an etch selectivity with respect to the insulation layer 110. The sacrificial layer 120 may include or be formed of, e.g., a nitride such as silicon nitride.

In order to avoid the complexity of the drawings, no insulation layers 110 will be shown but only the sacrificial layers 120 will be shown in all perspective views, hereinafter. Etching processes on the sacrificial layers 120 may be performed not only the sacrificial layers 120 but also the insulation layers 110 each of which may form a pair with one of the sacrificial layers 120 directly therebeneath, and for the convenience of explanation, when the etching processes are described with reference to the perspective views, the insulation layers 110 will not be explained.

Figure 4:
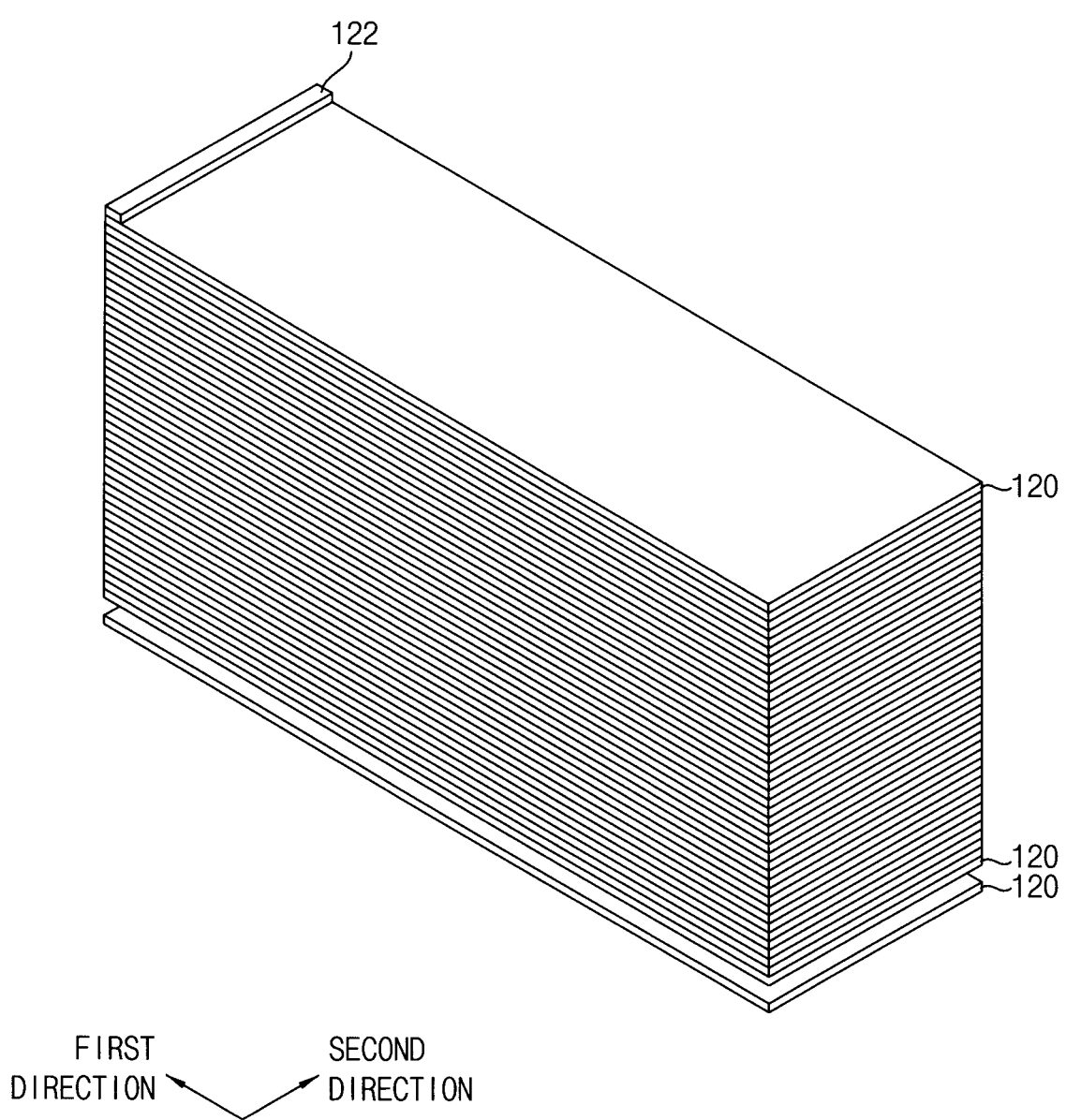

Referring to FIG. 4, a first photoresist pattern (not shown) may be formed on uppermost one of the sacrificial layers 120 to cover the first region I and an edge portion (also described as an end portion) of the second region II adjacent to the first region I of the substrate 600. The uppermost one of the sacrificial layers 120 may be etched by an etching process using an etching mask to form a first sacrificial pattern 122. The first sacrificial pattern 122 may extend along a boundary of the first region I. For example, the first sacrificial pattern 122 may extend in the second direction along the boundary of the first region I.

In addition, the sacrificial layer 120 at a second level from an uppermost level (hereinafter, an n-th level from the uppermost level will be simply referred to as an n-th level) may be exposed on the second region II adjacent to the sidewall of the first sacrificial pattern 122.

However, FIG. 4 illustrates only a portion of the second region II of the substrate 600, for example, the X region, and thus only a portion of the first sacrificial pattern 122 is illustrated. Hereinafter, the sacrificial patterns formed by etching the sacrificial layers 120 may be described with respect to a shape in the X region.

Hereinafter, a method of forming a step mold structure may be described. In processes for forming the step mold structure, the sacrificial layer 120 on the first region I of the substrate 600 is always covered by photoresist patterns. Therefore, the sacrificial layer 120 on the first region I of the substrate 600 may not be etched, and thus is not described. In some embodiments, the sacrificial pattern 122 covers the entire first region I of the substrate 600, in the first direction, and extends a small amount into the second region II of the substrate 600 on opposite ends of the first region I.

After forming the first sacrificial pattern 122, the first photoresist pattern may be removed by an ashing process and/or a stripping process.

Referring to FIGS. 5 to 7, second to fifth photoresist patterns 142, 144, 146 and 148 may be formed on the first sacrificial pattern 122 and an exposed sacrificial layer 120 at the second level.

The second photoresist pattern 142 may cover the first sacrificial pattern 122, and may have a length in the first direction greater than a length in the first direction of the first sacrificial pattern 122.

The third photoresist pattern 144 may cover a portion of the sacrificial layer 120 on the region X, and may be spaced apart from the second photoresist pattern 142 in the first direction. The third photoresist pattern 144 may have a quadrangle shape, in a plan view. The third photoresist pattern 144 may be formed on a portion of a first staircase structure subsequently formed.

The fifth photoresist pattern 148 may cover a portion of the sacrificial layer 120 on the region X, and may be spaced apart from the third photoresist pattern 144 in the first direction. The fifth photoresist pattern 148 may have a quadrangle shape, in a plan view. The fifth photoresist pattern 148 may be formed on a portion of the second staircase structure subsequently formed.

In example embodiments, the first staircase structure formed at an upper level and the second staircase structure formed at a lower level may include steps having the same size and the same shape. In this case, although not shown in the perspective view, as shown in FIG. 6, a width in the second direction of the third photoresist pattern 144 for forming the first staircase structure may be less than a width in the second direction of the fifth photoresist pattern 148 for forming the second staircase structure. The number of etching processes for forming the second staircase structure may be more than the number of etching processes for forming the first staircase structure. Thus, if widths of the third and fifth photoresist patterns 144 and 148 are substantially the same as each other, the first staircase structure may have a relatively large width in the second direction.

In addition, although not shown in a perspective view, as shown in FIG. 6, each of the third and fifth photoresist patterns 144 and 148 may have a trapezoidal shape rather than a rectangular shape. For example, a width in the second direction of each of the third and fifth photoresist patterns 144 and 148 may be increased as distance from the first region I increases. When each of the first and second staircase structures is formed, the number of etching processes may increase as the distance to a portion of each of the first and second staircase structures from the first region I increases. Thus, the third and fifth photoresist patterns 144 and 148 may have shapes as described above. However, in each perspective view, the third and fifth photoresist patterns 144 and 148 are shown to have the same rectangular shape in order to avoid the complexity of the drawings, and also in case a rectangular shape is used.

A portion between the third and fifth photoresist patterns 144 and 148 may be a flat surface portion Y between the first and second staircase structures. For example, the flat surface may be formed from a top surface of one of the sacrificial layers 120. In example embodiments, the flat surface portion Y may have a width in the first direction of about 15 μm to 40 μm.

The fourth photoresist pattern 146 may be formed on the flat surface portion between the third and fifth photoresist patterns 144 and 148. The fourth photoresist pattern 146 may be spaced apart from each of the third and fifth photoresist patterns 144 and 148 in the first direction. The fourth photoresist pattern 146 may extend in the first direction to have a shape of a line parallel to the boundary of the first region I. However, FIG. 6 illustrates only the region X of the substrate 600, so that the fourth photoresist pattern 146 may be shown to have a bar shape. The fourth photoresist pattern 146 may be disposed on a portion of a dummy staircase structure substantially formed later.

The exposed sacrificial layer 120 may be etched using the second to fifth photoresist patterns 142, 144, 146 and 148 as etching masks. For example, the sacrificial layer 120 at the second level may be etched.

Thus, the first sacrificial pattern 122 may be further formed at the second level, and thus the first sacrificial pattern may include two layers. A second sacrificial pattern 124 may be formed to be spaced apart from the first sacrificial pattern 122 in the first direction, and the second sacrificial pattern 124 may have a quadrangle shape, in a plan view. A fourth sacrificial pattern 128 may be formed to be spaced apart from the second sacrificial pattern 124 in the first direction, and the fourth sacrificial pattern 128 may have a quadrangle shape, in a plan view. A third sacrificial pattern 126 may be formed between the second and fourth sacrificial patterns 124 and 128. The third sacrificial pattern 126 may have a shape of a line extending in the second direction (e.g., it may extend lengthwise in the second direction so that its length in the second direction is greater than its width in the first direction).

In some example embodiments, as shown in FIG. 7, a plurality of the second and fourth sacrificial patterns 124 and 128 may be alternately formed to be spaced apart from each other in the first direction. The third sacrificial patterns 126 may be formed between the second and fourth sacrificial patterns 124 and 128, respectively. In this case, more staircase structures and dummy staircase structures may be formed by subsequent processes.

Figure 8:
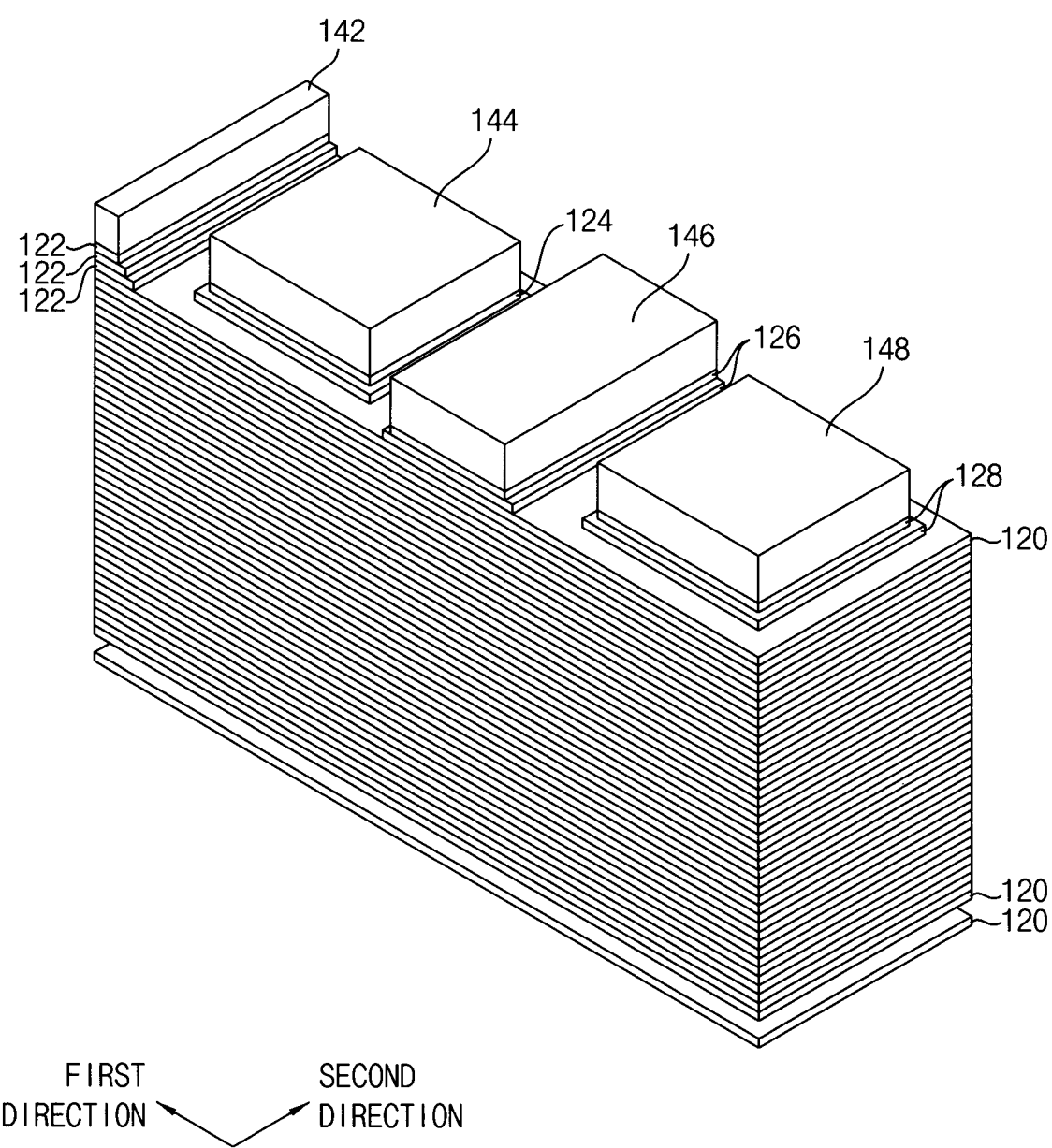

Referring to FIG. 8, a first trimming process in which areas of the second to fifth photoresist patterns 142, 144, 146 and 148 are reduced may be performed, and the first to fourth sacrificial patterns 122, 124, 126 and 128 and the sacrificial layer 120 at a third level may be etched using the reduced second to fifth photoresist patterns 142, 144, 146 and 148 as an etching mask.

Thus, a length in the second direction of the first sacrificial pattern 122 at the second level may be reduced, and the first sacrificial pattern 122 may be further formed at the third level. Thus, the first sacrificial pattern 122 may include three layers. Areas of the second and fourth sacrificial patterns 124 and 128 at the second level may be reduced, and the second and fourth sacrificial patterns 124 and 128 may be further formed at the third level. Thus, each of the second and fourth sacrificial patterns 124 and 128 may include two layers. An area of the third sacrificial pattern 126 at the second level may be reduced, and the third sacrificial patterns 126 may be further formed at the third level. Thus, the third sacrificial patterns 126 may include two layers.

Figure 9:
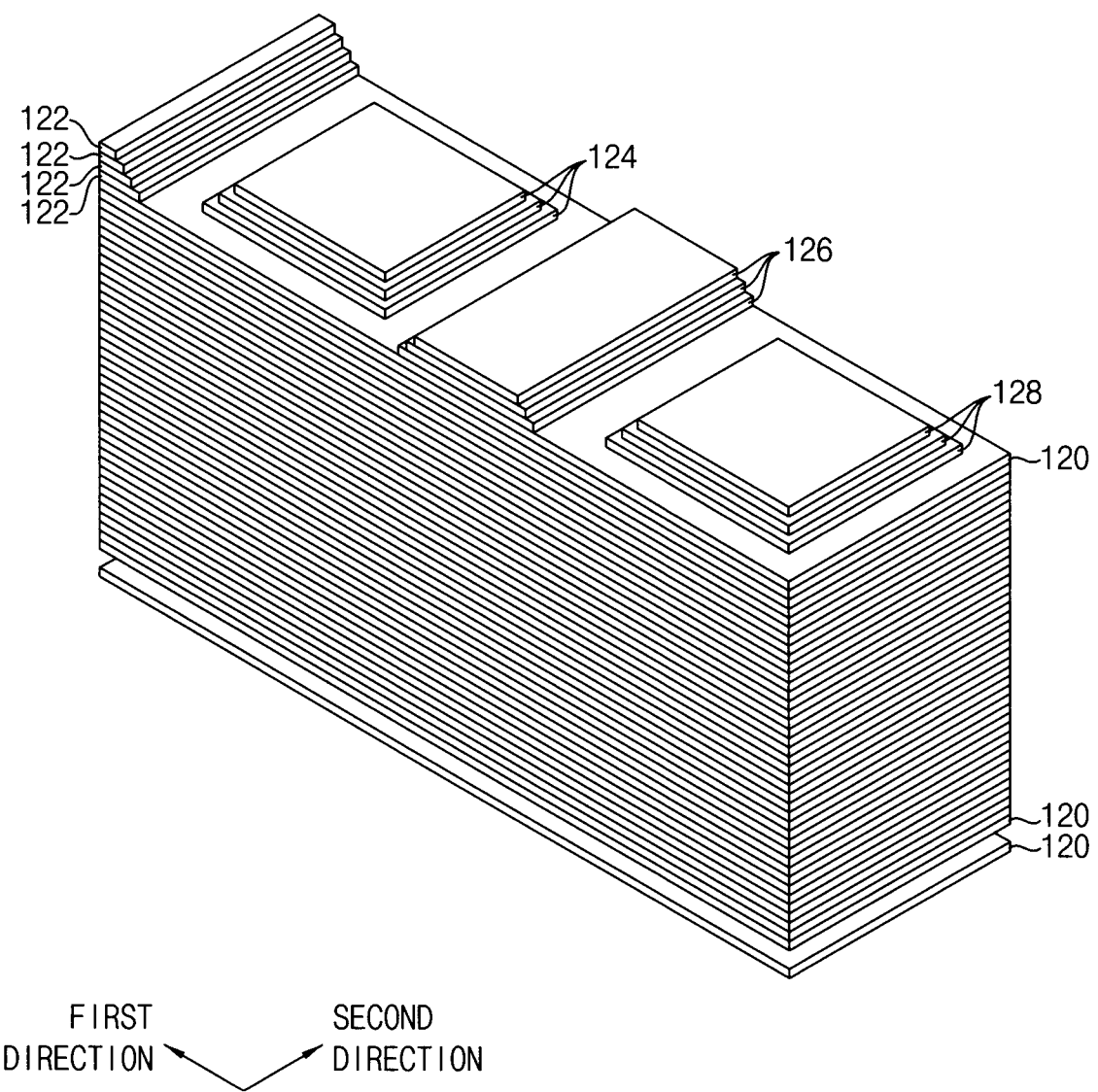

Referring to FIG. 9, a second trimming process and an etching process may be performed.

For example, after reducing the areas of the second to fifth photoresist patterns 142, 144, 146, and 148, the first to fourth sacrificial patterns 122, 124, 126, and 128 and the sacrificial layer 120 at a fourth level may be etched using the reduced second to fifth photoresist patterns 142, 144, 146 and 148 as an etching mask. Thus, an upper surface of the sacrificial layer at the fifth level may be exposed.

Thus, the first sacrificial pattern 122 may include four layers, and an edge portion in the first direction of the first sacrificial pattern 122 may have a stepped shape having four levels.

The second and fourth sacrificial patterns 124 and 128 may include three layers, and edge portions each of the second and fourth sacrificial patterns 124 and 128 in the first direction and the second direction may have a stepped shape of three layers, respectively. The number of layers included in each of the second and fourth sacrificial patterns 124 and 128 may determine the number of steps in the second directions of each of staircase structures subsequently formed. For example, the number of layers included in each of the second and fourth sacrificial patterns 124 and 128 may be one less than the number of steps in the second directions of each of the staircase structures subsequently formed.

The third sacrificial pattern 126 may include three layers, and an edge portion in the first direction of the third sacrificial pattern 126 may have a stepped shape. However, the third sacrificial pattern 126 may not include a step in the second direction. That is, only opposite sidewalls of third sacrificial pattern 126 in a direction perpendicular to the boundary of the first region I, that is, in the first direction may have the stepped shape.

In some example embodiments, each of the first to fourth sacrificial patterns 122, 124, 126, and 128 may include greater or fewer layers. For example, the number of layers included in each of the first to fourth sacrificial patterns 122, 124, 126, and 128, e.g., the number of steps, may be controlled by the number of trimming processes of the photoresist patterns and the number of etching processes.

Hereinafter, the fourth to fourth sacrificial patterns formed by the trimming process and the etching process using the second to fifth photoresist patterns 142, 144, 146 and 148 may be referred to as initial first to fourth sacrificial patterns, respectively. That is, the first to fourth sacrificial patterns illustrated in FIG. 9 may be referred to as the initial first to fourth sacrificial patterns, respectively.

Figure 10:
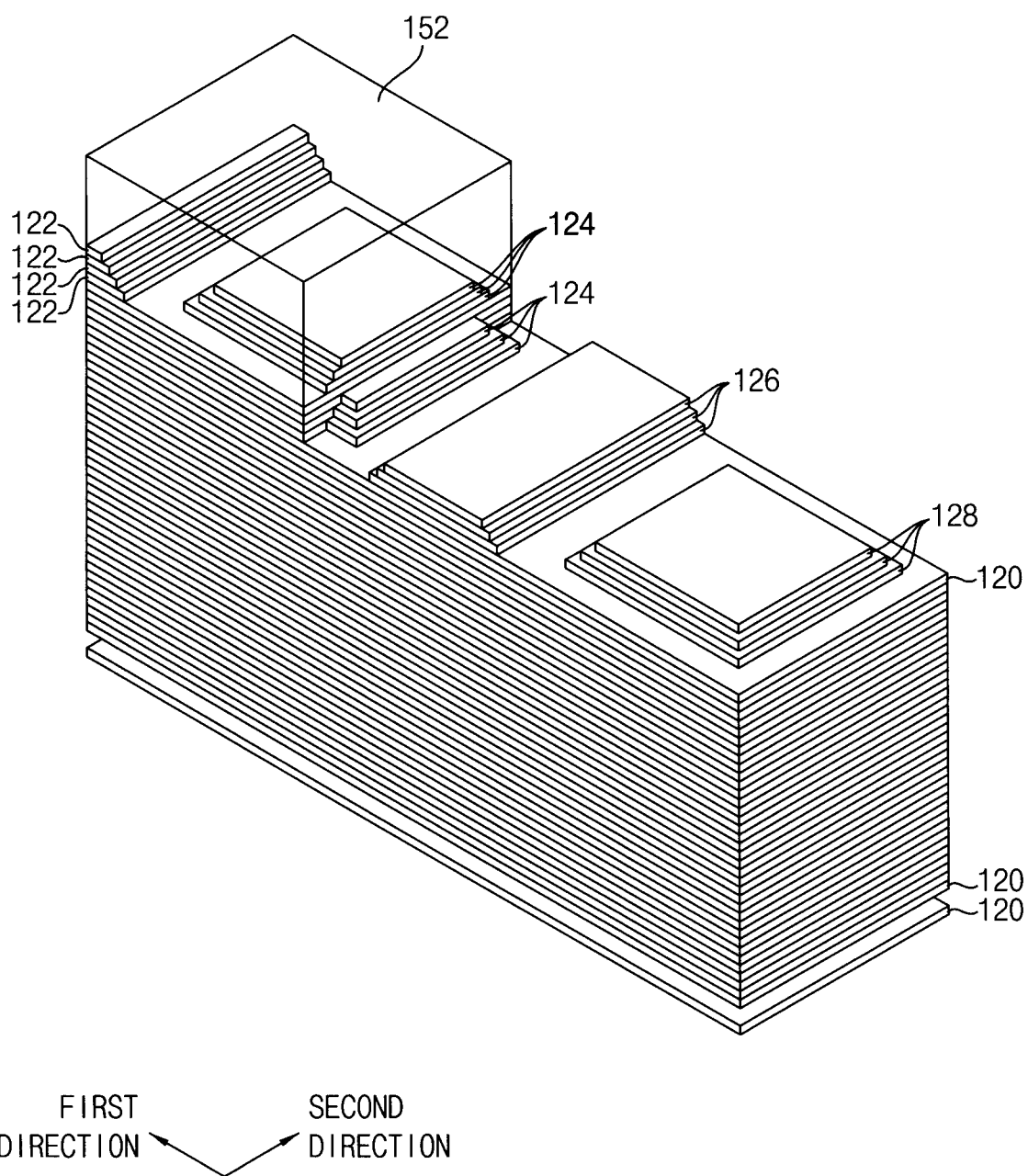

Referring to FIG. 10, a sixth photoresist pattern 152 covering the first sacrificial patterns 122 and a portion of the second sacrificial patterns 124 adjacent to first sacrificial patterns 122 may be formed on the sacrificial layer 120 at the fifth level.

Thereafter, the second to fourth sacrificial patterns 124, 126 and 128 and the sacrificial layers 120 from fifth to eighth levels may be etched using the sixth photoresist pattern 152 as an etching mask.

Thus, the third and fourth sacrificial patterns 126 and 128 which are not covered by the sixth photoresist pattern 152 may be etched, and may be transferred on the sacrificial layer at the eighth level. Therefore, the third and fourth sacrificial patterns 126 and 128 may be formed on the sacrificial layer at the eighth level.

A portion of the second sacrificial pattern 124 which is not covered by the sixth photoresist pattern 152 may be etched, and may be transferred on the sacrificial layer at the eighth level. A portion of the second sacrificial pattern 124 which is covered by the sixth photoresist pattern 152 may not be etched, and may remain.

In example embodiments, in the etching process, the number of the etched sacrificial layers may be one more than the number of layers included in each of the initial second to fourth sacrificial patterns 124, 126, and 128. For example, as each of the initial second to fourth sacrificial patterns 124, 126, and 128 are include three layers of the second to fourth level, four layers below each of the initial second to fourth sacrificial patterns 124, 126, and 128, for example, ones of the sacrificial layers 120 at the fifth to eighth levels, may be etched.

As such, although the sacrificial layers 120 of four layers are etched by the etching process using the sixth photoresist patterns 152, the inventive concept is not limited thereto. The sacrificial layers 120 of more or less layers than the above number may be etched by the etching process.

Figure 11:
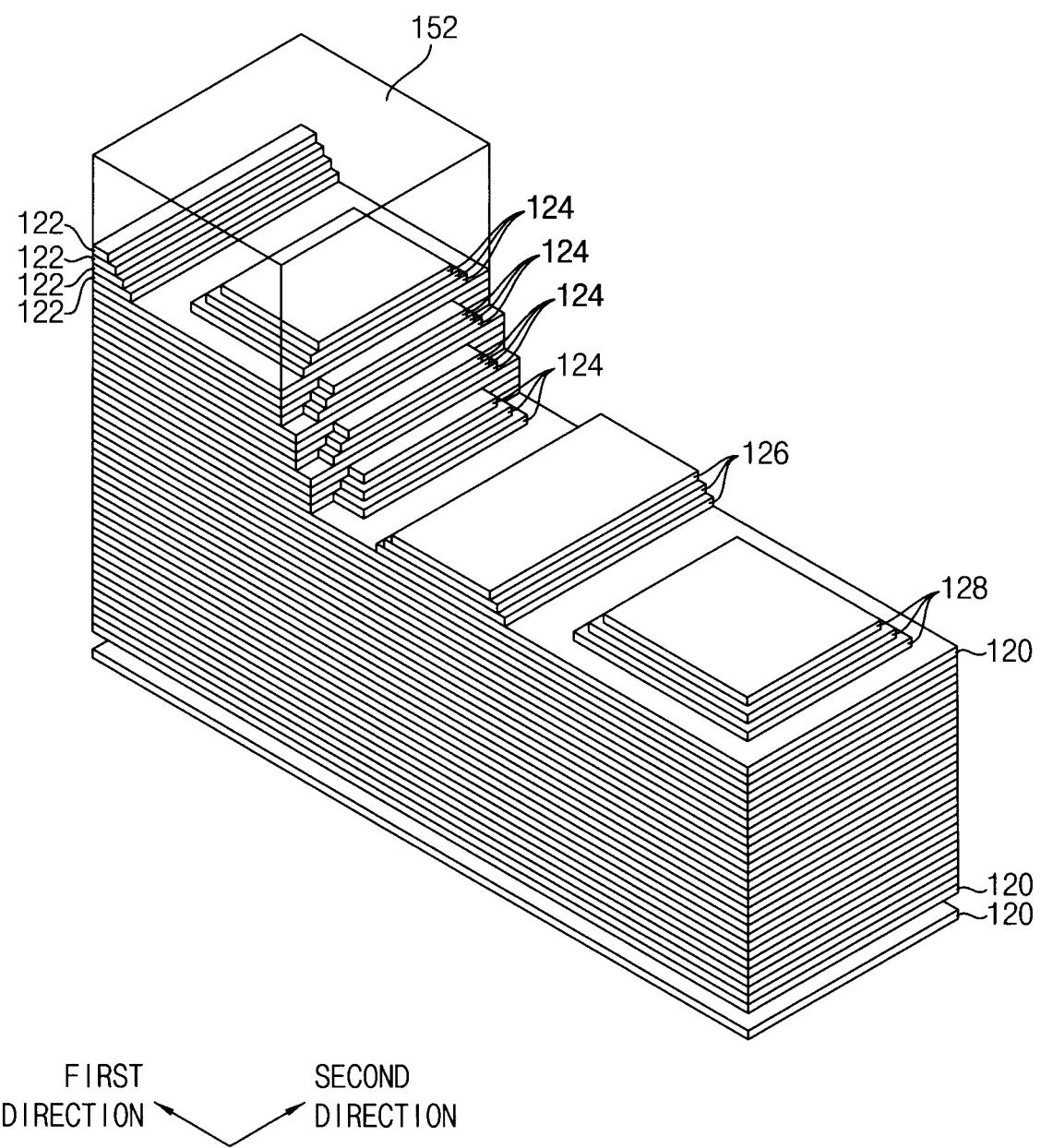
Figure 12:
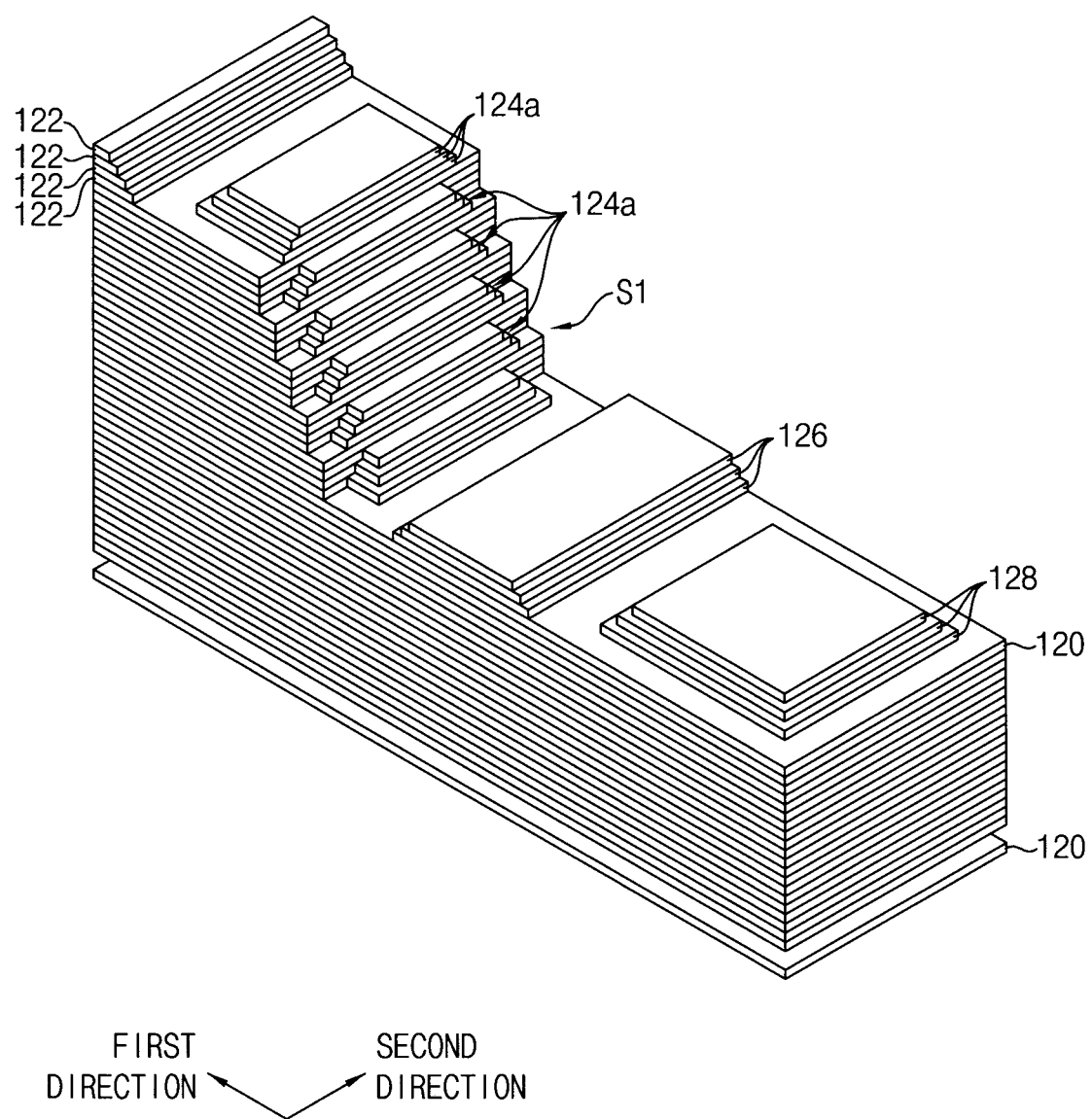

Referring to FIGS. 11 and 12, a first trimming process for reducing the area of the sixth photoresist pattern 152 may be performed, and thus a portion of the second sacrificial pattern 124 may be further exposed.

The second to fourth sacrificial patterns 124, 126, and 128 and ones of the sacrificial layers 120 at the ninth to twelfth levels may be etched using the reduced sixth photoresist pattern 152 as an etching mask. The third and fourth sacrificial patterns 126 and 128 may be etched, and thus may be transferred on the sacrificial layer 120 at the twelfth level. The third and fourth sacrificial patterns 126 and 128 may be formed on the sacrificial layer at the twelfth level.

A portion of the second sacrificial pattern 124 not covered by the sixth photoresist pattern 152 may be etched, and may be transferred on the sacrificial layer 120 at twelfth level. A portion of the second sacrificial pattern 124 covered by the sixth photoresist pattern 152 may not be etched, and may remain.

Subsequently, the trimming of the sixth photoresist pattern 152 and the etching of exposed sacrificial patterns and the sacrificial layers may be repeatedly performed.

When the trimming of on the photoresist pattern and the etching of exposed sacrificial patterns and the sacrificial layers are once performed, one step in the first direction of the second sacrificial pattern 124 may be further formed. Also, four steps in the second direction of the second sacrificial pattern 124 may be formed by steps of the initial second sacrificial pattern 124. As such, the trimming processes and the etching processes may be performed one or more times.

FIG. 11 illustrates a structure formed by performing a total of three etching processes and two trimming processes. FIG. 12 illustrates a structure formed by performing a total of five etching processes and four trimming processes.

As shown in FIG. 12, a first staircase structure S1 may be formed on the sacrificial layer 120 at the 24th level by performing the trimming processes and the etching processes. Hereinafter, a pattern included in the first staircase structure S1 is referred to as a fifth sacrificial pattern 124a. After forming the first staircase structure S1, the sixth photoresist pattern 152 may be removed. A pattern formed at one layer may be referred to herein as a layer pattern.

The first staircase structure S1 may include five steps in the first direction and four steps on either end in the second direction. The steps on either end in the second direction may be symmetric with respect to a line extending in the first direction.

Edge portions in the first direction of the initial second sacrificial pattern are transferred at a lowermost layer and an uppermost layer of the first staircase structure S1, respectively. Thus, the lowermost layer and the uppermost layer of the first staircase structure S1 may have shapes substantially the same as shapes of the edge portions in the first direction of the initial second sacrificial pattern, respectively.

Meanwhile, when the trimming process and the etching process are performed, the third and fourth sacrificial patterns 126 and 128 exposed by the sixth photoresist pattern 152 may be etched, and may be transferred at a lower portion. For example, the third and fourth sacrificial patterns 126 and 128 may be formed on the sacrificial layer 120 at 24th level.

The third sacrificial pattern 126 may be spaced apart from the first staircase structure S1 in the first direction. The third sacrificial pattern 126 may be disposed between the first staircase structure S1 and the fourth sacrificial pattern 128. The third sacrificial pattern 126 may serve as a dummy staircase structure by subsequent processes.

Figure 13:
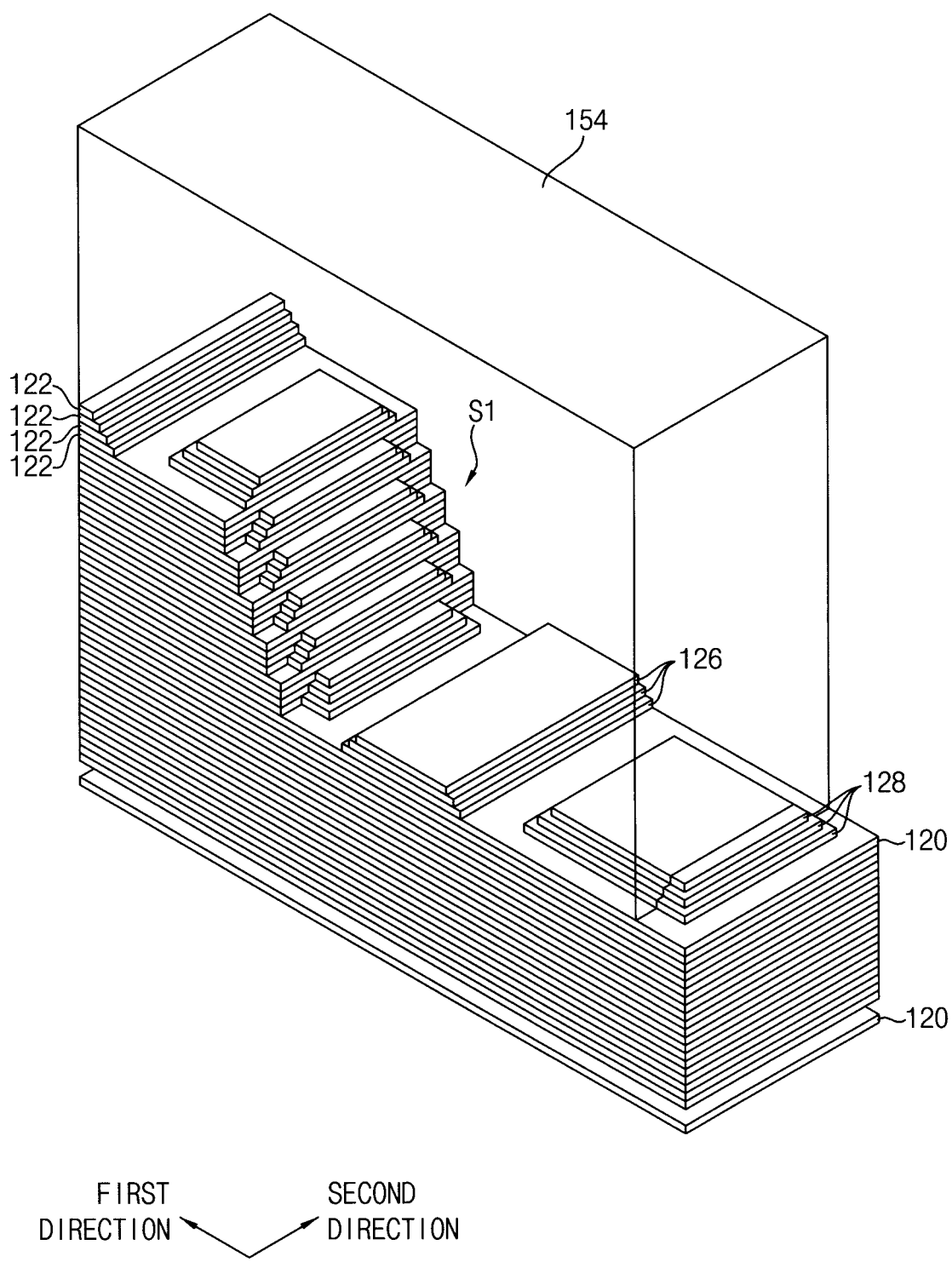

Referring to FIG. 13, a seventh photoresist pattern 154 covering the first sacrificial pattern 122, the first staircase structure S1, the third sacrificial pattern 126 and a portion of the fourth sacrificial pattern 128 is formed. The seventh photoresist pattern 154 may completely cover the first sacrificial pattern 122, the first staircase structure S1, the third sacrificial pattern 126 and the sacrificial layers 120 therebetween. Thus, only the step portion of the edge in the first direction of the fourth sacrificial pattern 128 may be exposed by the seventh photoresist pattern 154.

Figure 14:
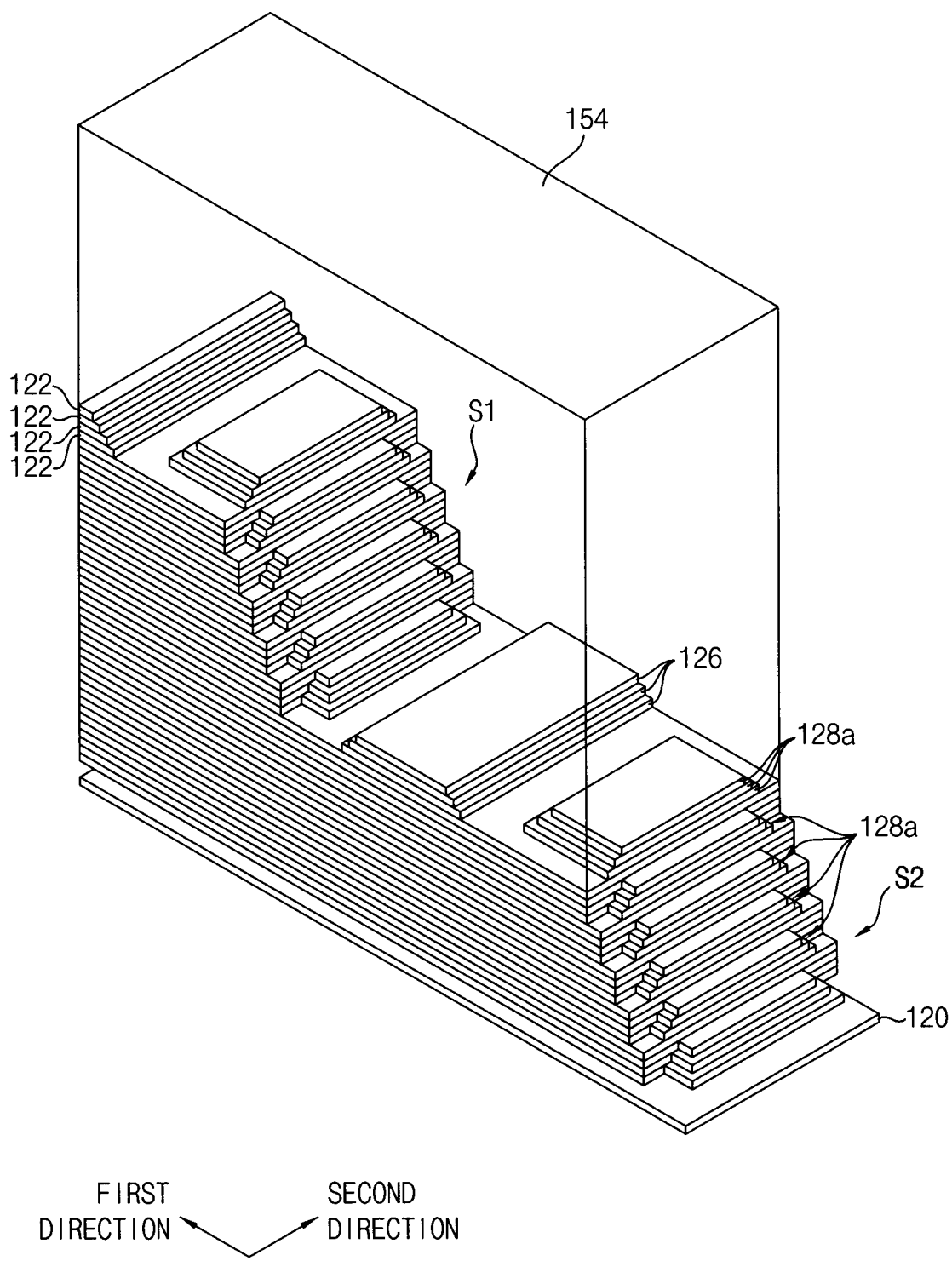

Referring to FIG. 14, four layers included in the fourth sacrificial pattern 128 and the sacrificial layers may be etched using the seventh photoresist pattern 154 as an etching mask.

Thereafter, the trimming of the seventh photoresist pattern 154 and the etching of the exposed fourth sacrificial pattern 128 and the sacrificial layers may be repeatedly performed.

In example embodiments, a total of five etching processes and four trimming processes may be performed. Thus, the second staircase structure S2 may be formed on the sacrificial layer at the 44th level. Hereinafter, a pattern included in the second staircase structure S2 is referred to as a sixth sacrificial pattern 128a.

In example embodiments, the number of the etching processes and the number of the trimming processes for forming the second staircase structure S2 may be the same as the number of the etching processes and the number of the trimming processes for forming the first staircase structure S1, respectively. In this case, the second staircase structure S2 may include five steps in the first direction and four steps in the second direction, similarly to the first staircase structure S1. The steps of the second staircase structure S2 may be symmetric with respect to a line extending in the first direction. However, the number of etching processes and the number of trimming processes for forming the second staircase structure S2 is not limited thereto.

Edge portions of the initial fourth sacrificial pattern in the first direction are transferred at a lowermost layer and an uppermost layer of the second staircase structure S2, respectively. Thus, the lowermost layer and the uppermost layer of the second staircase structure S2 may have shapes substantially the same as shapes of the edge portions in the first direction of the initial fourth sacrificial pattern, respectively.

The seventh photoresist pattern 154 may completely cover the first sacrificial pattern 122, the first staircase structure S1, the third sacrificial pattern 126, and the sacrificial layers therebetween. Thus, the first sacrificial pattern 122, the first staircase structure S1, and the third sacrificial pattern 126 may not be etched by the etching process, and may remain.

Figure 15:
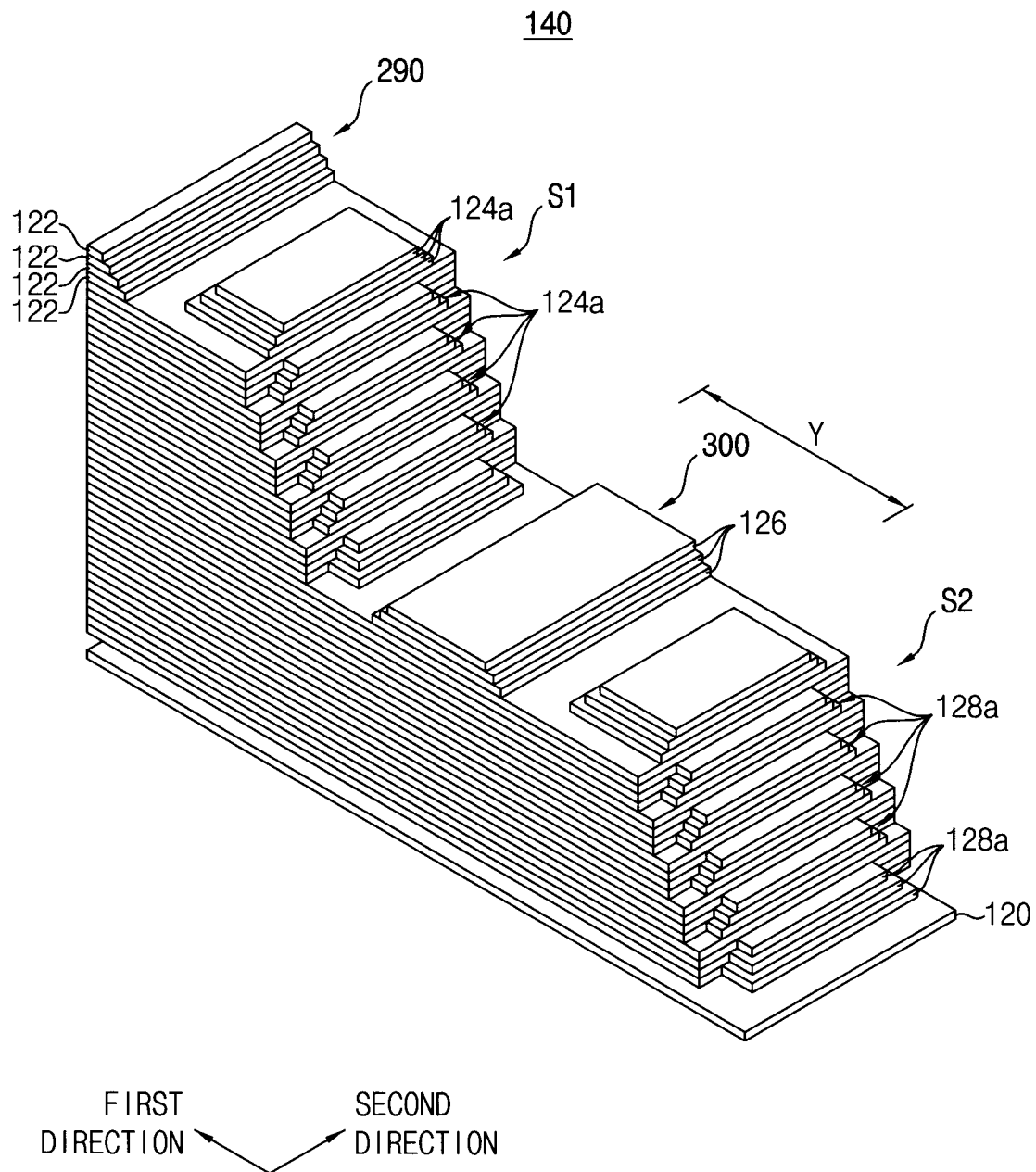

Referring to FIGS. 15 to 17, the seventh photoresist pattern 154 may be removed to form a mold structure 140. The mold structure 140 may include the first sacrificial pattern 122, the first staircase structure S1, the third sacrificial pattern 126 and the second staircase structure S2. The mold structure 140 formed on the second region II may serve as a pad structure by a subsequent metal replacement process.

In the mold structure, a stacked structure of the first sacrificial patterns 122 is referred to as an upper staircase structure 290. Also, a stacked structure of the third sacrificial patterns 126 is referred to as a dummy staircase structure 300.

As shown in FIGS. 15 to 17, a flat surface portion Y having relatively wide width may be formed between the first staircase structure S1 and the second staircase structure S2. The first staircase structure S1 may be positioned higher than the flat surface portion Y. A portion of the second staircase structure S2 may be positioned higher than the flat surface portion Y, and most portions of the second staircase structure S2 may be positioned lower than the flat surface portion Y. Further, the dummy staircase structure 300 may be formed on the flat surface portion Y.

The steps of the first and second staircase structures S1 and S2 may correspond to exposed upper surfaces of the fifth and sixth sacrificial patterns 124a and 128a, respectively. The steps may serve as a pad on which the contact plug is formed by subsequent process.

A portion of the flat surface portion Y may be a portion for forming a through via contact being electrically connected with the peripheral circuits.

After forming the mold structure 140, an accurate measurement of a width in the first direction of the mold structure 140 may be performed. Particularly, widths in the first direction of distinguishable patterns (e.g., steps) in the mold structure 140 may be measured, respectively, and the measured widths in the first direction may be summed to determine a width in the first direction of the entire mold structure 140.

As shown in FIG. 17, the widths (a) in the first direction of each step in the first sacrificial pattern 122 and the widths (b, d) in the first direction of each step included in the first and second staircase structures S1 and S2 may be measured, respectively. The step may be also described as an upper surface of each stair. The third sacrificial pattern 126 may be formed on the flat surface portion Y. Thus, widths (c1) in the first direction of the steps in the third sacrificial pattern 126 and a width (c2) in the first direction of an uppermost surface of the third sacrificial pattern 126 may be measured, respectively. Further, a width (e) between the first sacrificial pattern 122 and the first staircase structure S1, a width (f) between the first staircase structure S1 and the third sacrificial pattern 126, a width (g) between the third sacrificial pattern 126 and the second staircase structure S2, and a width (h) between the second staircase structure S2 and a lower end of the mold structure may be measured, respectively.

Therefore, in order to measure the width of the flat surface portion Y, the width (e) between the dummy staircase structure 300 and a lower end of the first staircase structure S1, the widths (c1) of each step in the third sacrificial pattern 126, the width (c2) of the uppermost surface of the third sacrificial pattern 126 and the width (g) between the dummy staircase structure 300 and an upper edge of the second staircase structure S2 may be measured, respectively. The measured widths may be summed to determine a total width of the flat surface portion Y. It should be noted that the term "length" may be used to describe the widths described above, as each item can be described as having a particular length in the first direction.

If the dummy staircase structure 300 is not formed on the flat surface portion Y, distinguishable patterns for measurement may not be on the flat surface portion Y. Thus, an entire width of the flat surface portion Y may be measured by one measurement. The entire width of the flat surface portion Y may be relatively large, so that the entire width of the flat surface portion Y may not be measured in high magnification and high resolution. For example, the entire width of the flat surface portion Y may be measured in a magnification lower than a magnification for measuring the width of each step in the first and second staircase structures S1 and S2. When the width of the flat surface portion Y is measured in the low magnification, a measurement error of the width may increase and an accurate measurement may not be performed. Therefore, the entire width in the first direction of the mold structure 140 may not be accurately measured.

In contrast, in example embodiments, the dummy staircase structure 300 may be formed on the flat surface portion Y. Thus, the width of the flat surface portion may be determined by measuring each of distinguishable patterns at the third sacrificial pattern 126. Therefore, the width of the flat surface portion may be measured using a high magnification. For example, each of the distinguishable patterns in the third sacrificial pattern 126 may be measured in a magnification the same as or higher than that used to measure the width of each step of the first and second staircase structures S1 and S2.

Figure 18:
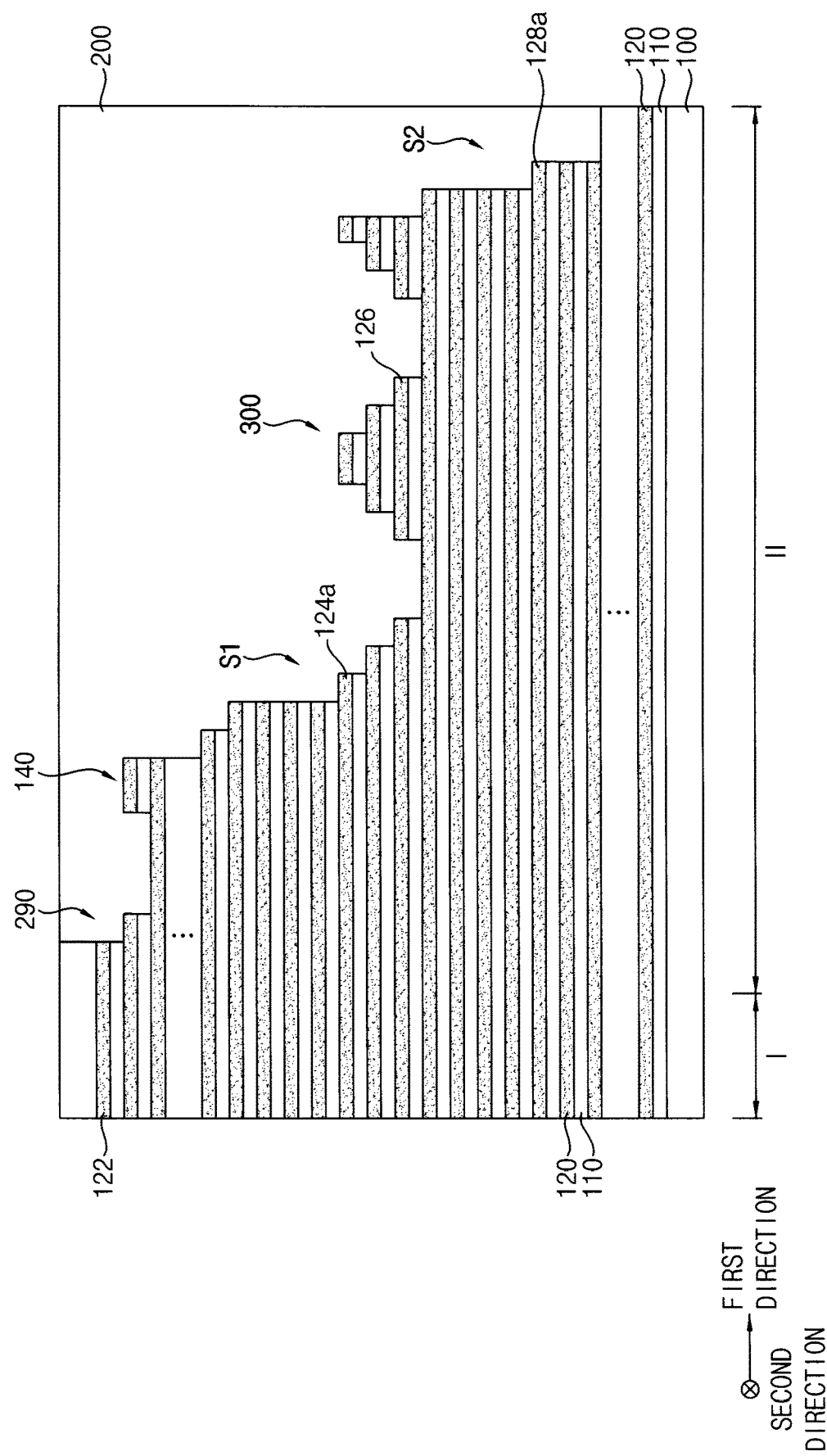

Referring to FIG. 18, a first insulating interlayer 200 may be formed on the base pattern 100, and the first insulating interlayer 200 may cover the mold structure 140 formed on the first and second regions I and II. The first insulating interlayer 200 may be planarized until an upper surface of an uppermost insulation layer 110 is exposed. Thus, the first insulating interlayer 200 may cover sidewalls of the mold structure 140. The first insulating interlayer 200 may include, e.g., an oxide such as silicon oxide.

In example embodiments, an insulating interlayer may be further formed on an upper surface of the mold structure 140 and an upper surface of the first insulating interlayer 200.

Figure 19:
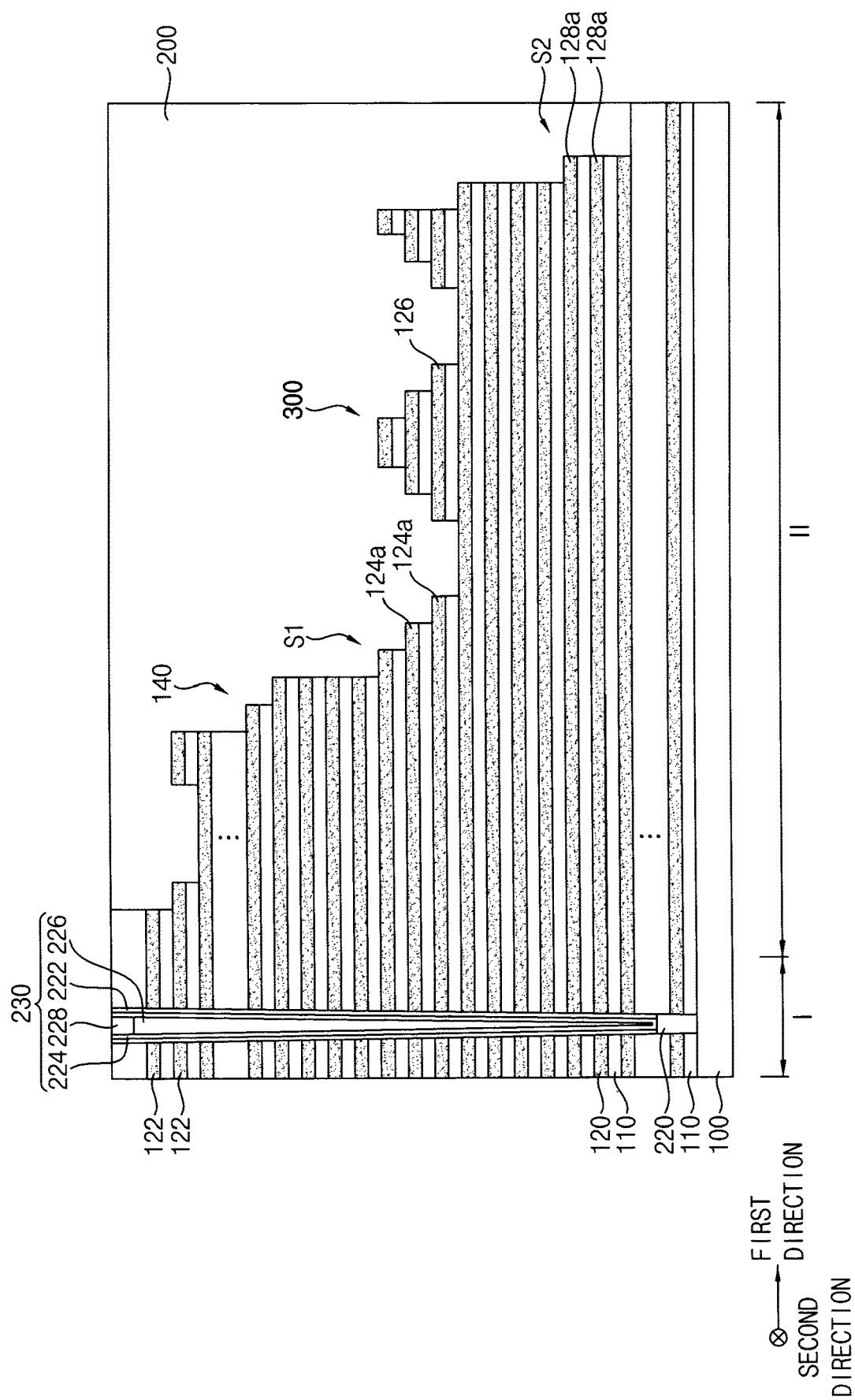

Referring to FIG. 19, after forming a first mask (not shown) on the first insulating interlayer 200, the mold structure 140 formed on the first region I may be etched using the first mask (not shown) to form a channel hole. The channel hole may through the mold structure 140, and thus an upper surface of the base pattern 100 may be exposed by the channel hole. A plurality of channel holes may be regularly formed on the base pattern 100 of the first region I. A channel structure 230 may be formed in the channel hole.

In example embodiments, a semiconductor pattern 220 may be further formed between the base pattern 100 and the channel structure 230. In this case, the channel structure 230 may be formed on the semiconductor pattern 220. In example embodiments, the semiconductor pattern 220 may include, e.g., single crystal silicon or polysilicon. In some example embodiments, the process of forming the semiconductor pattern 220 may be omitted. In this case, the channel structure 230 may directly connect to (e.g., may contact) the base pattern 100. The word "contact" as used herein indicates a direct connection (e.g., touching), unless the context clearly indicates otherwise.

In example embodiments, the channel structure 230 may include a dielectric layer structure 222, a channel 224, a buried insulation pattern 226 and an upper conductive pattern 228.

The dielectric layer structure 222 may include a tunnel insulation layer, a charge storage layer and a blocking layer sequentially stacked from an outer wall of the channel 224. The upper conductive pattern 228 may include polysilicon.

Figure 20:
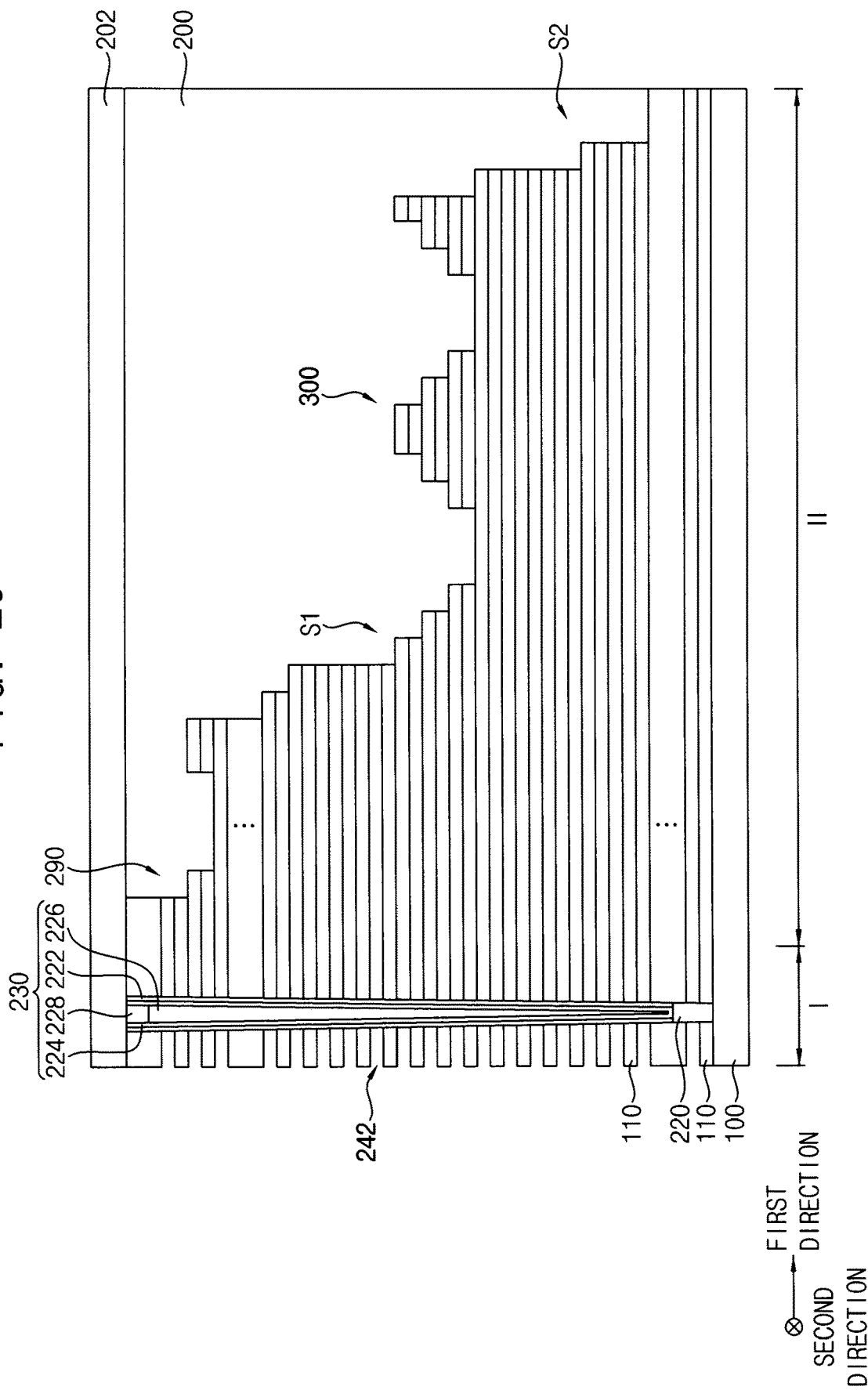
Figure 21:
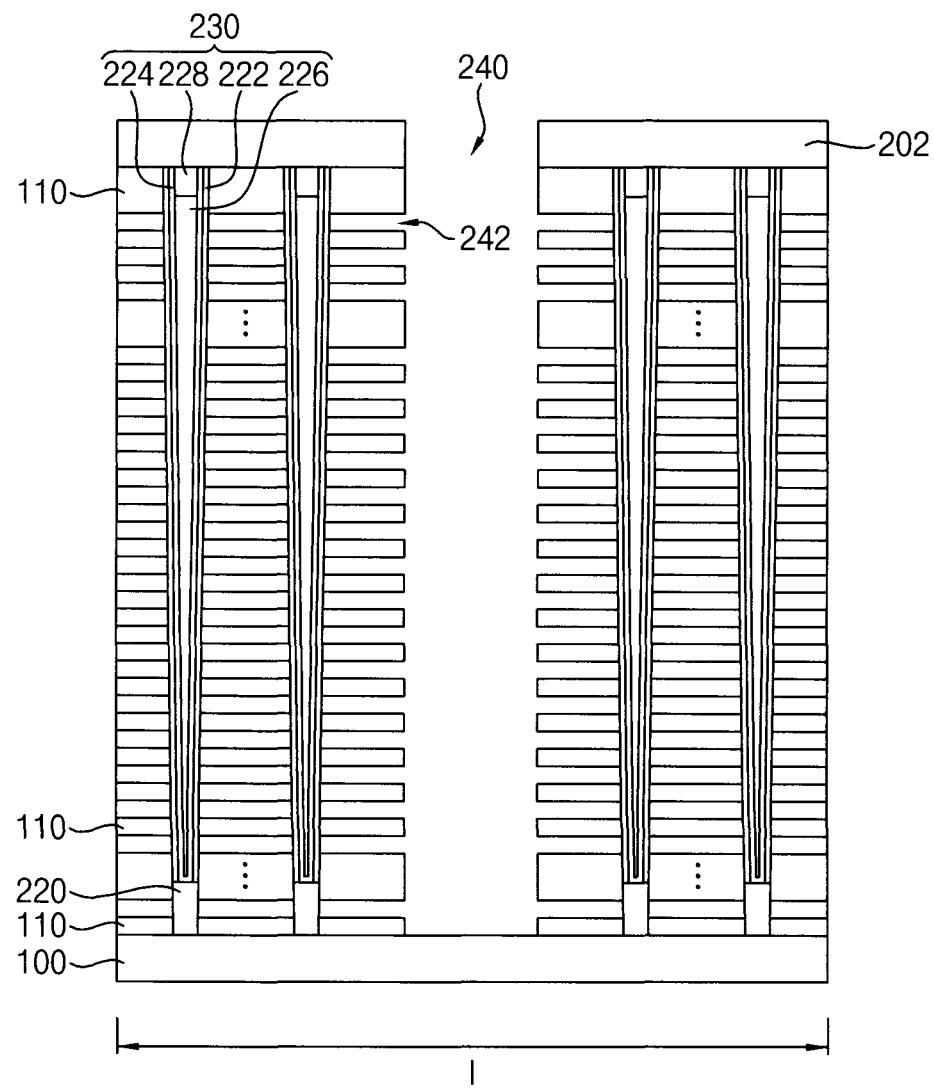
Figure 22:
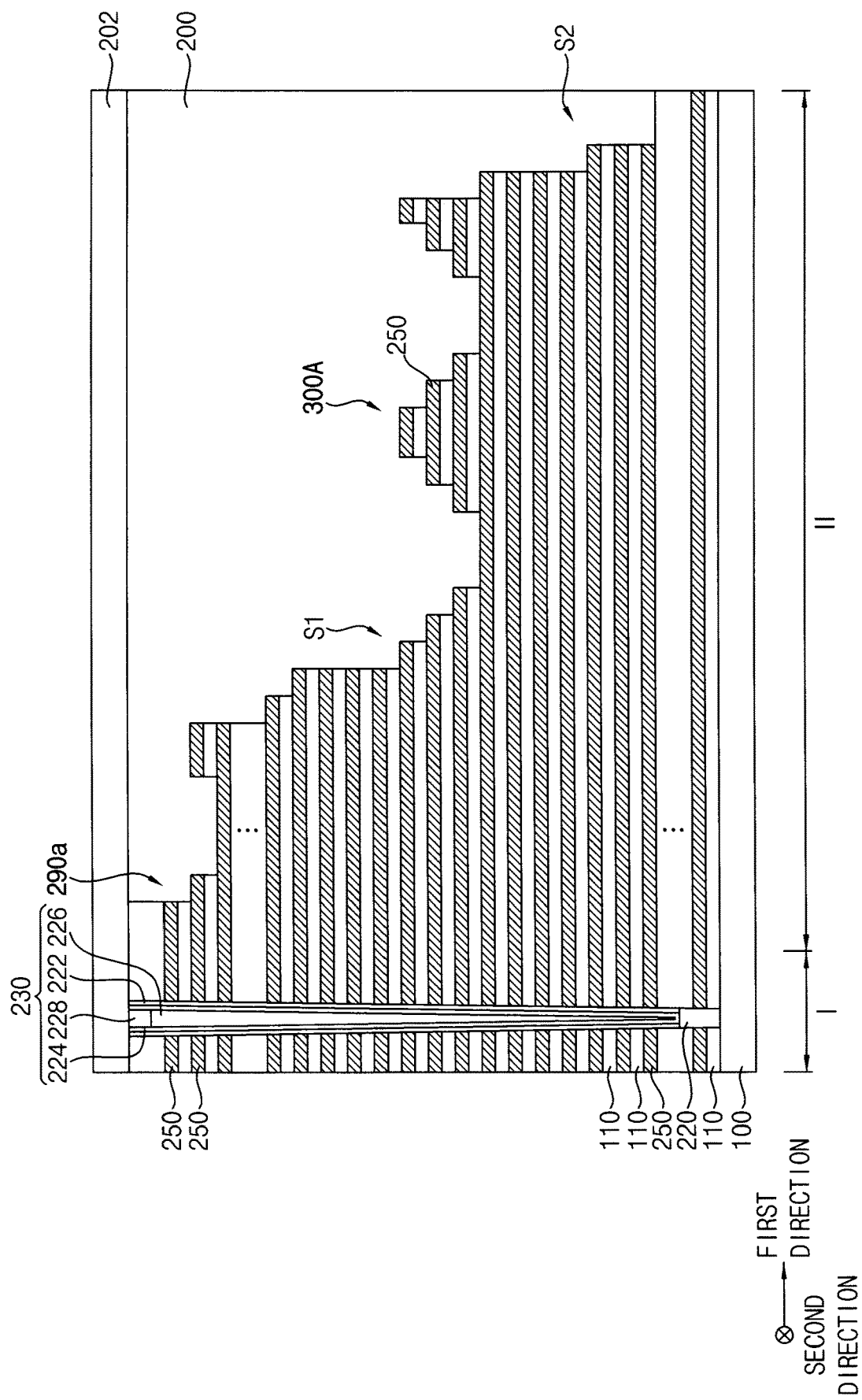

Referring to FIGS. 20 and 21, a second insulating interlayer 202 may be formed on the mold structure 140, the channel structure 230, and the first insulating interlayer 200. A second mask (not shown) may be formed on the second insulating interlayer 202. The first and second insulating interlayers 200 and 202 and the mold structure 140 may be etched using the second mask as an etching mask to form a trench 240 passing through the first and second insulating interlayers 200 and 202 and the mold structure 140. An upper surface of the base pattern 100 may be exposed by the trench 240.

In some example embodiments, the trench 240 may be formed on the first and second regions I and II of the substrate 600, and may extend in the first direction. A plurality of the trenches 240 may be formed to be arranged in the second direction.

After removing the second mask, the sacrificial layers exposed by the trench 240 may be removed to form a gap 242 between the insulation layers 110. Portions of an outer sidewall of the channel structure 230 and a sidewall of the semiconductor pattern 220 may be exposed by the gap 242.

Referring to FIGS. 22 to 25, a gate conductive layer is formed in the gap 242. Before forming the gate conductive layer, a barrier metal layer (not shown) may be further conformally formed on a surface of the gap 242.

For example, the gate conductive layer may include a low resistance metal, e.g., tungsten or aluminum, and the barrier metal layer may include a metal nitride, e.g., titanium nitride or tantalum nitride.

Thereafter, the gate conductive layer in the trench 240 may be selectively removed to form a gate conductive pattern filling in the gap 242. When the barrier metal layer is formed, a barrier metal pattern may be formed by the removing process. A structure including the gate conductive pattern and the gate barrier pattern may serve as a gate pattern 250.

In example embodiments, the gate pattern 250 may extend in the first direction, and a plurality of gate patterns 250 may be arranged in the second direction. The plurality of gate patterns 250 may be spaced apart from each other in the second direction by the trench 240.

The gate patterns 250 may be stacked to be spaced apart from each other in the vertical direction. Each of gate patterns 250 may extend in the first direction, and thus may be formed on the first and second regions I and II of the substrate 600.

The gate patterns 250 may be formed by replacing the sacrificial layers included in the mold structures on the first and second regions I and II with the metal.

All of the sacrificial layers of the mold structure 140 formed on the first region I may be replaced with the gate patterns 250. The gate patterns 250 formed on the first region I may be referred to as a cell gate pattern. At least portions of the sacrificial layers of the mold structure 140 formed on the second region II may be replaced with the gate patterns 250.

In example embodiments, at least portions of the sacrificial patterns included in the first and second staircase structures S1 and S2 are replaced with the gate pattern 250, and the first and second staircase structures replaced with the gate pattern 250 may be also referred to as the first and second staircase structures S1 and S2, respectively.

Further, at least portions of the first sacrificial pattern included in the upper staircase structure 290 may be replaced with the gate pattern 250, and the upper staircase structure 290 being replaced with the gate pattern 250 may be referred to as a first upper staircase structure 290a. At least portions of the third sacrificial pattern included in the dummy staircase structure 300 may be replaced with the gate pattern 250, and the dummy staircase structure 300 being replaced with the gate pattern 250 may be referred to as a first dummy staircase structure 300a.

The sacrificial layers exposed by the sidewalls of the trench 240 may be removed to form the gap 242. Therefore, positions of the gaps 242 may be controlled by a position of the trench 240. For example, positions being replaced with the gate patterns 250 and positions not being replaced with the gate patterns in the mold structure may be controlled by the positions of the gaps 242.

Figure 24:
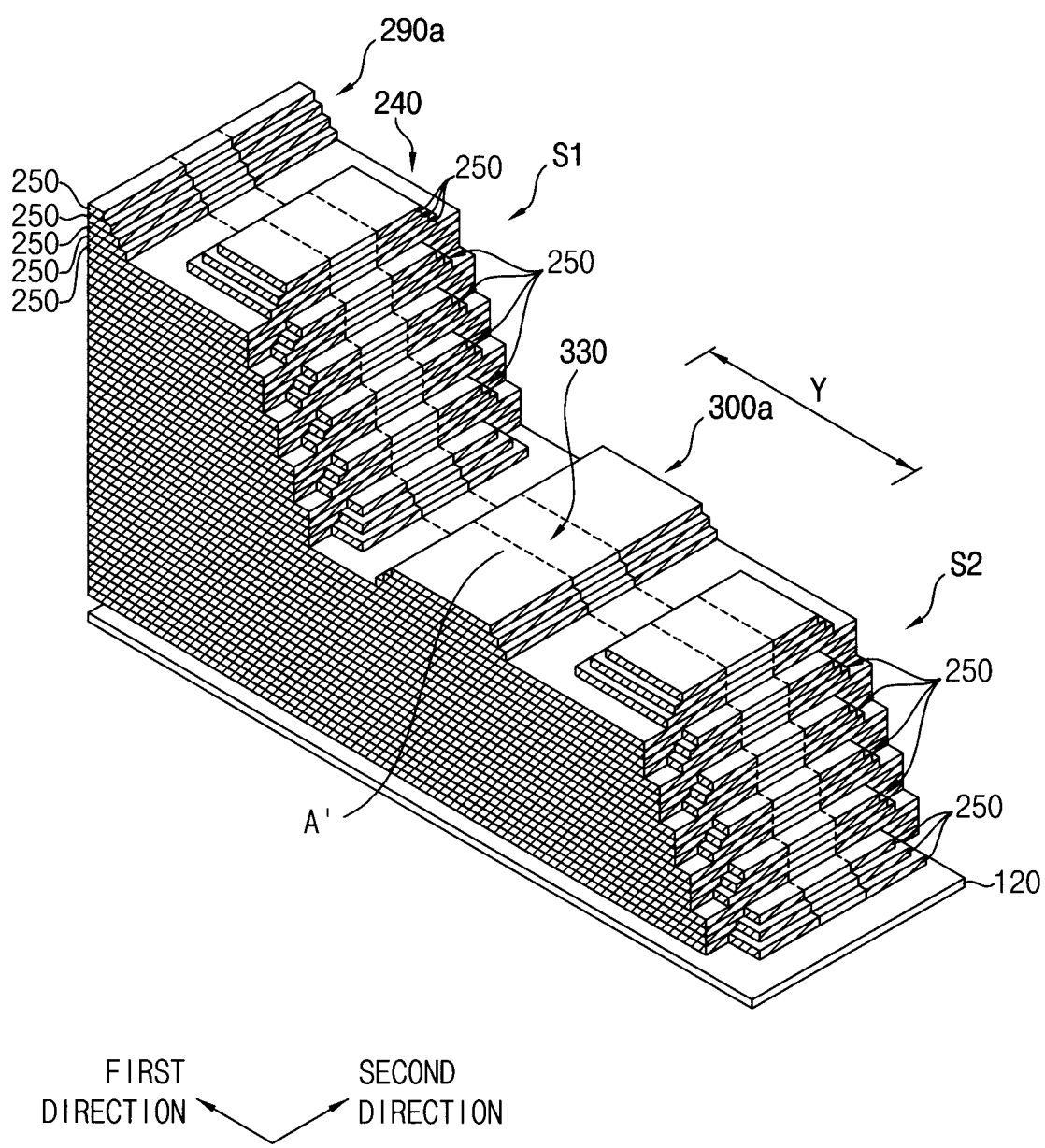

In example embodiments, the mold structure 140 may be separated from other mold structures by the trench 240, and thus the separated mold structure 140 may extend in the first direction. In this case, a portion of the mold structure 140 in which steps in the first and second directions are formed may be replaced with the gate pattern 250, and the portion may serve as a pad. The sacrificial layers connected to the steps of the first and second staircase structures S1 and S2 in a horizontal direction may be replaced with the gate pattern 250. In example embodiments, a portion of the mold structure is not replaced with the gate pattern, and at least steps in the first and second directions of the mold structure 140 are replaced with the gate pattern. As shown in FIG. 24, the trenches 240 may be formed at opposite ends in the second direction of the mold structure 140, and only the sacrificial layer positioned to a predetermined distance in the second direction from the trench 240 may be removed. Thus, the sacrificial layer and the insulation layer may remain at a central portion in the second direction of the mold structure 140. In addition, the portion where the gap is formed may be replaced with the gate pattern 250, and thus only this portion may serve as the pad. The portion not being replaced with the gate pattern may remain a structure including the sacrificial layers and the insulation layers alternately stacked, so that this portion may serve as an insulation structure 330. The insulation structure 330 may extend in the first direction along a central portion A' in the second direction of the mold structure 140.

Figure 25:
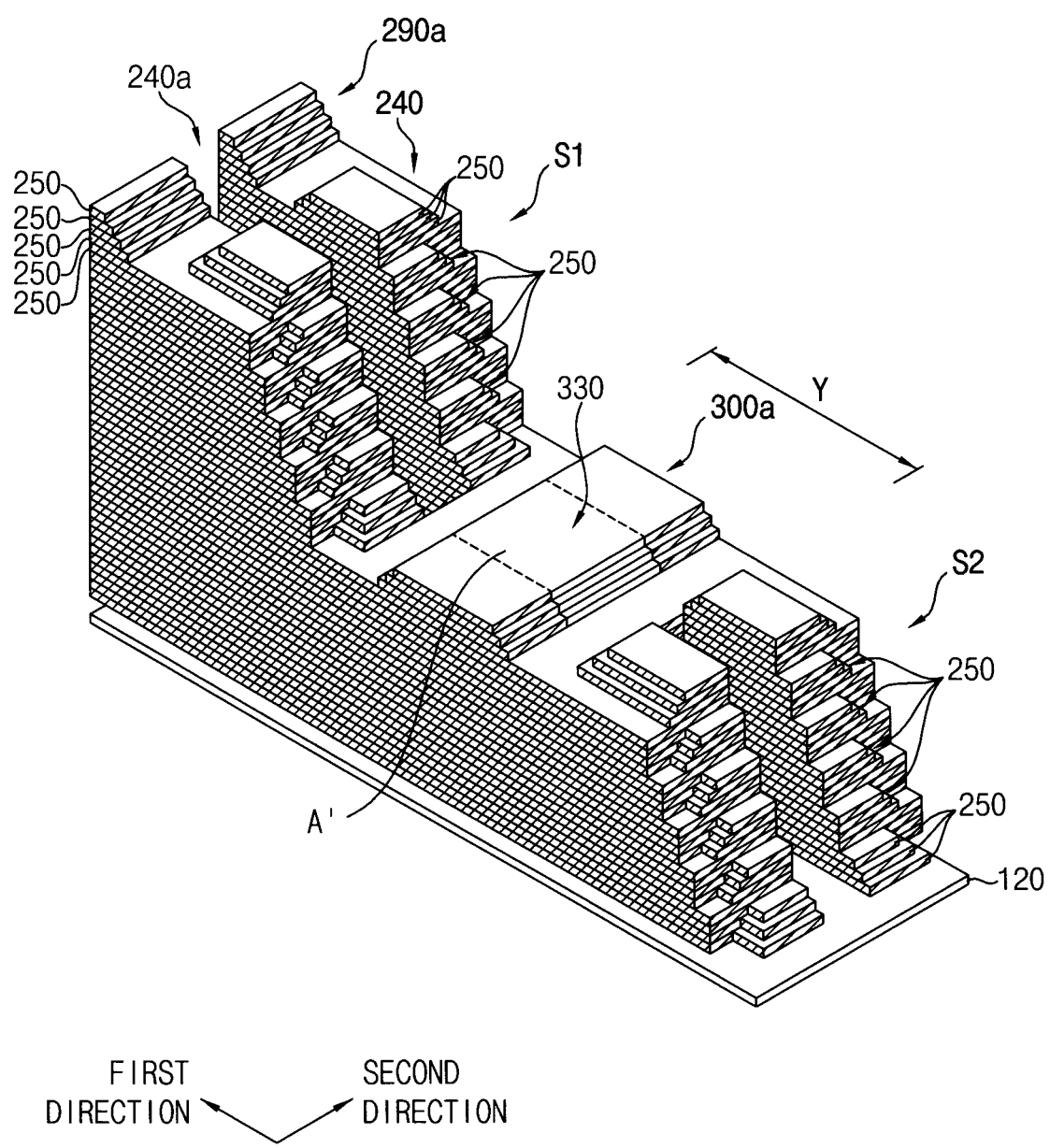

In example embodiments, the sacrificial layers positioned directly below the central portion A in the second direction of the flat surface portion Y of the mold structure 140 and the third sacrificial pattern on the flat surface portion Y may not be replaced with the gate pattern. As shown in FIG. 25, the trenches 240 may be formed at opposite ends in the second direction of the mold structure 140, and additional trenches 240a extending in the first direction may be further formed at a portion between steps in the first and second directions of the mold structure 140. However, the additional trench 240a may not be formed at the flat surface portion. In FIG. 25, the sacrificial layers positioned directly below the flat surface portion Y may be etched from the trenches 240 formed at both ends in the second direction of the mold structure 140, so that the sacrificial layer and the insulation layer may remain at the central portion A in the second direction of the flat surface portion Y of the mold structure 140. On the other hand, the sacrificial layers corresponding to step portions may be completely removed from the trench 240 at both ends in the second direction of the mold structure 140 and the additional trench 240a. Thus, the step portions may be replaced with the gate patterns 250, respectively, so that the step portions may serve as the pads. The portion not being replaced with the gate pattern may remain a structure including the sacrificial layers and the insulation layers alternately stacked, so that the portion may serve as the insulation structure 330.

Therefore, the remaining sacrificial layers and third sacrificial pattern positioned below the flat surface portion Y may serve as the insulation structure 330 (refer to FIG. 27). In example embodiments, the insulation structure 330 below the flat surface portion Y may serve as a portion for forming a through via contact being electrically connected to the peripheral circuits. The insulation structure 330 may include insulating layers stacked vertically without gate patterns therebetween (e.g., a stack of alternating sacrificial layers and insulation layers).

In the first dummy staircase structure 300a, the portion being replaced with the gate pattern 250 may not be electrically connected to the cell gate pattern, and thus the portion may not serve as the pad. Thus, the portion may serve as a dummy pad.

In some example embodiments, all of the sacrificial layers included in the mold structure 140 of the first and second regions I and II may be replaced with the gate patterns 250, respectively. In this case, the insulation structure may not be formed below the flat surface portion Y, and thus a through via contact electrically connected to the peripheral circuits may not be formed at the flat surface portion.

Although not illustrated, impurities may be implanted at an upper portion of the base pattern 100 exposed by the trench 240 to form an impurity region. A spacer may be formed to cover sidewalls of the trench 240. A common source line may be formed on the impurity region, and may fill the trench 240.

Figure 26:
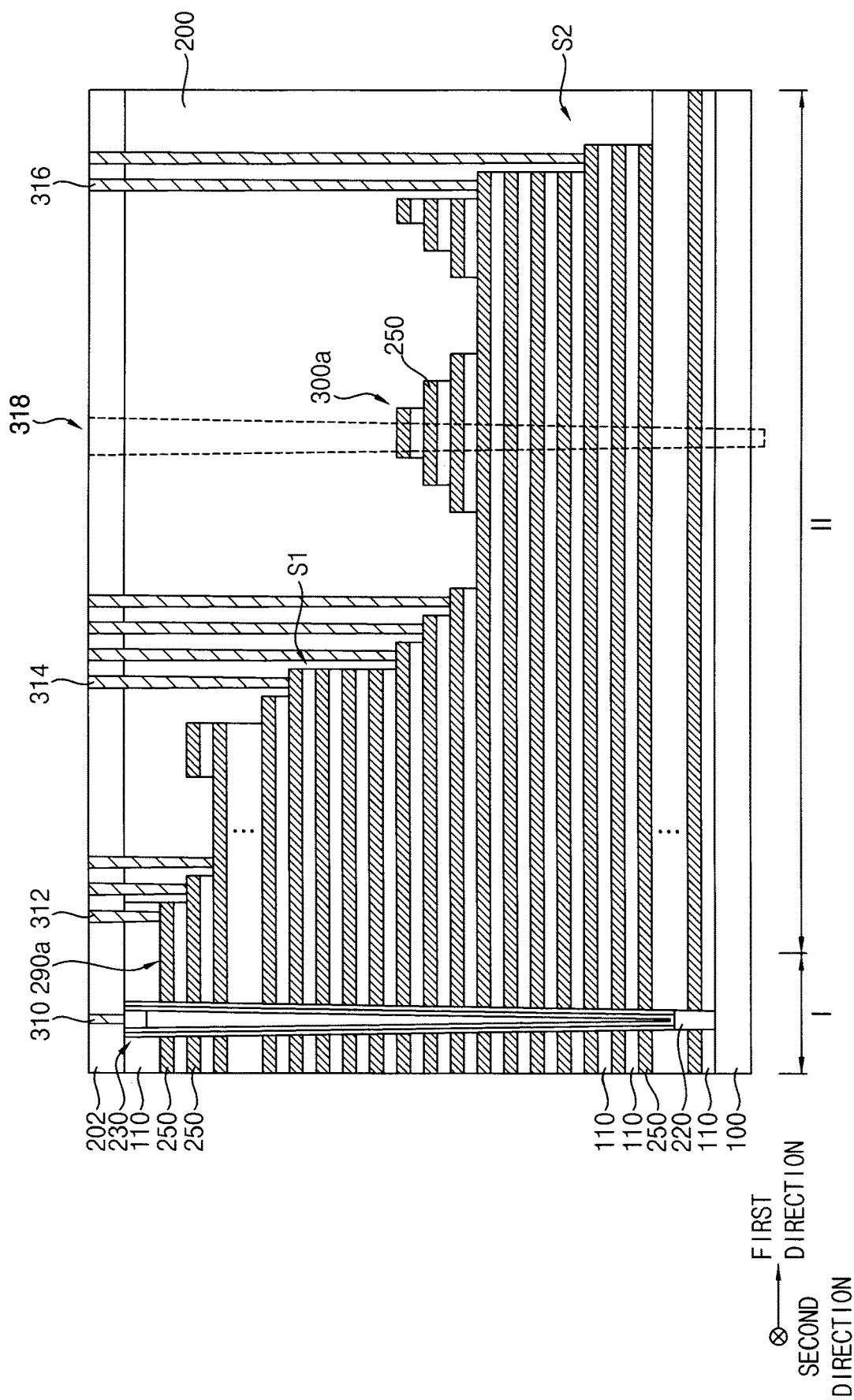
Figure 27:
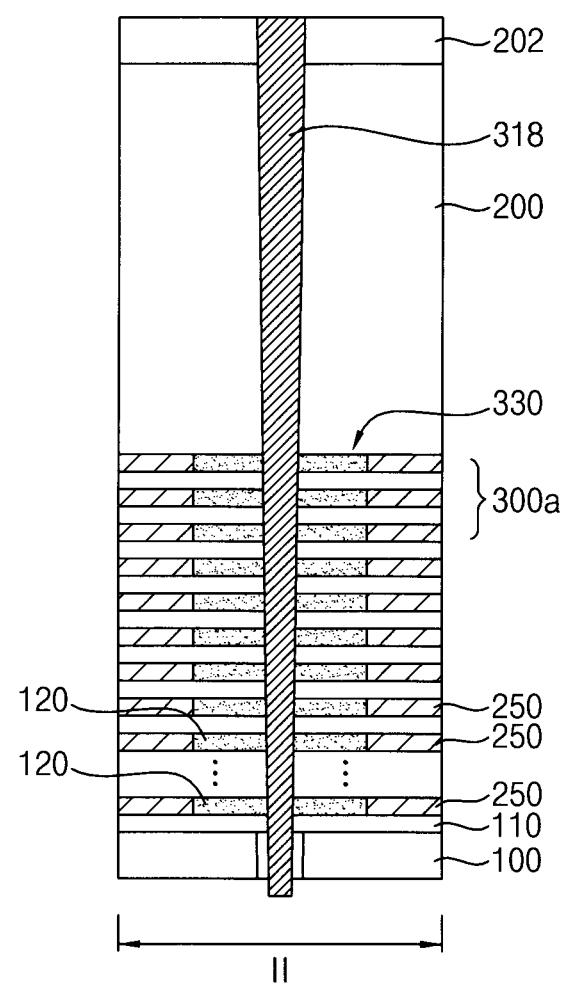

Referring to FIGS. 26 and 27, a first contact plug 310 may be formed on an upper surface of the upper conductive pattern to pass through the second insulating interlayer 202.

Second to fourth contact plugs 312, 314 and 316 may be formed on upper surfaces of steps in the first and second staircase structures S1 and S2 to pass through the first and second insulating interlayers 200 and 202.

Each second contact plug 312 may contact an upper surface of the gate pattern 250 in the upper staircase structure, and each third contact plug 314 may contact an upper surface of the gate pattern in the first staircase structure S1. Each fourth contact plug 316 may contact an upper surface of the gate pattern 250 in the second staircase structure S2.

The through via contact 318 may be formed through the first and second insulating interlayers 200 and 202, the insulation structure, the insulation pattern and the second lower insulating interlayer 730, and the through via contact 318 may contact an upper surface of the third lower wiring 720.

FIG. 27 is a cross-sectional view of the first dummy staircase structure cut in the second direction.

As shown in FIG. 27, in example embodiments, the through via contact 318 may pass through the insulation structure 330 below the flat surface portion Y. Thus, the through via contact 318 may be electrically insulated from the gate patterns 250. As described above, the insulation structure 330 may be the portion of the mold structure that is not replaced by the gate pattern 250. Therefore, the insulation structure 330 may include the sacrificial layers and insulation layers alternately stacked. The gate patterns 250 including a conductive material may not be disposed below part or all of the flat surface portion Y (e.g., at least in a region immediately surrounding the through via contact 318).

Figure 28:
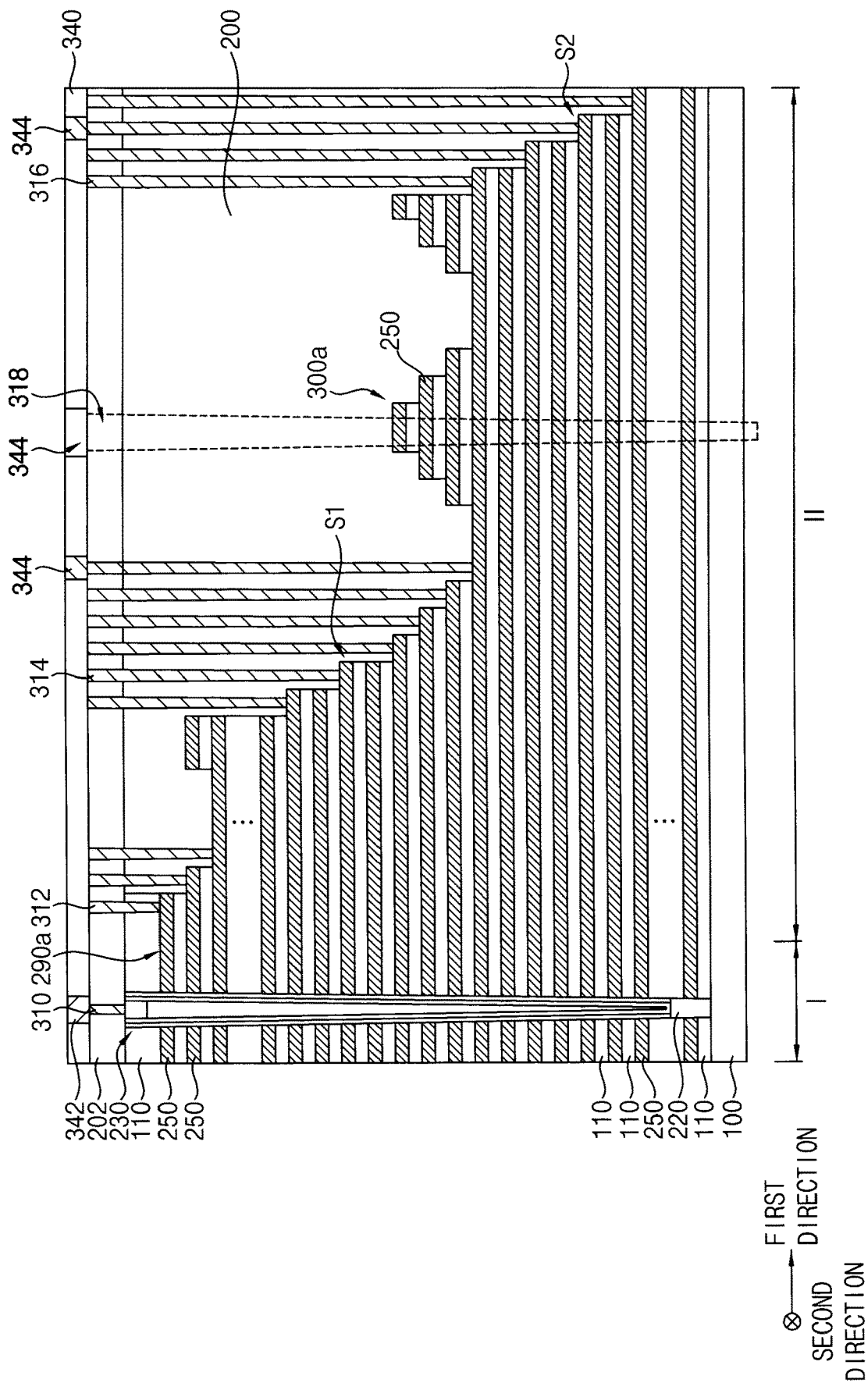
Figure 29:
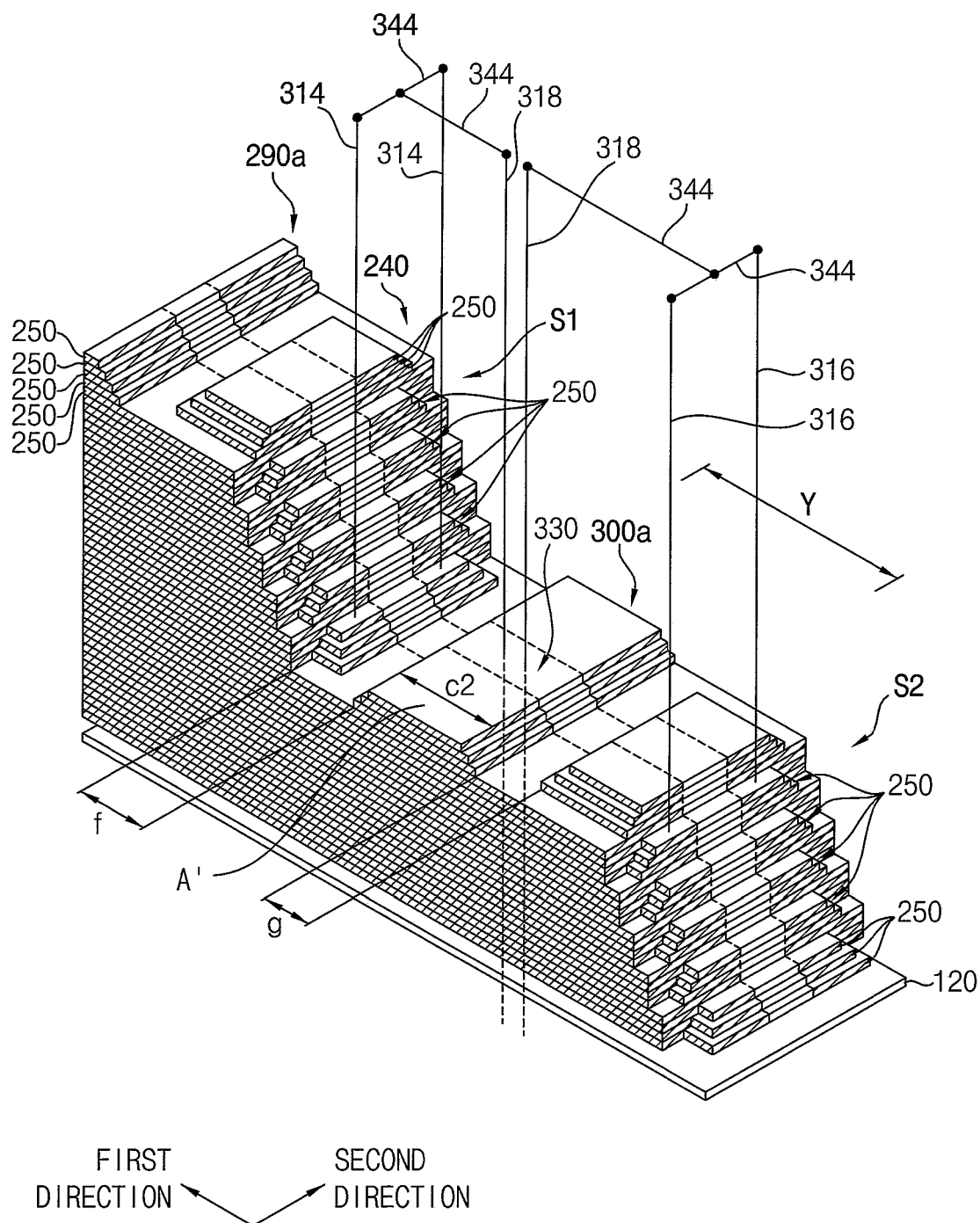

Referring to FIGS. 28 and 29, a third insulating interlayer 340 may be formed on the second insulating interlayer 202, the first to fourth contact plugs 310, 312, 314, and 316 and the through via contact 318. A bit line 342 may be formed through the third insulating interlayer 340, and the bit line 342 may contact an upper surface of the first contact plug 310. In example embodiments, the bit line 342 may extend in the second direction, and a plurality of bit lines 342 may be arranged in the first direction.

Upper wirings 344 may be formed on the second to fourth contact plugs 312, 314 and 316 and the through via contact 318, respectively. The upper wirings 344 may be electrically connected to the second to fourth contact plugs 312, 314 and 316 and the through via contact 318, respectively. The upper wirings 344 may be formed at the same level as that of the bit line 342. Alternately, the upper wirings 344 may not be formed at the same level as that of the bit line 342.

In order to avoid the complexity of the drawings, in FIG. 29, portions of the third and fourth contact plugs, the upper wiring and the through via contact are briefly illustrated as lines, respectively.

For example, as shown in FIG. 29, the third contact plugs 314 contacting ones of the gate patterns 250 at the same level may be electrically connected to the upper wiring 344. Also, the upper wiring 344 may extend to a portion above the insulation structure 330. The upper wiring 344 and the through via contact 318 may be electrically connected to each other. The through via contact 318 may pass through the insulation structure 330, and may extend to the third lower wiring 720 (refer to FIG. 2). The through via contact 318 may be electrically connected to the third lower wiring 720. Therefore, the gate patterns 250 being connected to the third contact plug 314 may be electrically connected to the peripheral circuits.

Further, the fourth contact plugs 316 contacting ones of the gate patterns 250 at the same level may be electrically connected to the upper wiring 344. Also, the upper wiring 344 may extend to a portion above the insulation structure 330. The upper wiring 344 and the through via contact 318 may be electrically connected to each other. The upper wiring 344 and the through via contact 318 may be electrically connected to each other. The through via contact 318 may pass through the insulation structure 330, and may extend to the third lower wiring 720 (refer to FIG. 2). The through via contact 318 may be electrically connected to the third lower wiring 720. Therefore, the gate patterns 250 being connected to the fourth contact plug 316 may be electrically connected to the peripheral circuits.

The vertical memory device may be manufactured by the above-described processes.

On the other hand, the vertical memory device may have following structural features. The structural features may be mostly described in the processes for manufacturing the vertical memory device. Therefore, hereinafter, repeated description may be omitted and only important parts may be described with reference to the drawings.

Referring to FIGS. 26 to 29, the vertical memory device may include the stacked structure in which the insulation layers 110 and the gate patterns 250 are repeatedly stacked in the vertical direction. The stacked structure may extend in the first direction from the first region I to the second region II of the substrate 600.

The channel structure 230 may be formed through the stacked structure on the first region I of the substrate 600.

The stacked structure on the second region II of the substrate 600 may serve as the pad structure. That is, each of the gate patterns 250 stacked in the vertical direction may have a stepped shape at edges in the first direction of the stacked structure. Thus, the upper surfaces of the gate patterns 250 may be exposed at the edges in the first direction of the stack structure. The exposed upper surfaces of the gate patterns 250 may serve as the pads.

The pad structure may include the first upper staircase structure 290a, the first staircase structure S1, the second staircase structure S2 and the first dummy staircase structure 300a.

The first upper staircase structure 290a may be formed by replacing the first sacrificial pattern with the gate pattern, and first upper staircase structure 290a may be positioned at an uppermost portion of the pad structure. The first upper staircase structure 290a may have a plurality of steps in the first direction. For example, the first upper staircase structure 290a may include steps of four levels in the first direction.

The first staircase structure S1 may be formed by replacing the fifth sacrificial pattern 124a with the gate pattern, and most of the first staircase structure S1 may be formed below the first upper staircase structure 290a. The first staircase structure S1 may include a plurality of steps in each of the first direction and the second direction. For example, the first staircase structure S1 may include steps of five or six levels in the first direction and steps of four levels in the second direction. Steps included in the first staircase structure S1 may be symmetrical with respect to a line extending in the first direction. As can be seen from the drawings and this description, relative terms such as "above" and "below" as used herein have their ordinary broad meanings—for example element A can be above element B even if when looking down on the two elements there is no overlap between them (just as something in the sky is generally above something on the ground, even if it is not directly above).

The second staircase structure S2 may be formed by replacing the sixth sacrificial pattern 128a with the gate pattern, and most of the second staircase structure S2 may be formed below the first staircase structure S1. The second staircase structure S2 may be spaced apart from the first staircase structure S1 in the first direction. The second staircase structure S2 may include a plurality of steps in each of the first direction and the second direction. For example, the second staircase structure S2 may include steps of five levels in the first direction and steps of four levels in the second direction. Steps included in the second staircase structure S2 may be symmetrical with respect to respect to a line extending in the first direction.

In example embodiments, the second staircase structure may include the steps having a shape the same as a shape of the steps of the first staircase structure.

The steps included in each of the first and second staircase structures S1 and S2 may serve as the pad connected to the cell gate patterns formed in the first region. The contact plugs may contact upper surfaces of the steps, respectively.

The flat surface portion Y may be formed between the first and second staircase structures S1 and S2. The flat surface portion Y may extend in the first direction from a lower end of the first staircase structure S1.

In example embodiments, the through via contacts 318 may be formed at the flat surface portion Y, so that the flat surface portion Y may have a sufficient width for forming the through via contacts 318. In example embodiments, the flat surface portion Y may have a width in the first direction of about 15 μm to 40 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-2% deviation around 0.1 and a 0% to 2% deviation around 1, especially if such deviation maintains the same effect as the listed range.

The first dummy staircase structure 300a may be formed on the flat surface portion Y.

The first dummy staircase structure 300a may have a shape of a line extending in a direction parallel to the boundary of the first region I. For example, the first dummy staircase structure 300a may extend in the second direction.

The first dummy staircase structure 300a may be formed by replacing at least portions of the third sacrificial pattern 126 with the gate pattern 250. Therefore, the first dummy staircase structure 300a may have steps at both edges in the first direction of the first dummy staircase structure 300a. The first dummy staircase structure 300a may include steps in the first direction, but may not include steps in the second direction. The first dummy staircase structure 300a may have steps only in a direction perpendicular to the boundary of the first region. In addition, both sidewalls in the second direction of the first dummy staircase structure 300a may be perpendicular to the upper surface of the substrate. For example, the first dummy staircase structure 300a may extend to opposite outermost ends of the pad structure in the second direction. In example embodiments, the number of steps in the first direction of the first dummy staircase structure 300a may be equal to the number of steps in the first direction of a lowest portion in the first staircase structure S1. Also, the number of steps in the first direction of the first dummy staircase structure 300a may be equal to the number of steps in the first direction of an uppermost portion of the second staircase structure S2. Also, the first dummy staircase structure 300a may have the same height from bottom to top as the uppermost portion of the second staircase structure S2 and may have a bottommost and topmost surface that are coplanar with respective bottommost and topmost surfaces of the uppermost portion of the second staircase structure S2.

Therefore, a height (e.g., from top to bottom) of the first dummy staircase structure 300a may be lower than a height of the first staircase structure S1 (e.g., from top to bottom). A height of an upper surface of the first dummy staircase structure 300a may be substantially the same as a height of an upper surface of the lowermost step disposed in contact with a vertical sidewall of the lowermost portion of the first staircase structure S1. Also, the height of the uppermost surface of the first dummy staircase structure 300a may be substantially the same as a height of an upper surface of an uppermost step disposed in contact with the vertical sidewall of the uppermost portion of the second staircase structure S2.

In example embodiments, the steps in the first direction of the lowermost portion of the first staircase structure S1 and the steps of the dummy staircase structure opposite thereto may be symmetrical to each other. In addition, the steps in the first direction of the uppermost portion of the second staircase structure S2 and the steps of the dummy staircase structure opposite thereto may be symmetrical to each other. In some embodiments, the dummy staircase structure does not include any layers that are used for electrical connections with any through via contacts 318 passing therethrough, and/or is not electrically connected to any lines, such as word lines, that are used for electrical communications within the vertical memory device.

In example embodiments, referring to FIGS. 17 and 29, in the first direction, each of a width (f) between the first dummy staircase structure 300a and a lower end of the first staircase structure S1, width (c1) of each of steps of the first dummy staircase structure 300a, a width (c2) of the upper surface of first dummy staircase structure 300a and a width (g) between the first dummy staircase structure 300a and an upper end of the second staircase structure S3 may be in a range of 0.1 μm to 10 μm. For example, each of the width (f) between the first dummy staircase structure 300a and the lower end of the first staircase structure S1, the width (c1) of each of steps of the first dummy staircase structure 300a, the width (c2) of the upper surface of first dummy staircase structure 300a and the width (g) between the first dummy staircase structure 300a and the upper end of the second staircase structure S3 may be in range of 0.1 μm to 8 μm.

In example embodiments, the first dummy staircase structure 300a may include the portion that is not replaced with the gate pattern. For example, a portion of the sacrificial layers positioned below the flat surface portion Y and a portion of the third sacrificial pattern on the flat surface portion Y may not be replaced with the gate pattern. Thus, the portion of the sacrificial layers below the flat surface and the portion of third sacrificial pattern may serve as the insulation structure 330.

In example embodiments, the through via contact 318 may be formed through the insulation structure 330, and the through via contact 318 may be electrically connected to the peripheral circuits. Contact plugs 312, 314, and 316 may extend in the vertical direction, and the contact plugs 312, 314, and 316 may contact upper surfaces of the pads included in the first and second staircase structures S1 and S2, respectively.

In some example embodiments, each of the first staircase structure S1, the second staircase structure S2 and the first dummy staircase structure 300a may include a portion that is not replaced by the gate pattern. For example, each of the first staircase structure S1 and the second staircase structure S2 may not be replaced with the gate pattern, except to step portions at both sides in the second direction of the first and second staircase structures S1 and S2. Thus, the insulation structure 330 may extend in the first direction along the central portion A' in the second direction of the first and second staircase structures S1 and S2.

In example embodiments, the through via contact 318 may be formed through the insulation structure 330, and may be electrically connected to the peripheral circuits.

In some example embodiments, all of the sacrificial layers and the sacrificial patterns in the mold structure may be replaced with the gate patterns. Therefore, all of the sacrificial layers and the sacrificial patterns of the first staircase structure S1, the second staircase structure S2 and the first dummy staircase structure 300a may be replaced with the gate patterns.

Certain portions of each staircase structure may be referred to using different terminology to indicate which portions are being discussed. For example, the term "plateau" used in relation to a surface may be used to refer to a topmost surface of a structure that protrudes from a lower surface (e.g., the topmost surface of the dummy staircase structure 300a, the topmost surface of the second staircase structure S2, or a topmost surface of the first staircase structure S1). The term "floor" may be used to refer to a flat plain below a plateau. Further, certain structures may be referred to as having a mesa structure. A bottommost layer of a mesa structure may refer to a layer most adjacent to but above a floor.

The vertical memory device may include the first dummy staircase structure on the flat surface portion of the pad structure, so that the width of the flat surface portion may be accurately measured by the first dummy staircase structure. Thus, the width of the pad structure may be accurately measured, and failures of the vertical memory device may be reduced.

Figure 30:
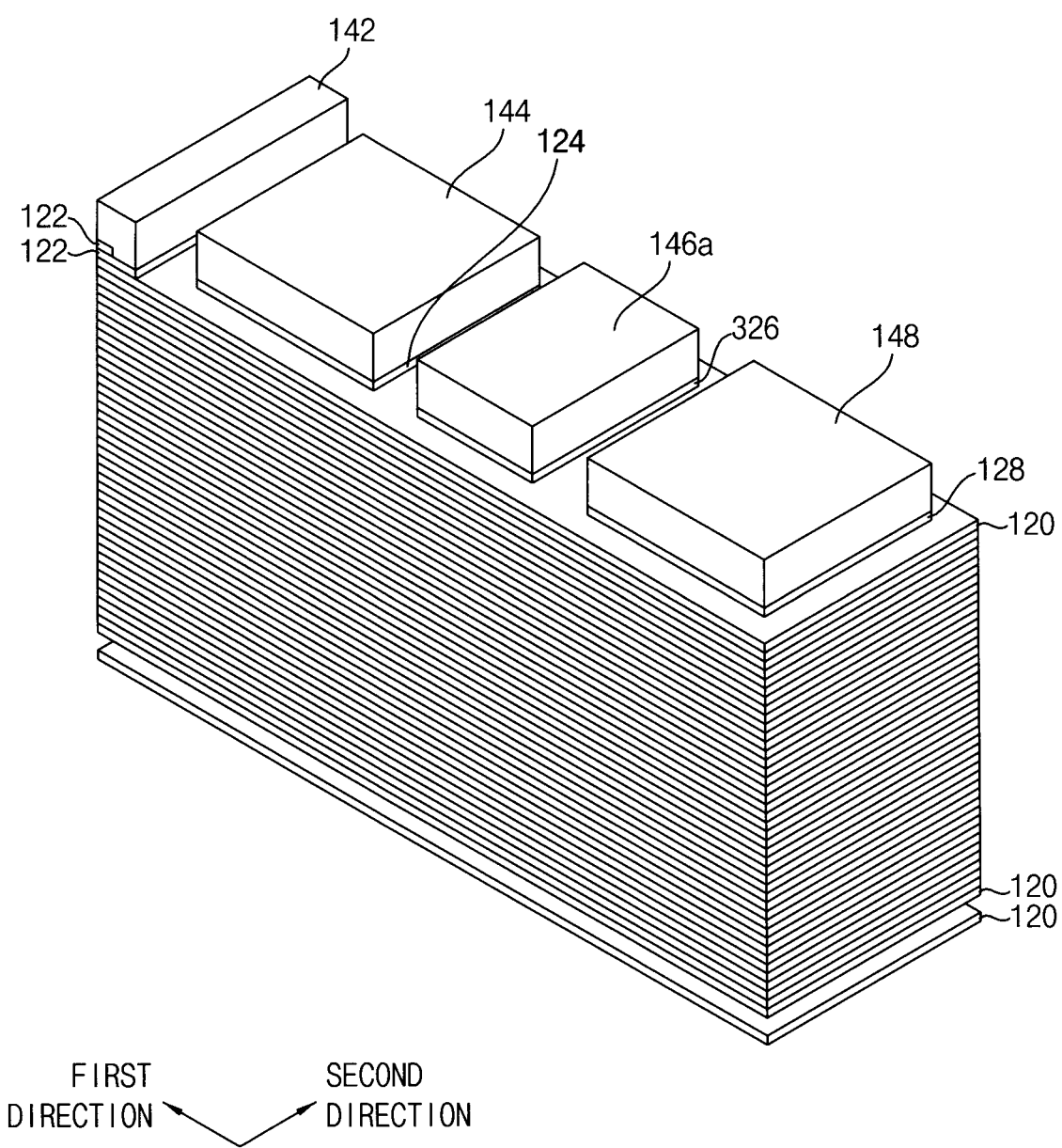
FIGS. 30 to 37 are a cross-sectional view, plan views, and perspective views illustrating a method of manufacturing a vertical memory device in accordance with example embodiments.
Figure 31:
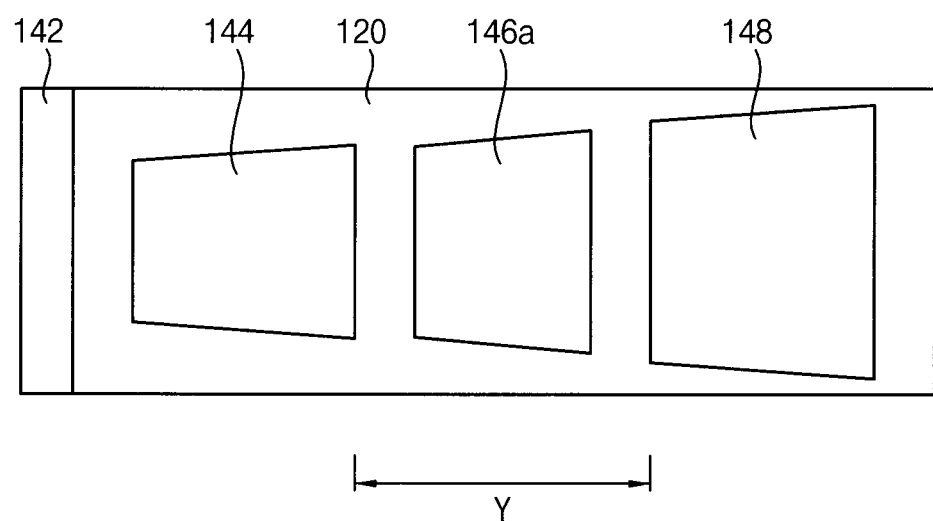
Figure 34:
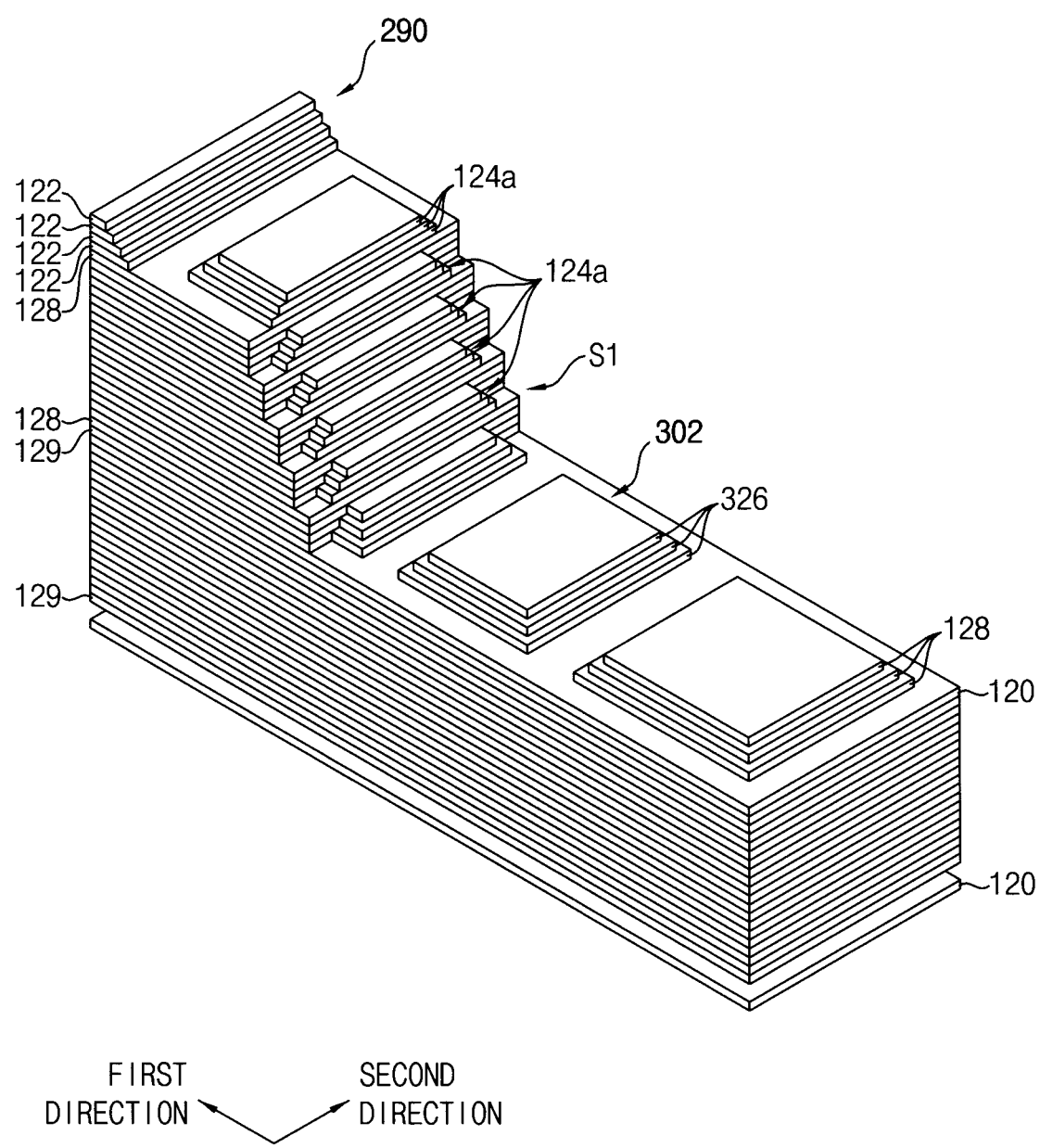
Figure 35:
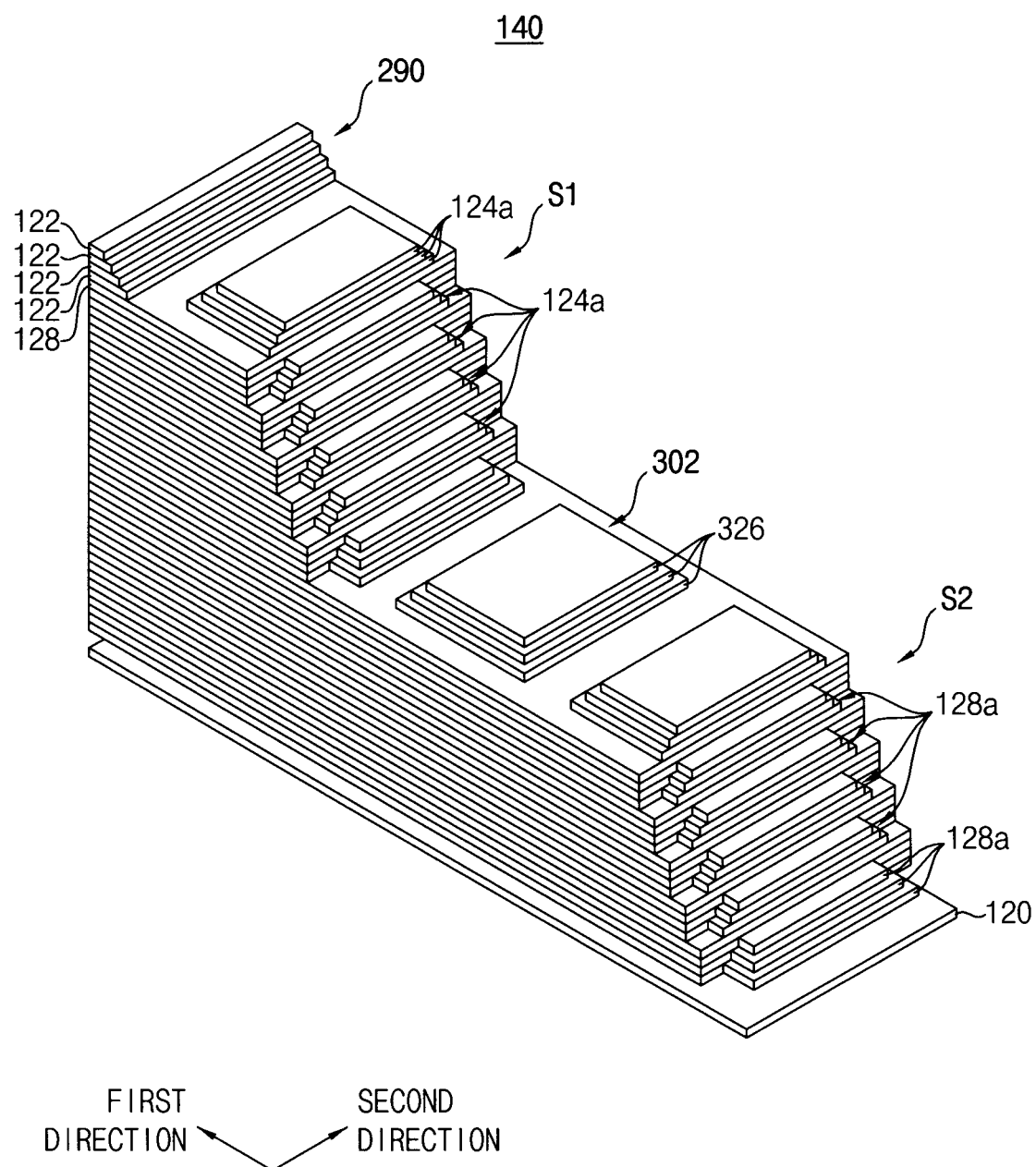
Figure 36:
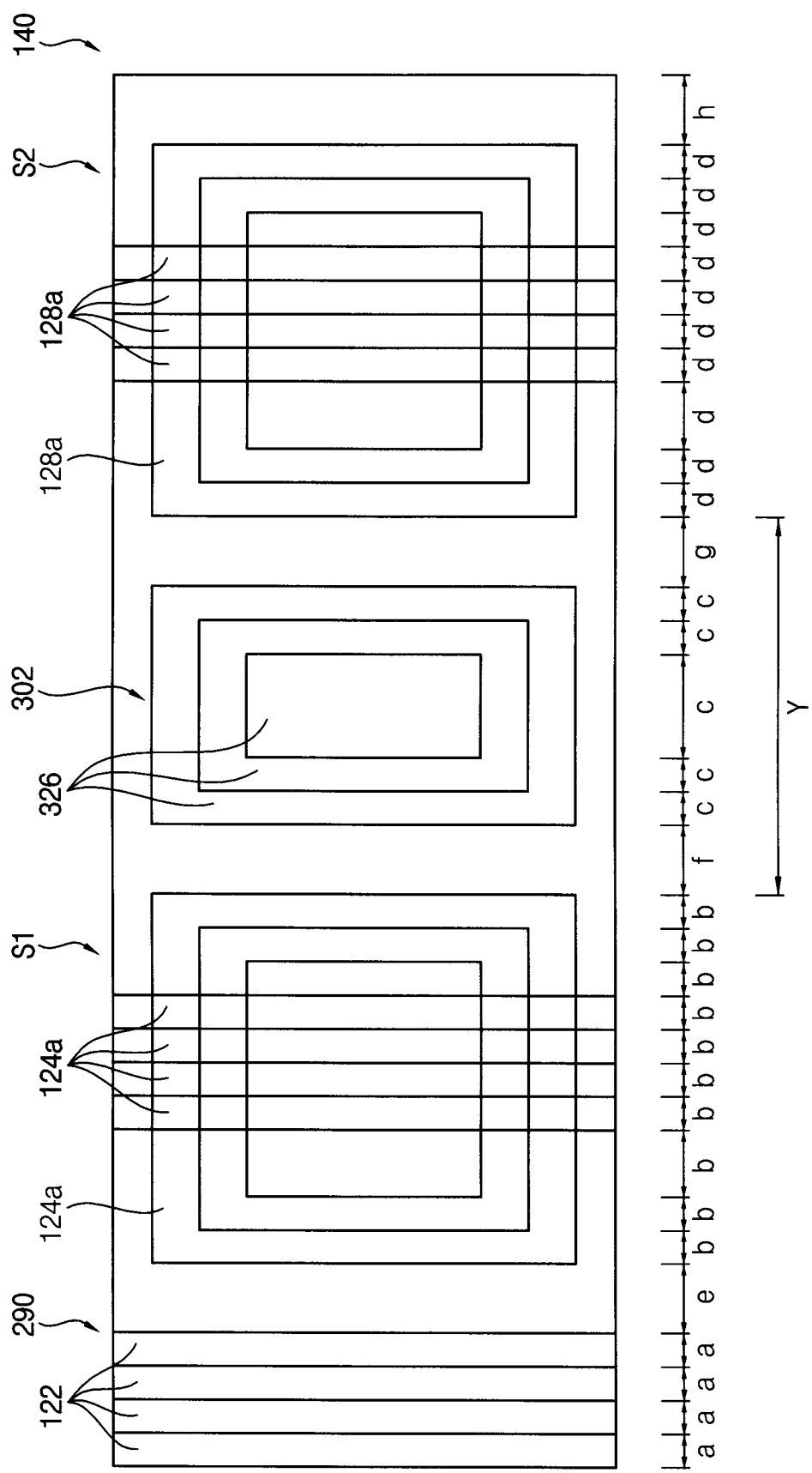
Figure 37:
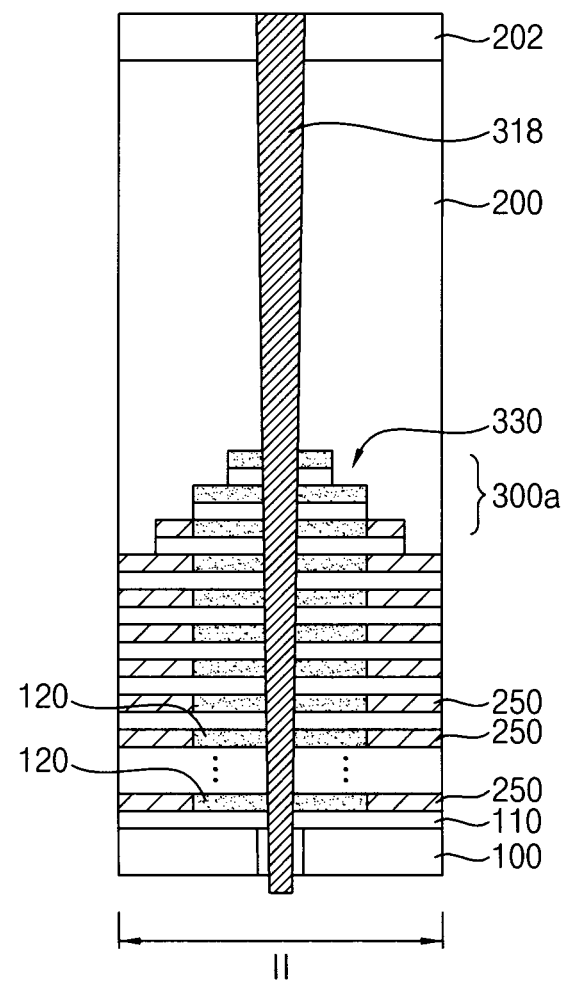

FIGS. 30 to 37 are a cross-sectional view, plan views and perspective views illustrating a method of manufacturing a vertical memory device in accordance with example embodiments. Particularly, FIGS. 30, 32 to 35 are the perspective views, FIGS. 31 and 36 are the plan views, and FIG. 37 is the cross-sectional view.

FIGS. 31 and 36 are the plan views of region X of FIG. 1, and FIGS. 30 and 32 to 35 are the perspective views of region X of FIG. 1. FIG. 37 is the cross-sectional view taken along the line C-C' in FIG. 1.

The method of manufacturing the vertical memory device includes processes substantially the same as or similar to those described with reference to FIGS. 1 to 29. Thus, detail descriptions thereof will be omitted.

Referring to FIGS. 30 and 31, first, processes substantially the same as or similar to those illustrated with reference to FIGS. 1 to 4 are performed.

Thereafter, second to fifth photoresist patterns 142, 144, 146a and 148 may be formed on the first sacrificial pattern 122 and the exposed sacrificial layer 120 at the second level. The second photoresist pattern 142, the third photoresist pattern 144, and the fifth photoresist pattern 148 may be the same as those described with reference to FIG. 5, respectively.

The fourth photoresist pattern 146a may be formed on the flat surface portion between the third and fifth photoresist patterns 144 and 148, and the fourth photoresist pattern 146a may be spaced from each of the third and fifth photoresist patterns 144 and 148 in the first direction. The fourth photoresist pattern 146a may have a quadrangle shape in the plan view. The fourth photoresist pattern 146a may be positioned at a portion for forming the dummy staircase structure.

Although not shown in the perspective view, as shown in FIG. 31, the third to fifth photoresist patterns 144, 146a, and 148 may have a trapezoidal shape rather than a rectangular shape. However, in each perspective view, the third to fifth photoresist patterns 144, 146a and 148 are shown to have the same rectangular shape in order to avoid the complexity of the drawings.

The exposed sacrificial layer 120 may be etched using the second to fifth photoresist patterns 142, 144, 146a and 148 as an etching mask. For example, the sacrificial layer 120 at the second level may be etched by the etching process.

The first sacrificial pattern 122 may be further formed by the etching process, and thus the first sacrificial pattern 122 may include two layers. In addition, the second sacrificial pattern 124 may be spaced apart from the first sacrificial pattern 122 in the first direction, and may have a quadrangle shape in the plan view. The fourth sacrificial pattern 128 may be spaced apart from the second sacrificial pattern 124 in the first direction, and may have a quadrangle shape in the plan view. The third sacrificial pattern may be formed between the second and fourth sacrificial patterns 124 and 128, and the third sacrificial pattern may be spaced apart from each of the second and fourth sacrificial patterns 124 and 128 in the first direction. The third sacrificial pattern may have a quadrangle shape in the plan view.

Figure 32:
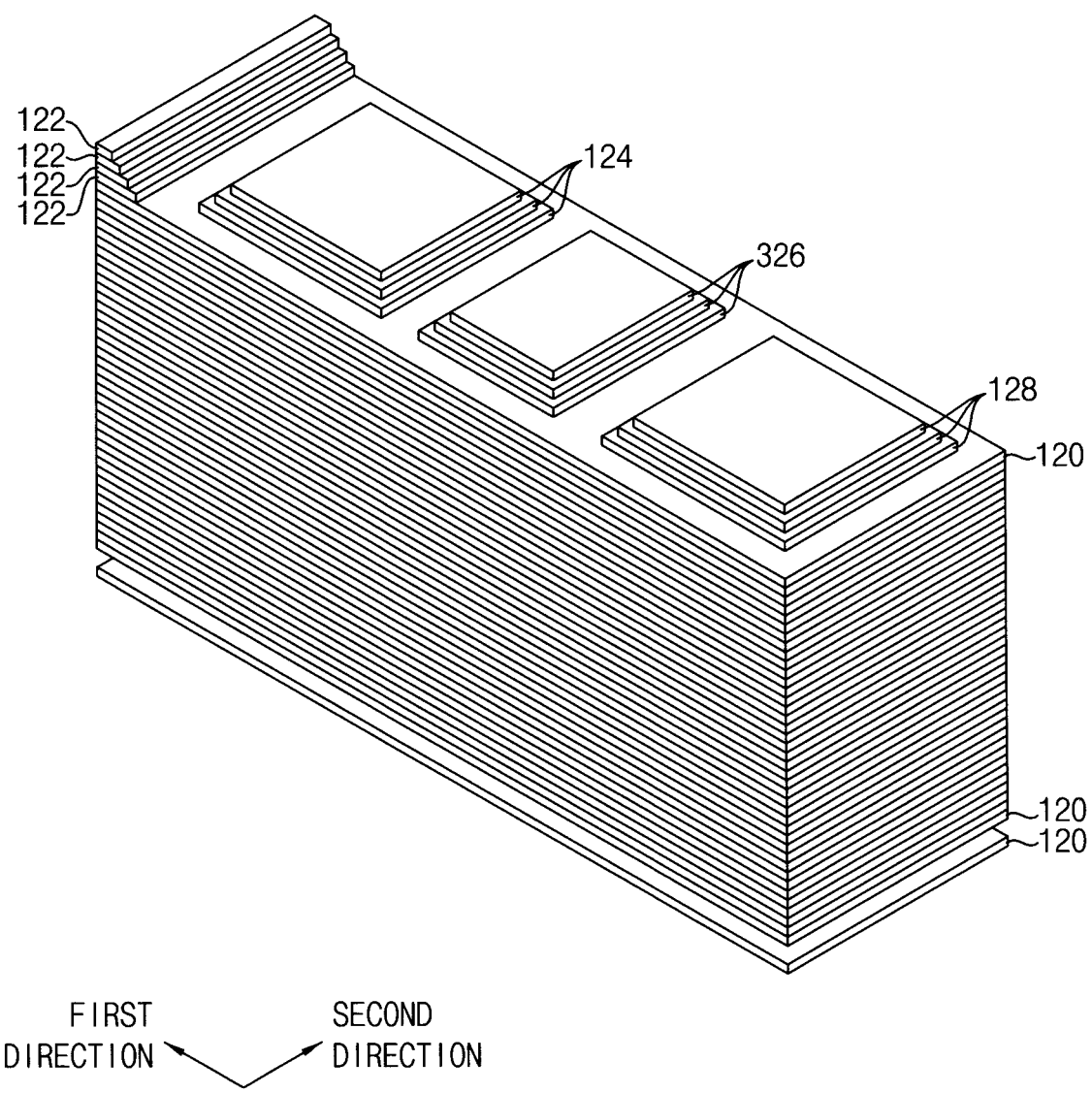

Referring to FIG. 32, the processes substantially the same as or similar to those illustrated with reference to FIGS. 8 and 9 may be performed to form the initial first to initial fourth sacrificial patterns 122, 124, 326, and 128 on the sacrificial layer at the fifth level. The initial first, initial second and initial fourth sacrificial patterns 122, 124, and 128 may be the same as those illustrated with reference to FIG. 9, respectively. In addition, the third initial sacrificial pattern 326 may have steps in each of the first and second directions.

Figure 33:
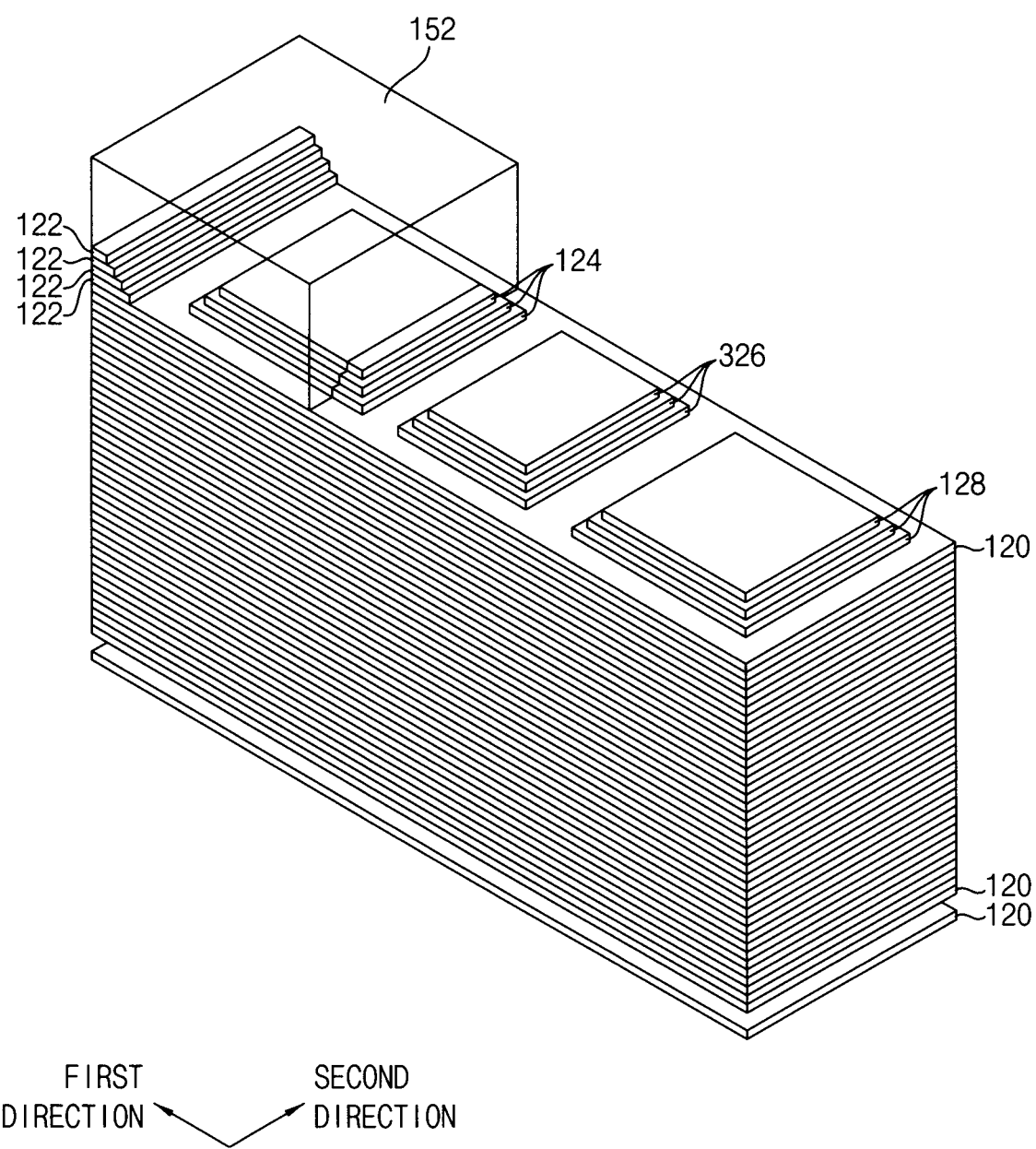

Referring to FIGS. 33 and 34, processes substantially the same as or similar to those illustrated with reference to FIGS. 10 to 12 may be performed.

In example embodiments, the etching process using the sixth photoresist pattern 152 may be preformed, and then the trimming process and the etching process may be repeatedly performed to form the first staircase structure S1 as shown in FIG. 34. The third sacrificial pattern 326 may be spaced apart from the first staircase structure S1 in the first direction. The third sacrificial pattern 326 may be formed between the first staircase structure S1 and the fourth sacrificial pattern 128. The stack structure of the third sacrificial patterns 326 may be referred to as a dummy staircase structure 302.

Referring to FIGS. 35 and 36, processes substantially the same as or similar to those illustrated with reference to FIGS. 13 to 17 may be performed.

In example embodiments, the etching process using the seventh photoresist pattern may be preformed, and then the trimming process and the etching process may be repeatedly performed to form a mold structure including the second staircase structure S2 as shown in FIG. 35.

As shown, the flat surface portion Y having relatively wide width may be disposed between the first staircase structure S1 and the second staircase structure S2. The dummy staircase structure 302 may be formed on the flat surface Y, and the dummy staircase structure 302 may be spaced apart from each of the first and second staircase structures S1 and S2.

After forming the mold structure 140, an accurate measurement of the width in the first direction of the mold structure 140 may be performed.

For example, as shown in FIG. 36, the widths (a to h) in the first direction of distinguishable patterns (e.g., steps and plateaus) in the mold structure 140 may be measured, respectively, and the measured widths in the first direction may be summed to determine a width in the first direction of the entire mold structure 140.

In order to measure the width of the flat surface portion Y, the width (e) between the dummy staircase structure 302 and the lower end of the first staircase structure S1, widths (c1) of the steps in the third sacrificial pattern 126, the width (c2) in the first direction the uppermost surface of the third sacrificial pattern 126 and the width (g) between the dummy staircase structure 302 and the upper end of the second staircase structure S2 may be measured, respectively.

Thereafter, the processes substantially the same as or similar to those illustrated with reference to FIGS. 18 to 29 may be performed to manufacture a vertical memory device. The vertical memory device may be substantially the same as the vertical memory device illustrated with reference to FIGS. 26 to 29, except for the shape of the dummy staircase structure.

For example, as illustrated in FIGS. 26 and 28, the sacrificial layers included in the mold structure 140 on the first and second regions I and II may be replaced with the gate patterns 250. Thus, the vertical memory device may include the upper staircase structure, the first and second staircase structures and a first dummy staircase structure 300a between the first and second staircase structures. The first dummy staircase structure 300a may have steps in each of the first and second directions.

Particularly, a cross-sectional view of the vertical memory device cut in the first direction may be substantially the same as FIG. 28. However, a cross-sectional view of the first dummy staircase structure cut in the second direction may be different from FIG. 27.

As shown in FIG. 37, the first dummy staircase structure 300a may have steps in the second direction.

The sacrificial layers positioned below the center portion A in the second direction of the flat surface portion Y of the mold structure 140 and the third sacrificial pattern on the flat surface portion Y may not be replaced with the gate patterns. Thus, the sacrificial layers and the third sacrificial pattern not being replaced with the gate patterns below the flat surface portion Y may serve as the insulation structure 330. In example embodiments, the through via contact 318 may be formed through the insulation structure 330 below the flat surface portion Y, and the through via contact 318 may be electrically connected to the peripheral circuits.

Figure 38:
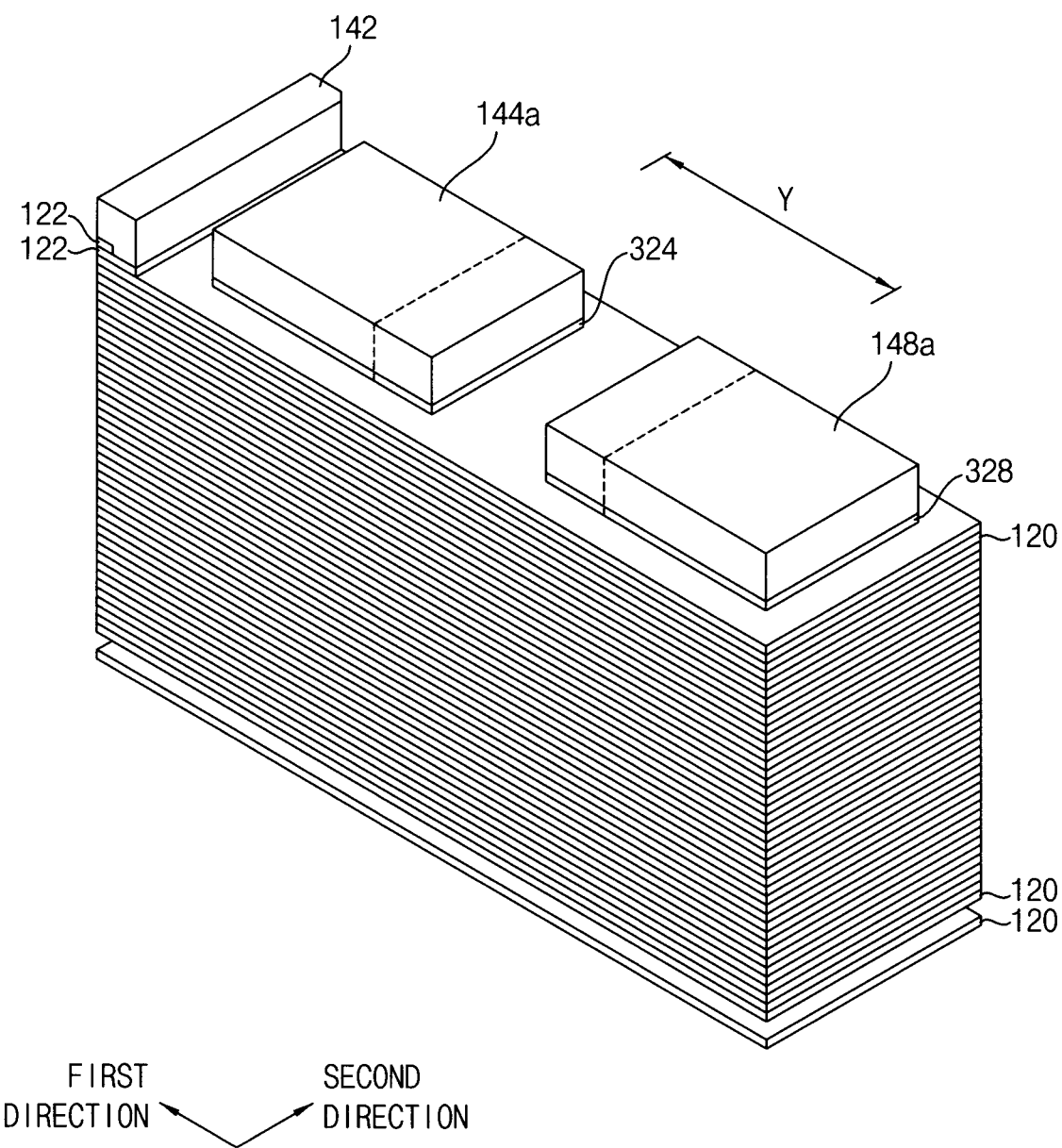
FIGS. 38 to 46 are plan views, cross-sectional views, and perspective views illustrating a method of manufacturing a vertical memory device in accordance with example embodiments.
Figure 39:
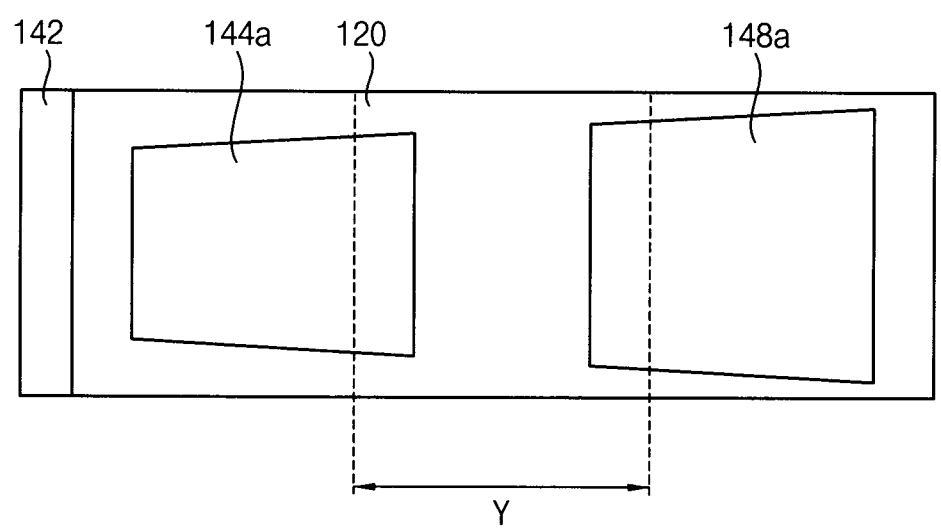
Figure 41:
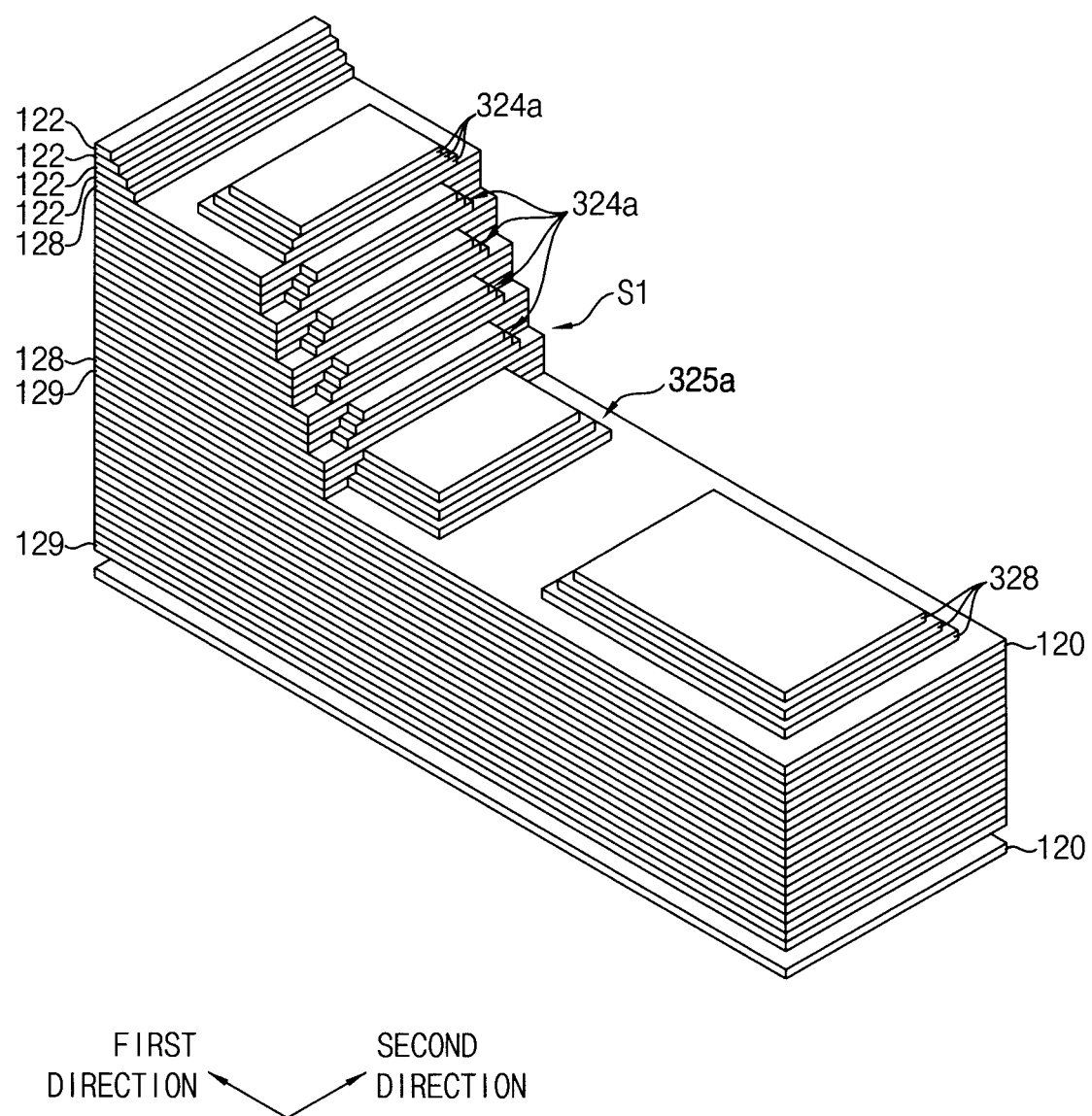
Figure 42:
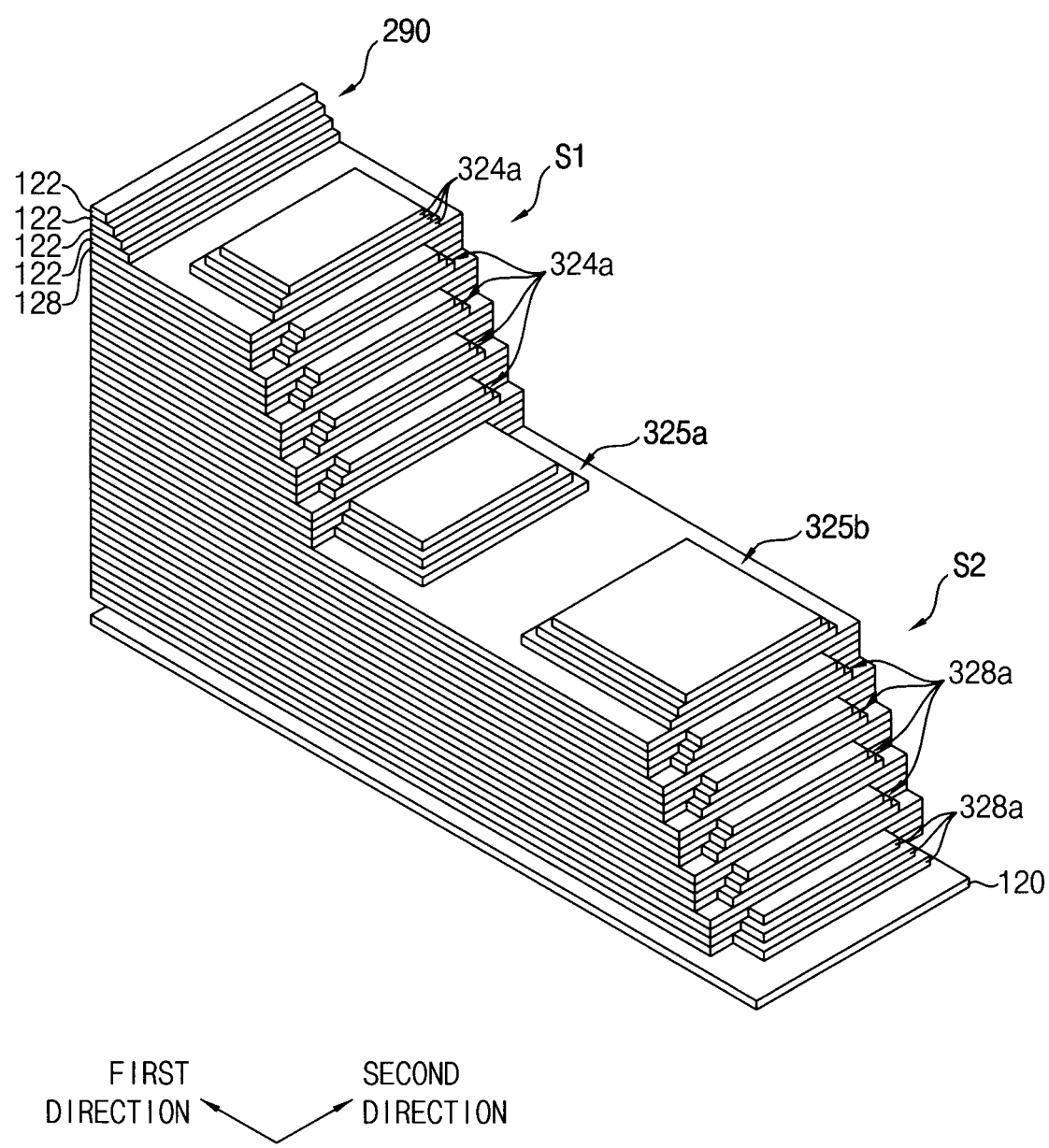
Figure 43:
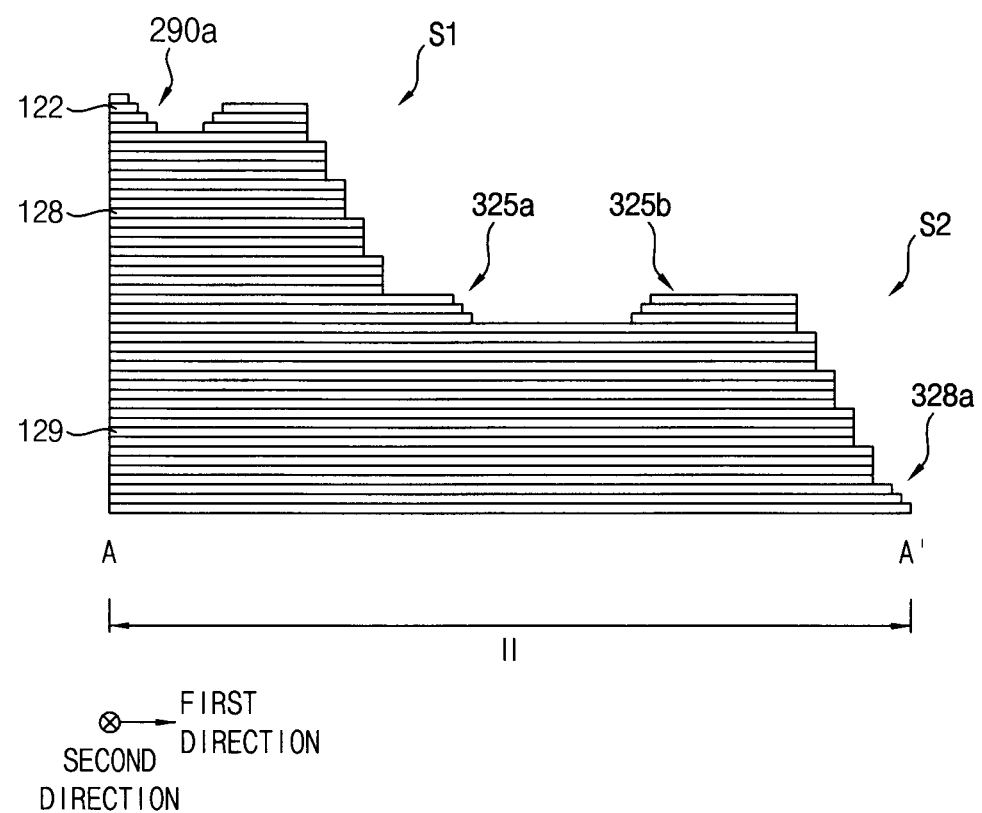
Figure 44:
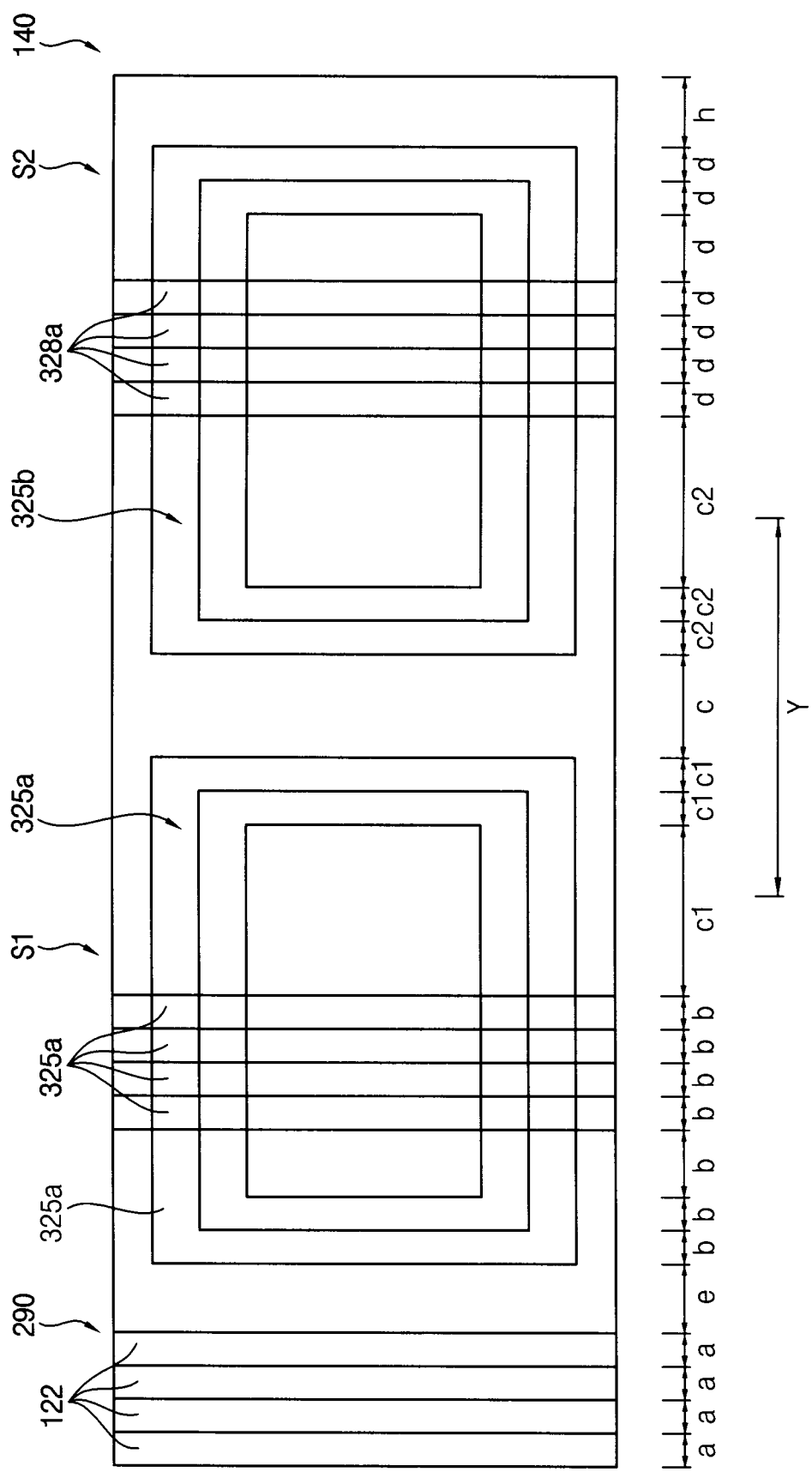
Figure 45:
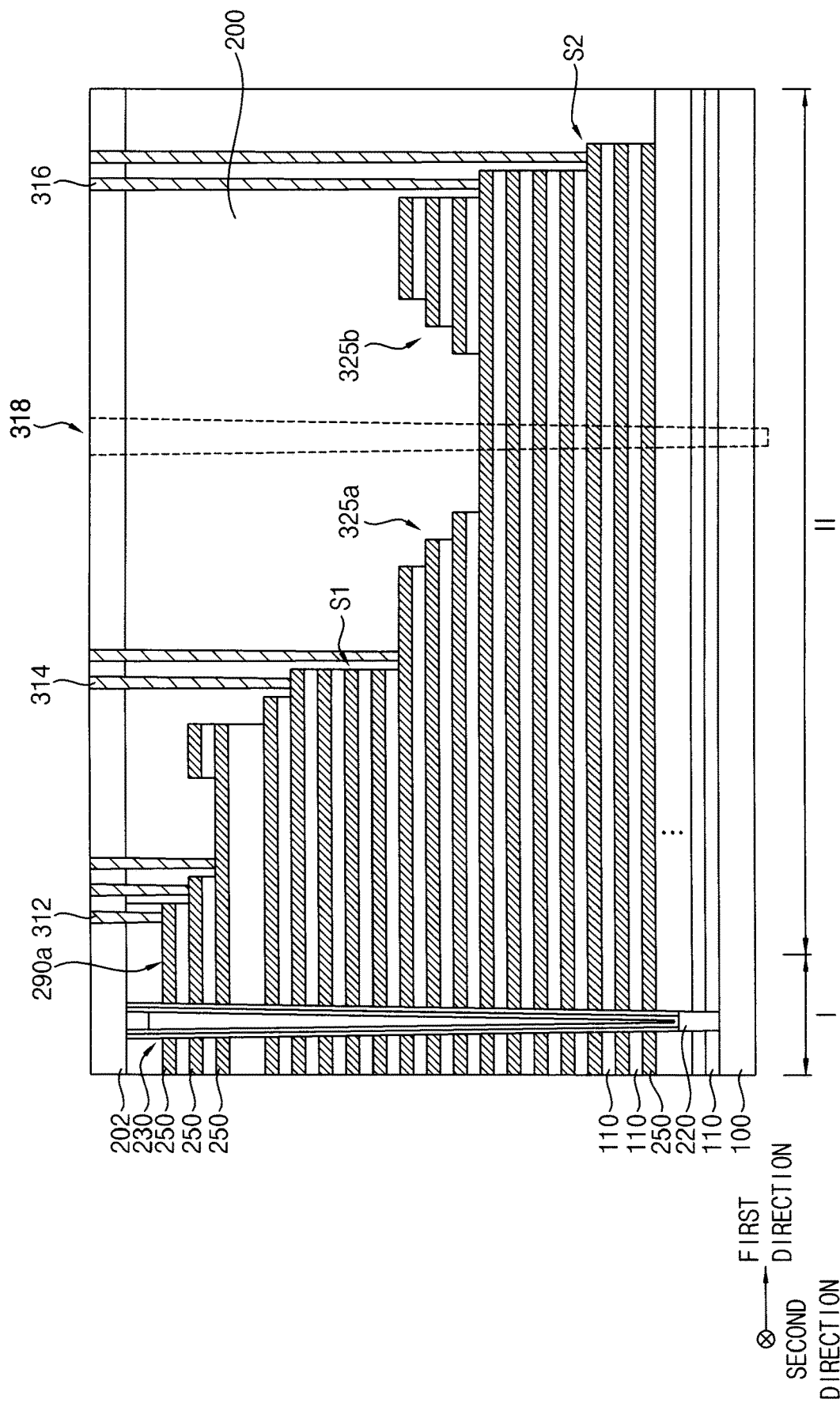
Figure 46:
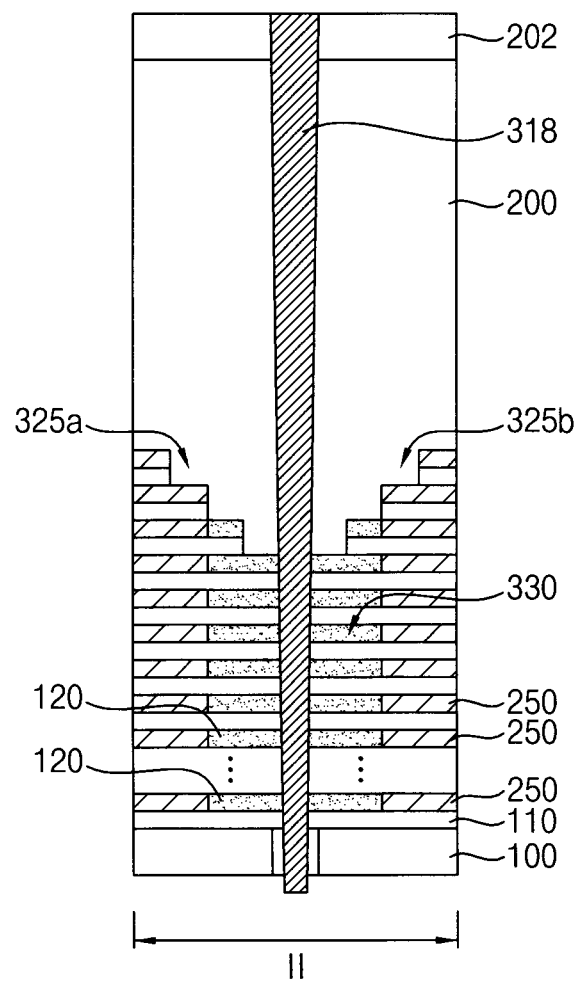

FIGS. 38 to 46 are plan views, cross-sectional views and perspective views illustrating a method of manufacturing a vertical memory device in accordance with example embodiments. Particularly, FIGS. 39 and 44 are plan views, FIGS. 43, 45, and 46 are cross-sectional views, and FIGS. 38, 40-42 and 44 are perspective views.

FIGS. 39 and 44 are plan views of the region X of FIG. 1, and FIGS. 38, 40-42, and 44 are perspective views of the region X of FIG. 1. FIG. 45 is a cross-sectional view taken along the line A-A' of FIG. 1, and FIG. 46 is a cross-sectional view taken along the line C-C' of FIG. 1. FIG. 43 is a cross-sectional view taken along the first direction in the region X of FIG. 1.

The method of manufacturing the vertical memory device may include processes substantially the same as or similar to those illustrated with reference to FIGS. 1 to 29, and thus detailed descriptions thereof may be omitted.

Referring to FIGS. 38 and 39, first, processes substantially the same as or similar to those illustrated with reference to FIGS. 1 to 4 may be performed.

Thereafter, second to fourth photoresist patterns 142, 144a and 148a may be formed on the first sacrificial pattern 122 and the exposed sacrificial layer 120 at the second level. The second photoresist pattern 142 may be the same as illustrated with reference to FIG. 5. As discussed previously, terms such as "second," "third" and "fourth," are used merely as naming convention unless the context indicates otherwise, and a name such as "first" to designate an item as used in the claims may refer to any such item in the specification and does not necessarily align with the items named "first" in the specification.

The third photoresist pattern 144a may be spaced apart from the second photoresist pattern 142 in the first direction. The third photoresist pattern 144a may have a quadrangle shape in the plan view. The third photoresist pattern 144a may cover a portion for forming the first staircase structure, and may partially cover a portion for forming the flat surface portion.

The fourth photoresist pattern 148a may be formed to be spaced apart from the third photoresist pattern 144a in the first direction. The fourth photoresist pattern 148a may have a quadrangle shape in the plan view. The fourth photoresist pattern 148a may cover a portion for forming the second staircase structure, and may partially cover a portion for forming the flat surface portion.

The third and fourth photoresist patterns 144a and 148a may extend to portions of the flat surface portions, respectively. Also, a portion between the third and fourth photoresist patterns 144a and 148a may be positioned on the flat surface portion.

Although not shown in a perspective view, as shown in FIG. 38, the third to fourth photoresist patterns 144a and 148a may have a trapezoidal shape rather than a completely rectangular shape.

The exposed sacrificial layer 120 may be etched using the second to fourth photoresist patterns 142, 144a and 148a as an etching mask. As such, the sacrificial layer 120 at the second level may be etched by the etching process.

Therefore, the first sacrificial pattern 122 may be further formed at the second level, and thus the first sacrificial pattern may include two layers. Also, the second sacrificial pattern 324 may be formed to be spaced apart from the first sacrificial pattern 122 in the first direction, and may have a quadrangle shape in the plan view. The third sacrificial pattern 328 may be formed to be spaced apart from the second sacrificial pattern 324 in the first direction, and may have a quadrangle shape in the plan view.

Figure 40:
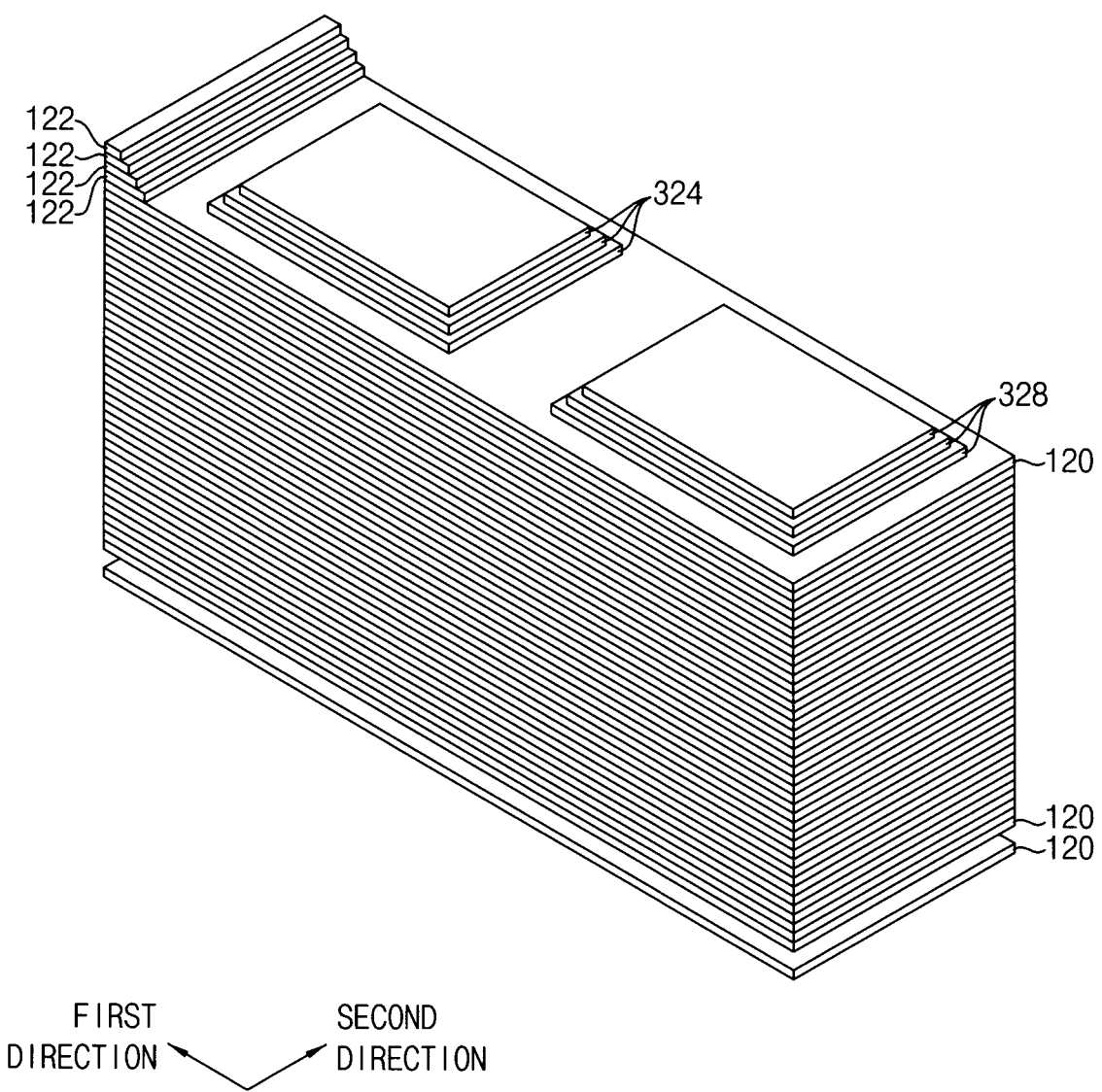

Referring to FIG. 40, the processes substantially the same as or similar to those illustrated with reference to FIGS. 8 and 9 may be performed. Thus, the initial first to third sacrificial patterns 122, 324, and 328 may be formed on the sacrificial layer at the fifth level.

Referring to FIG. 41, the processes substantially the same as or similar to those illustrated with reference to FIGS. 10 to 12 may be performed.

In example embodiments, the etching process using the sixth photoresist pattern 152 may be performed, and then the trimming process and the etching process may be repeatedly performed to form the first staircase structure S1 as shown in FIG. 41. The first staircase structure S1 may include fourth sacrificial patterns 324a stacked.

A portion of the first staircase structure S1 formed on the flat surface (e.g., floor) may be referred to as a lowermost pattern 325a. An upper surface of the lowermost pattern may contact a lowermost vertical sidewall portion of the first staircase structure S1. The upper surface of the lowermost pattern 325a may extend in the first direction. The first staircase structure S1 may extend to the flat surface portion. The third sacrificial pattern 328 may be formed to be spaced apart from the first staircase structure S1.

Referring to FIGS. 42 to 44, the processes substantially the same as or similar to those illustrated with reference to FIGS. 13 to 17 may be performed.

In example embodiments, the etching process using the seventh photoresist pattern may be preformed, and then the trimming process and etching process may be repeatedly performed to form the mold structure including the second staircase structure S2 as shown in FIG. 42. The second staircase structure S2 may include fifth sacrificial patterns 328a stacked.

A portion of the second staircase structure S2 formed on the flat surface is referred to as an uppermost pattern 325b, which may have a mesa shape having a plateau at the top. An upper surface of the uppermost pattern 325b (e.g., plateau) may contact an uppermost vertical sidewall portion of the second staircase structure S2. As described herein, a vertical sidewall that extends along the same plane to include at least two sacrificial layers (later replaced with gate patterns) is referred to as an extended vertical sidewall. A single sidewall of a step that includes only one sacrificial layer (later replaced with a gate pattern) may be referred to as a step sidewall. In addition, a top surface of a step may be referred to as a step top surface. The upper surface of the uppermost pattern 325b of the second staircase structure S2 may extend in the first direction. That is, the second staircase structure S2 may extend to the flat surface portion.

As shown, the lowermost pattern 325a of the first staircase structure S1 and the uppermost pattern 325b of the second staircase structure S2 may be disposed on the flat surface portion (e.g., floor), respectively. Therefore, the lowermost pattern 325a and the uppermost pattern 325b may be used as distinguishable patterns for accurately measuring the flat surface portion of the mold structure.

In example embodiments, in the first direction, a width of the upper surface of the lowermost pattern 325a of the first staircase structure S1 and the width of the upper surface of the uppermost pattern 325b of the second staircase structure S2 may be substantially the same as each other.

In some example embodiments, the width of the upper surface of the lowermost pattern 325a of the first staircase structure S1 and the upper surface width of the uppermost pattern 325b of the second staircase structure S2 may be different from each other.

As shown in FIG. 44, the widths a, b, c1, c2, d, e, and h in the first direction of the distinguishable patterns (e.g., steps) in the mold structure 140 may be measured, respectively, and the measured widths in the first direction may be summed to determine a width in the first direction of the entire mold structure 140.

For example, in order to measure the width of the flat surface portion, the widths c1 in the first direction of steps of the lowermost pattern of the first staircase structure S1 and the widths c2 in the first direction of steps of the uppermost pattern of the second staircase structure S2 and a width c in the first direction of a portion between the first and second staircase structures S1 and S2 may be measured, respectively.

Thereafter, the processes substantially the same as or similar to those illustrated with reference to FIGS. 18 to 29 may be performed to manufacture a vertical memory device.

As shown in FIGS. 45 and 46, the vertical memory device may include the first upper staircase structure 290a and the first and second staircase structures S1 and S2.

The vertical memory device may have no dummy staircase structure. However, the lowermost pattern 325a of the first staircase structure and the uppermost pattern 325b of the second staircase structure may be used as distinguishable patterns for measuring the flat surface portion of the mold structure in the same manner as the dummy staircase structure.

As shown in FIG. 46, the through via contacts 318 may be formed through the sacrificial layers not being replaced with the gate pattern 250, and the through via contacts 318 may be electrically connected to the peripheral circuits. The through via contacts 318 may therefore pass through a valley in the vertical memory device created by the gate patterns 250.

Figure 47:
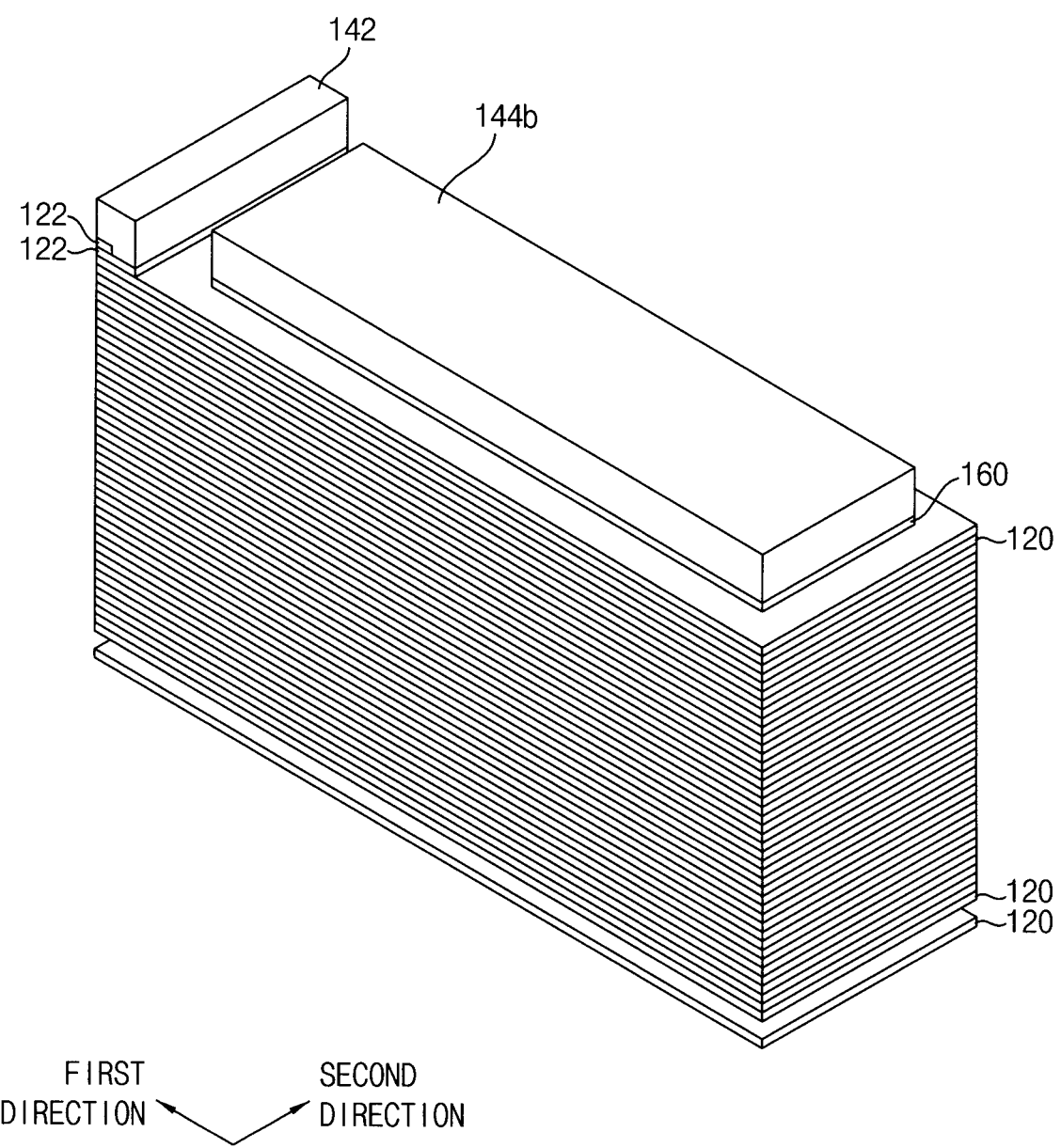
Figure 48:
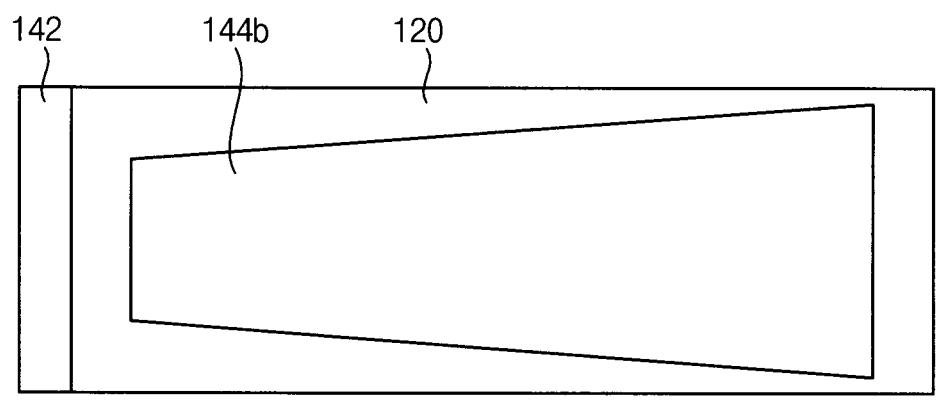

FIGS. 47 to 52 are a plan views and perspective views illustrating a method of manufacturing a vertical memory device in accordance with example embodiments. Particularly, FIG. 48 is a plan view, and FIGS. 47, 49 to 52 are perspective views.

FIG. 48 is a plan view of the region X of FIG. 1, and FIGS. 47 and 49 to 52 are perspective views of the region X of FIG. 1.

Since the method of manufacturing the vertical memory device includes processes substantially the same as or similar to those illustrated with reference to FIGS. 1 to 29, detailed descriptions thereof may be omitted.

Referring to FIGS. 47 and 48, first, processes substantially the same as or similar to those illustrated with reference to FIGS. 1 to 4 are performed.

Thereafter, second and third photoresist patterns 142 and 144b may be formed on the first sacrificial pattern 122 and the exposed sacrificial layer 120 at the second level, respectively. The second photoresist pattern 142 may be substantially the same as illustrated with reference to FIG. 5.

The third photoresist pattern 144b may be formed to be spaced apart from the second photoresist pattern 142 in the first direction. The third photoresist pattern 144b may have a quadrangle shape in the plan view. The third photoresist pattern 144b may cover portions for forming the first staircase structure, the flat surface portion and the second staircase structure.

Although not shown in the perspective view, as shown in FIG. 48, the third photoresist pattern 144b may have a trapezoidal shape rather than a rectangular shape.

The exposed sacrificial layer 120 may be etched using the second and third photoresist patterns 142 and 144b as an etching mask. Therefore, the sacrificial layer 120 at the second level may be etched by the etching process.

Therefore, the first sacrificial pattern 122 may be further formed, and thus the first sacrificial pattern may include two layers. In addition, a second sacrificial pattern 160 may be formed to be spaced apart from the first sacrificial pattern 122 in the first direction, and the second sacrificial pattern 160 may have a quadrangle shape in the plan view.

Figure 49:
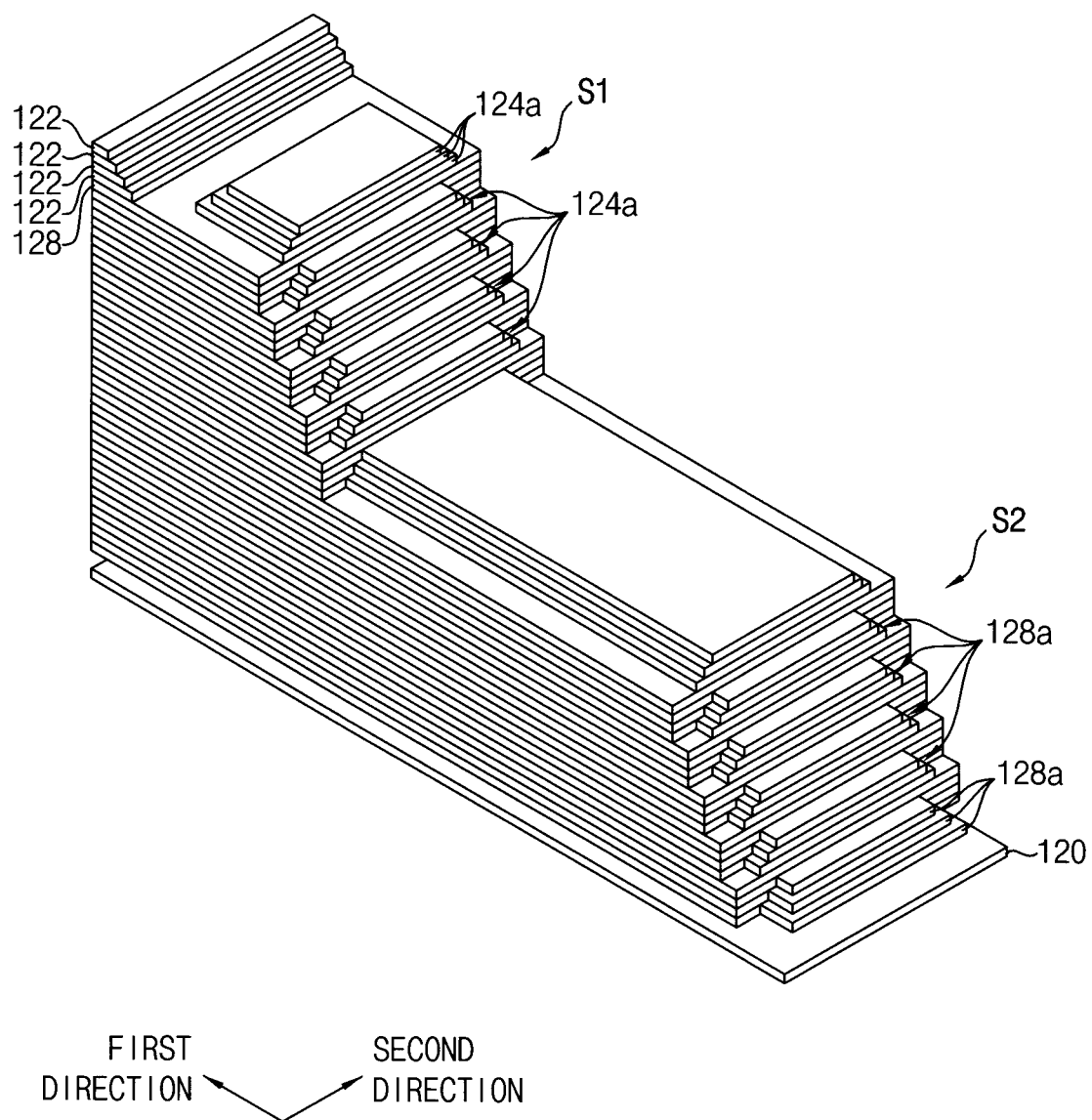

Referring to FIG. 49, first, processes substantially the same as or similar to those illustrated with reference to FIGS. 8 and 9 may be performed to form initial first and second sacrificial patterns on the sacrificial layer at the fifth level.

Thereafter, the processes substantially the same as or similar to those illustrated with reference to FIGS. 10 to 12 may be performed.

In example embodiments, the etching process using the sixth photoresist pattern 152 may be performed, and then the trimming process and the etching process may be repeatedly performed to form the first staircase structure as shown in FIG. 49.

Then, the processes substantially the same as or similar to those illustrated with reference to FIGS. 13 to 17 may be performed.

In example embodiments, the etching process using the seventh photoresist pattern may be performed, and then the trimming process and the etching process may be repeatedly performed to form the second staircase structure as shown in FIG. 49.

When the processes are performed, the flat surface portion may be formed from the first to second staircase structures S1 to S2. In this case, protruding patterns may not be formed on the flat surface portion.

Figure 50:
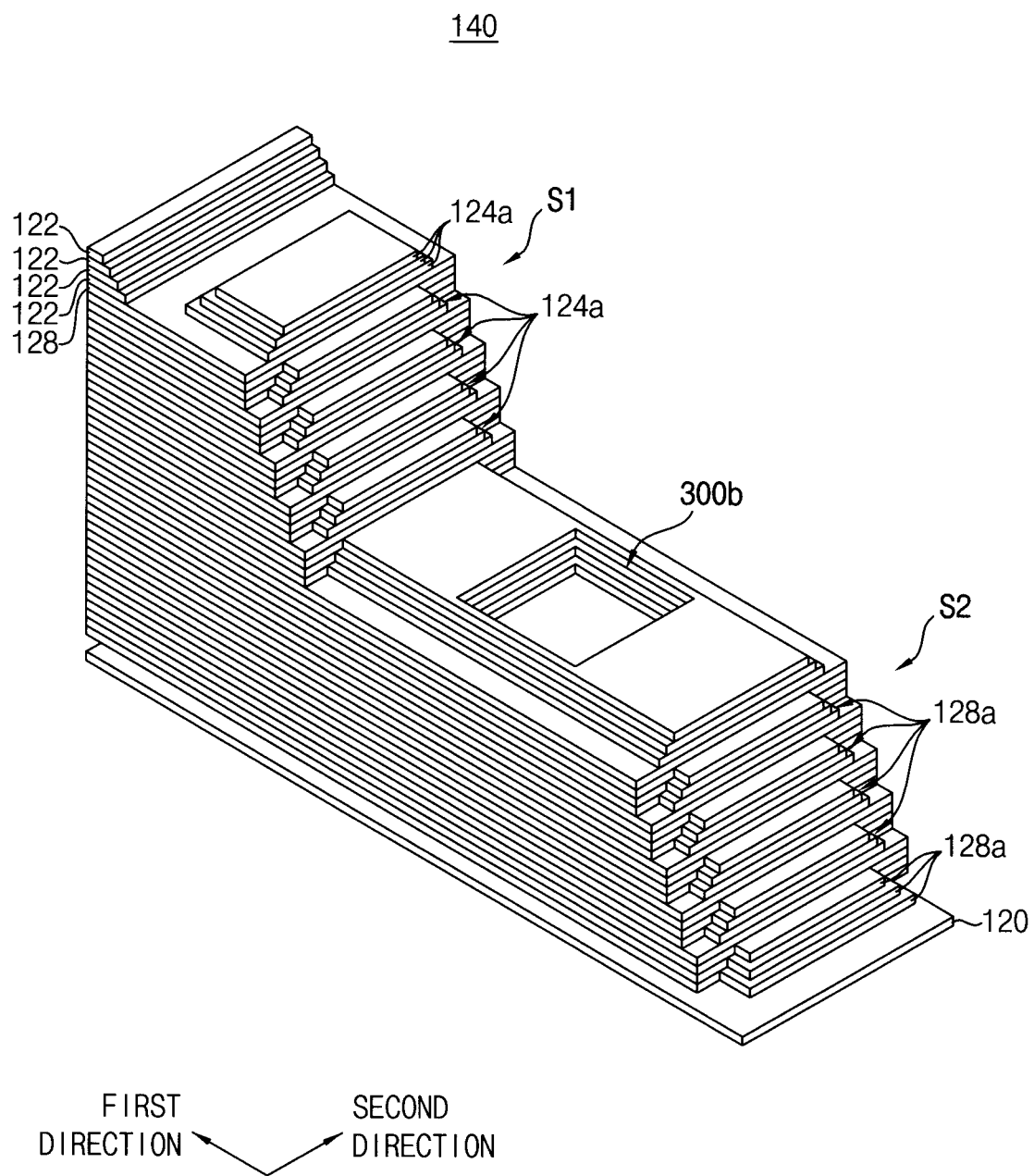

Referring to FIG. 50, the flat surface portion between the first and second staircase structures S1 and S2 may be partially etched to form a recess 300b on the flat surface portion.

In example embodiments, the recess 300b may have a quadrangle shape in a plan view. In addition, sidewalls in the first and second directions of the recess 300b may have stepped shapes, respectively.

Particularly, a photoresist pattern exposing only a portion of the flat surface portion may be formed, and the sacrificial layer corresponding to the flat surface portion may be partially etched using the photoresist pattern. The trimming process of the photoresist pattern and the etching process may be performed to form the steps at the sidewalls in the first and second directions of the recess 300b.

Figure 51:
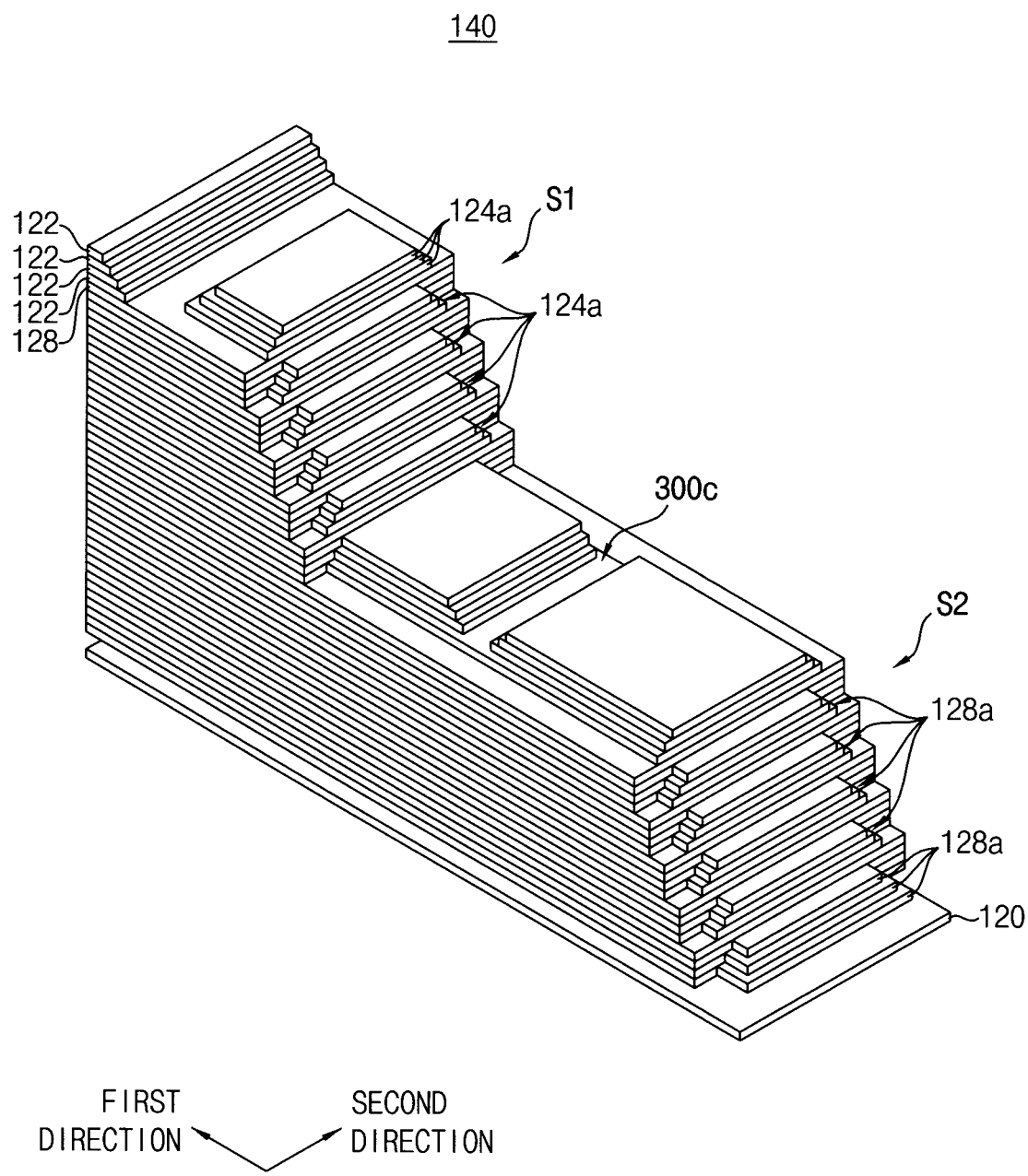

In some example embodiments, as shown in FIG. 51, the recess 300c may extend in the first direction in the plan view. Thus, an upper portion of the flat surface portion may be separated by the recess 300c. In addition, the sidewalls of the recess 300c in the first direction may have stepped shapes. In this manner, a valley may be formed.

The mold structure 140 may be formed by the above processes.

On the other hand, after forming the mold structure 140, an accurate measurement of the width in the first direction of the mold structure 140 may be performed. In the measurement process, the widths in the first direction of distinguishable patterns (e.g., steps) in the mold structure 140 may be measured, respectively, and the measured widths in the first direction may be summed to determine a width in the first direction of the entire mold structure 140.

As shown in FIG. 50 or 51, the recess 300b and 300c may be formed on the flat surface portion, and the sidewalls in the first direction of the recess may have steps. Thus, in order to measure the width of the flat surface portion, a width between the lower end of the first staircase structure S1 and the recess, widths of the steps of the recess, a width of bottom of the recess, and a width between the upper end of the second staircase structure and the recess may be measured, respectively. Also, the measured widths may be summed to determine a width in the first direction of the entire mold structure 140.

Figure 52:
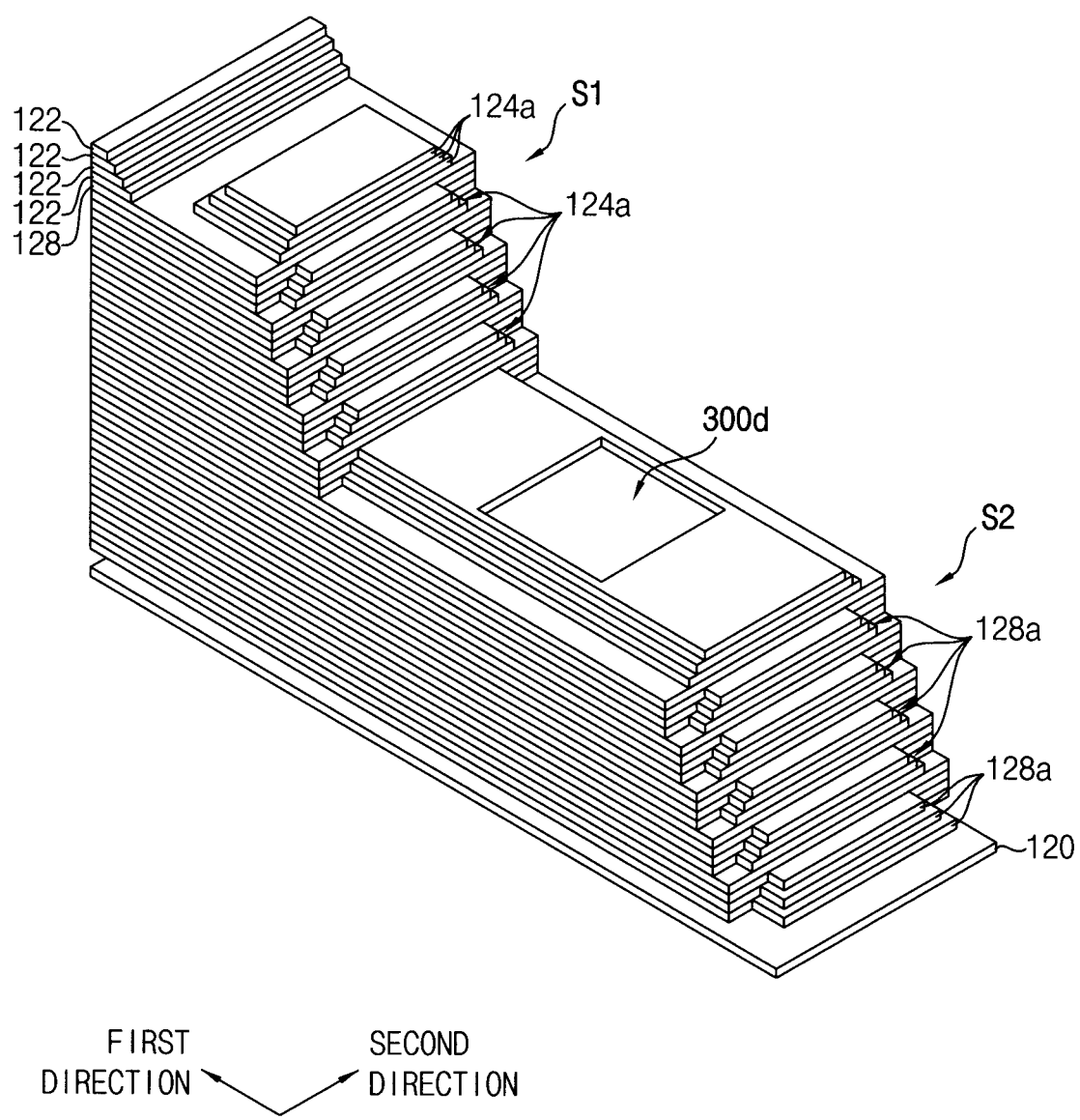

In some example embodiments, as shown in FIG. 52, the sidewalls of the recess 300d may have no step. As an example, the recess 300d may have a quadrangle shape in a plan view. For example, although not shown, the recess may extend in the first direction in a plan view, so that the upper portion of the flat surface portion may be separated by the recess.

When the sidewalls of the recess 300d have no stepped shape, in order to measure the width of the flat surface portion, a width between the lower end of the first staircase structure S1 and the recess, a width of the bottom of the recess 300d, and a width the upper end of the second staircase structure S2 from the recess 300d may be measured, respectively Thereafter, the processes substantially the same as or similar to those illustrated with reference to FIGS. 18 to 29 may be performed to manufacture a vertical memory device.

Similar to those illustrated in FIGS. 45 and 46, the vertical memory device may include the first upper staircase structure 290a and the first and second staircase structures S1 and S2. Also, the recess 300d may be formed at the flat surface portion between the first and second staircase structures S1 and S2. The recess 300d may be used as a pattern for measuring the flat surface portion of the mold structure.

Although not shown, the through via contact 318 may be formed through a portion of the sacrificial layers that are not replaced with gate patterns at the flat surface Y of the mold structure 140, and may pass through the recess 300d. The through via contact 318 may be electrically connected to the peripheral circuits.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Terms such as "same," "equal," "planar," "coplanar," "perpendicular," or "parallel," as used herein encompass identicality or near identicality including variations that may occur, for example, due to manufacturing processes. The term "substantially" may be used herein to emphasize this meaning, unless the context or other statements indicate otherwise.

What is claimed is:

1. A vertical type semiconductor device, comprising:
    a substrate;
    a cell array region and a pad region formed on the substrate;
    gate patterns stacked in a vertical direction perpendicular to an upper surface of the substrate, each of the gate patterns extending on the cell array region and the pad region in a first direction parallel to the upper surface of the substrate, and the gate patterns including pads, respectively, disposed in the pad region and at edge portions of the respective gate patterns in the first direction;
    respective insulation layers between adjacent gate patterns in the vertical direction; and a channel structure in the cell array region and passing through the gate patterns, the channel structure extending in the vertical direction,
wherein the gate patterns and the insulation layers on the pad region serve as a pad structure, and the pad structure includes:
a first staircase structure having a stepped shape;
a second staircase structure spaced apart from the first staircase structure in the first direction and having a stepped shape and disposed below the first staircase structure; and
a connection portion between the first and second staircase structures, an upper portion of the connection portion having a flat surface, and
wherein a portion of the flat surface includes a recess.

2. The vertical type semiconductor device of claim 1, wherein the recess is spaced apart from each of the first and second staircase structures.

3. The vertical type semiconductor device of claim 1, wherein the recess is positioned in the flat surface of the connection portion to have a quadrangle shape, in a plan view.

4. The vertical type semiconductor device of claim 1, wherein at least two opposite sidewalls of the recess have a stepped shape.

5. The vertical type semiconductor device of claim 1, wherein sidewalls of the recess are perpendicular to the upper surface of the substrate.

6. The vertical type semiconductor device of claim 1, wherein the recess extends in the first direction, in a plan view, and the flat surface is separated by the recess.

7. The vertical type semiconductor device of claim 1, wherein a height of the flat surface is lower than a height of an upper surface of the first staircase structure.

8. The vertical type semiconductor device of claim 1, wherein the first staircase structure includes steps in the first direction and a second direction perpendicular to the first direction, and the flat surface is lower than an upper surface of a lowermost step of the first staircase structure.

9. The vertical semiconductor device of claim 1, wherein the second staircase structure includes steps in the first direction and a second direction perpendicular to the first direction, and the flat surface is higher than an upper surface of an uppermost step of the second staircase structure.

10. The vertical type semiconductor device of claim 9, wherein a bottom of the recess is higher than an upper surface of an uppermost step of the second staircase structure.

11. The vertical type semiconductor device of claim 1, wherein upper sidewalls in a second direction of the connection portion have a stepped shape.

12. The vertical type semiconductor device of claim 1, wherein the second staircase structure includes steps having a shape the same as a shape of steps of the first staircase structure.

13. The vertical type semiconductor device of claim 1, wherein a width in the first direction of the flat surface is about 15 µm to about 40 µm.

14. A vertical semiconductor device, comprising:
a substrate;
a cell array region including memory cells formed on the substrate;
a pad region formed on the substrate;
gate patterns stacked in a vertical direction perpendicular to an upper surface of the substrate, each of the gate patterns extending on the cell array region and the pad region of the substrate in a first direction parallel to the upper surface of the substrate, and the gate patterns including pads, respectively, at edge portions thereof in the first direction;
respective insulation layers between adjacent gate patterns in the vertical direction;
a channel structure on the cell array region and passing through the gate patterns, the channel structure extending in the vertical direction; and
contact plugs extending in the vertical direction, and contacting upper surfaces of the pads, respectively,
wherein the gate patterns and the insulation layer on the pad region serve as a pad structure, and the pad structure includes:
a first staircase structure having a stepped shape and including the pads;
a second staircase structure disposed below the first staircase structure, the second staircase structure having a stepped shape and including the pads; and
a connection portion between the first and second staircase structures, an upper portion of the connection portion having a flat surface,
wherein a portion of the flat surface includes a recess, and
wherein upper sidewalls in a second direction of the connection portion have a stepped shape.

15. The vertical semiconductor device of claim 14, wherein the recess is spaced apart from each of the first and second staircase structures.

16. The vertical semiconductor device of claim 14, wherein the recess is positioned in the flat surface of the connection portion to have a quadrangle shape, in a plan view.

17. The vertical semiconductor device of claim 14, wherein at least two opposite sidewalls of the recess have a stepped shape.

18. The vertical semiconductor device of claim 14, wherein the first staircase structure includes steps in the first direction and the second direction, which is perpendicular to the first direction, and a bottom of the recess is higher than an upper surface of an uppermost step of the second staircase structure.

19. A vertical semiconductor device, comprising:
a substrate;
a cell array region and a pad region formed on the substrate;
gate patterns stacked in a vertical direction perpendicular to an upper surface of the substrate, each of the gate patterns extending in a first direction parallel to the upper surface of the substrate on the cell array region and the pad region of the substrate, and the gate patterns including pads, respectively, at edge portions thereof in the first direction; and
respective insulation layers between adjacent gate patterns in the vertical direction;
wherein the gate patterns and the insulation layer on the pad region serve as a pad structure, and the pad structure includes:
a first staircase structure having a stepped shape;
a second staircase structure having a stepped shape and disposed below the first staircase structure; and
a connection portion between the first and second staircase structures, an upper portion of the connection portion having a flat surface, and
wherein the flat surface includes a recess being spaced apart from each of the first and second staircase structures.

20. The vertical semiconductor device of claim 19, wherein the first staircase structure includes steps in the first direction and a second direction perpendicular to the first direction, and a bottom of the recess is higher than an upper surface of an uppermost step of the second staircase structure.

* * * * *